(12) United States Patent
Watabe et al.

(10) Patent No.: US 11,063,225 B2
(45) Date of Patent: Jul. 13, 2021

(54) LIGHT-EMITTING ELEMENT, LIGHT-EMITTING DEVICE, ELECTRONIC DEVICE, AND LIGHTING DEVICE INCLUDING A NITROGEN-CONTAINING SIX-MEMBERED HETEROAROMATIC SKELETON

(71) Applicant: Semiconductor Energy Laboratory Co., Ltd., Kanagawa-ken (JP)

(72) Inventors: Takeyoshi Watabe, Kanagawa (JP); Satoshi Seo, Kanagawa (JP); Nozomi Komatsu, Kanagawa (JP); Ryohei Yamaoka, Kanagawa (JP); Harue Osaka, Kanagawa (JP); Kunihiko Suzuki, Kanagawa (JP); Shunsuke Hosoumi, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/473,053

(22) PCT Filed: Dec. 19, 2017

(86) PCT No.: PCT/IB2017/058090
§ 371 (c)(1),
(2) Date: Jun. 24, 2019

(87) PCT Pub. No.: WO2018/122677
PCT Pub. Date: Jul. 5, 2018

(65) Prior Publication Data
US 2020/0098997 A1    Mar. 26, 2020

(30) Foreign Application Priority Data
Dec. 27, 2016    (JP) .............................. JP2016-253548

(51) Int. Cl.
*H01L 51/00* (2006.01)
*H01L 51/50* (2006.01)

(52) U.S. Cl.
CPC ...... *H01L 51/0072* (2013.01); *H01L 51/5012* (2013.01); *H01L 2251/5384* (2013.01)

(58) Field of Classification Search
None
See application file for complete search history.

(56) References Cited

U.S. PATENT DOCUMENTS 6,617,051 B1    9/2003   Higashi et al.
7,045,950 B2    5/2006   Higashi et al.
(Continued)

FOREIGN PATENT DOCUMENTS

CN    001773744 A    5/2006
CN    101142223 A    3/2008
(Continued)

OTHER PUBLICATIONS

International Search Report re Appplication No. PCT/IB2017/058090, dated Apr. 3, 2018.
(Continued)

*Primary Examiner* — Jay C Chang
(74) *Attorney, Agent, or Firm* — Husch Blackwell LLP

(57) ABSTRACT

A highly reliable light-emitting element having high emission efficiency is provided. The light-emitting element includes a light-emitting layer including a first organic compound and a guest material. The first organic compound has a substituted or unsubstituted carbazole skeleton. In the light-emitting layer, the weight ratio of a hydrocarbon group substitution product in which at least one of hydrogen atoms in the first organic compound is substituted by a hydrocarbon group having 1 to 6 carbon atoms to the first organic compound is greater than 0 and less than or equal to 0.1.

16 Claims, 31 Drawing Sheets

(56) References Cited

U.S. PATENT DOCUMENTS

| | | |
|---|---|---|
| 2006/0099447 A1 | 5/2006 | Lee et al. |
| 2006/0159959 A1 | 7/2006 | Higashi et al. |
| 2008/0191618 A1* | 8/2008 | Mishima ............ H01L 51/5012 313/504 |
| 2009/0128008 A1* | 5/2009 | Ise ..................... C07F 15/0086 313/504 |
| 2010/0084672 A1 | 4/2010 | Ueno et al. |
| 2011/0234090 A1 | 9/2011 | Ise et al. |
| 2012/0309970 A1 | 12/2012 | Ise et al. |
| 2017/0186980 A1 | 6/2017 | Watabe et al. |

FOREIGN PATENT DOCUMENTS

| | | |
|---|---|---|
| EP | 1 656 000 A1 | 5/2006 |
| EP | 2 530 760 A1 | 12/2012 |
| EP | 2 562 840 A1 | 2/2013 |
| JP | 2006-135295 A | 5/2006 |
| JP | 2006-256999 A | 9/2006 |
| JP | 2008-227462 A | 9/2008 |
| JP | 2012-174901 A | 9/2012 |
| KR | 2006-0040829 A | 5/2006 |
| KR | 2006-0059321 A | 6/2006 |
| KR | 2007-0112465 A | 11/2007 |
| KR | 10-1280587 | 7/2013 |
| WO | WO 2000/041443 A1 | 7/2000 |
| WO | WO 2006/098505 A1 | 9/2006 |
| WO | WO 2008/120714 A1 | 10/2008 |

OTHER PUBLICATIONS

Written Opinion re Application No. PCT/IB2017/058090, dated Apr. 3, 2018.

* cited by examiner

FIG. 2

|  | 35DCzPPy | Me-35DCzPPy |
|---|---|---|
| The most stable structure in T1 | | |
| Excitation energy (eV) | 2.81 | 2.80 |
| The metastable structure in T1 | | |
| Excitation energy (eV) | 2.94 | 2.89 |

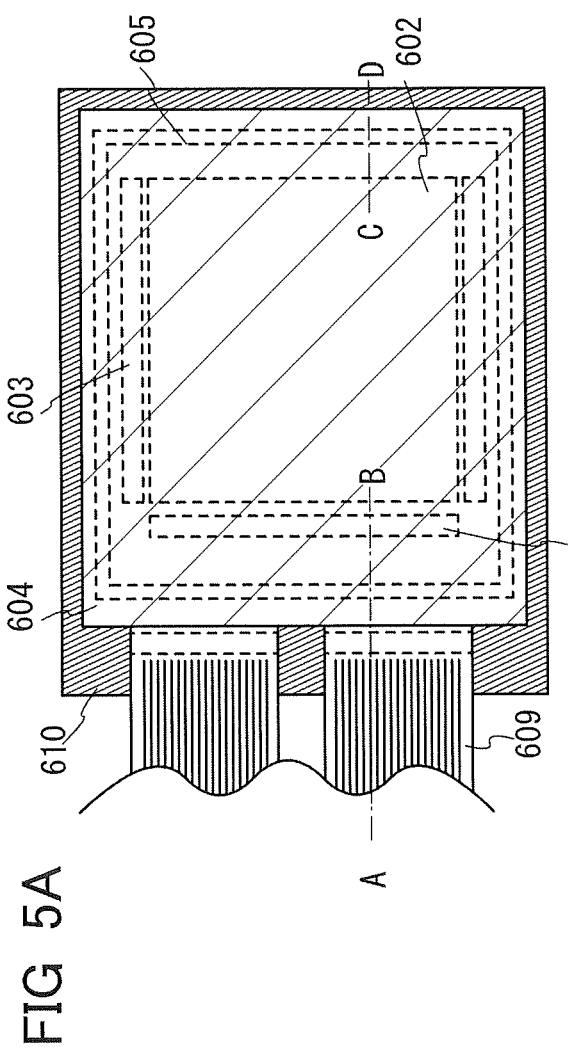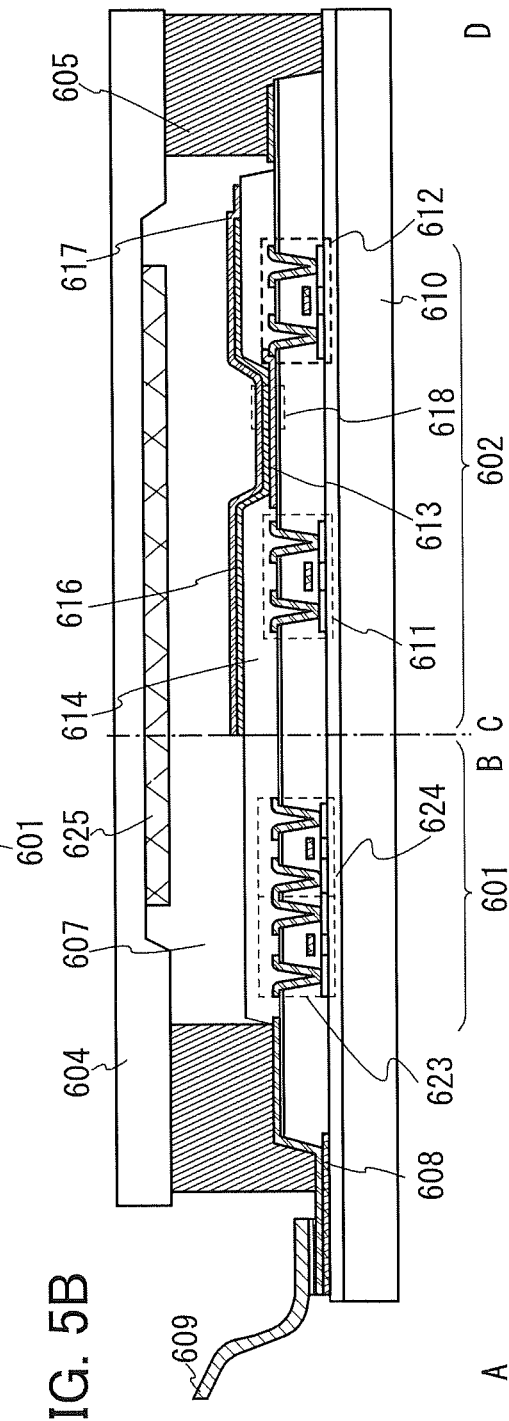

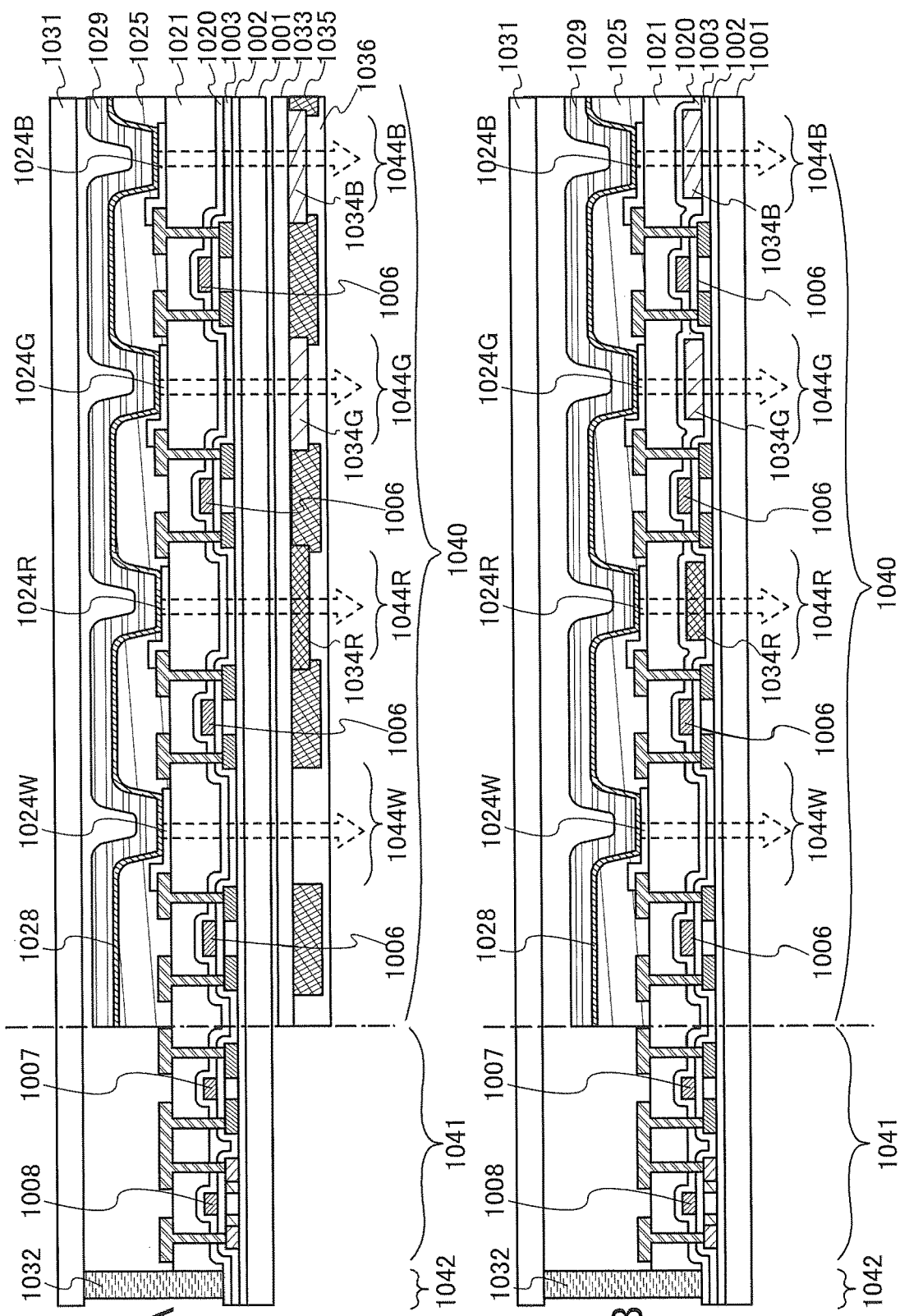

FIG. 8A
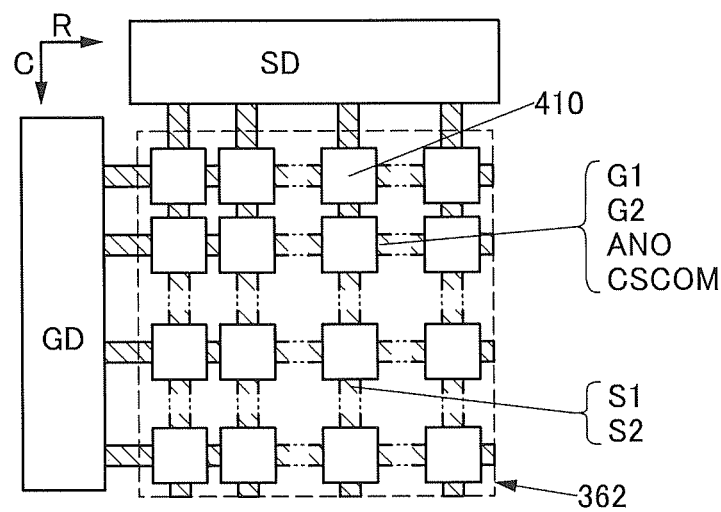
FIG 8B1
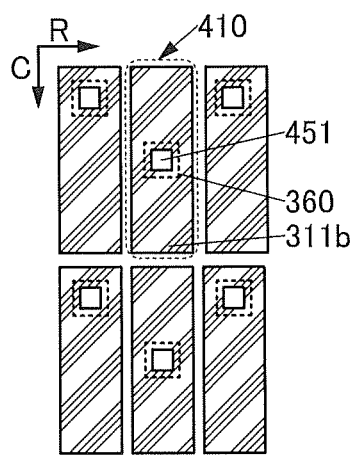
FIG. 8B2
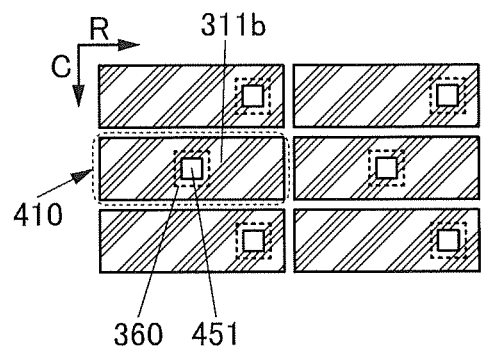

LIGHT-EMITTING ELEMENT, LIGHT-EMITTING DEVICE, ELECTRONIC DEVICE, AND LIGHTING DEVICE INCLUDING A NITROGEN-CONTAINING SIX-MEMBERED HETEROAROMATIC SKELETON

This application is a 371 of international application PCT/IB2017/058090 filed on Dec. 19, 2017 which is incorporated herein by reference.

TECHNICAL FIELD

One embodiment of the present invention relates to a novel light-emitting element. Another embodiment of the present invention relates to a light-emitting element in which a specific impurity is reduced. Another embodiment of the present invention relates to a light-emitting device, an electronic device, and a lighting device each including the light-emitting element.

Note that one embodiment of the present invention is not limited to the above technical field. One embodiment of the present invention relates to an object, a method, or a manufacturing method. One embodiment of the present invention relates to a process, a machine, manufacture, or a composition of matter. In particular, one embodiment of the present invention relates to a semiconductor device, a light-emitting device, a display device, a lighting device, a light-emitting element, or a manufacturing method thereof.

BACKGROUND ART

Light-emitting elements (organic EL elements) including organic compounds and utilizing electroluminescence (EL) have been put to more practical use. In the basic structure of such light-emitting elements, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Since the above light-emitting element is a self-luminous type, a display device using this light-emitting element has advantages such as high visibility, no necessity of a backlight, and low power consumption. Furthermore, such a light-emitting element also has advantages in that the element can be formed to be thin and lightweight, and that response time is high.

In the case of an organic EL element (OLED), a light-emitting element is fabricated using a variety of organic compounds. Accordingly, the quality of each organic compound is important because an impurity in the organic compound may affect characteristics of the light-emitting element. In particular, the reliability of the element is likely to be affected by an impurity.

Thus, it is important to reduce an impurity in order to obtain a light-emitting element having favorable characteristics, in particular, a light-emitting element having high reliability. Each of Patent Documents 1 and 2 discloses a light-emitting element whose reliability is improved by reducing the concentration of a halogen compound to a certain level or lower in an EL layer that contains an organic compound.

REFERENCE

[Patent Document]
[Patent Document 1] International Publication No. WO 00/41443

[Patent Document 2] Japanese Published Patent Application No. 2012-174901

DISCLOSURE OF INVENTION

It is known that some impurities do not affect the characteristics of light-emitting elements, while some impurities deteriorate the characteristics of light-emitting elements. Thus, it is important to identify the kind of an impurity that deteriorates the characteristics of light-emitting elements. In addition, it is important to identify the impurity concentration at which the light-emitting elements are affected. Moreover, the mechanism in which impurities deteriorate the characteristics of light-emitting elements is hardly clarified.

In view of the above, an object of one embodiment of the present invention is to provide a novel light-emitting element. In particular, an object is to provide a light-emitting element having high reliability. Another object of one embodiment of the present invention is to provide a light-emitting element having high emission efficiency.

Another object of one embodiment of the present invention is to provide a light-emitting element with low power consumption. Another object of one embodiment of the present invention is to provide a novel light-emitting device. Another object of one embodiment of the present invention is to provide a light-emitting element, a light-emitting device, and an electronic device each having high reliability. Another object of one embodiment of the present invention is to provide a light-emitting element, a light-emitting device, and an electronic device each with low power consumption.

Note that the description of the above object does not disturb the existence of other objects. In one embodiment of the present invention, there is no need to achieve all the objects. Other objects are apparent from and can be derived from the description of the specification and the like.

One embodiment of the present invention is a light-emitting element including an EL layer between a pair of electrodes. The EL layer includes at least a light-emitting layer. The light-emitting layer includes a first organic compound and a hydrocarbon group substitution product. The first organic compound has a substituted or unsubstituted carbazole skeleton. The hydrocarbon group substitution product has a structure in which at least one of hydrogen atoms in the first organic compound is substituted by a hydrocarbon group having 1 to 6 carbon atoms. The weight ratio of the hydrocarbon group substitution product to the first organic compound is greater than 0 and less than or equal to 0.1.

In the above structure, the hydrocarbon group substitution product is preferably a compound in which at least one of hydrogen atoms in the first organic compound is substituted by a hydrocarbon group having 1 to 6 carbon atoms. Further preferably, the hydrocarbon group substitution product is a compound in which at least one of hydrogen atoms in the carbazole skeleton in the first organic compound is substituted by a hydrocarbon group having 1 to 6 carbon atoms. Still further preferably, the hydrocarbon group substitution product is a compound in which a hydrogen atom at the 2-position of the carbazole skeleton in the first organic compound is substituted by a hydrocarbon group having 1 to 6 carbon atoms.

In each of the above structures, the first organic compound preferably includes a substituted or unsubstituted nitrogen-containing heteroaromatic ring.

In each of the above structures, the light-emitting layer may include a second organic compound having a substituted or unsubstituted nitrogen-containing heteroaromatic ring.

In each of the above structures, the first organic compound is preferably an organic compound represented by General Formula (G0) below.

[Chemical Formula 1]

(G0)

Note that in General Formula (G0), A represents a substituted or unsubstituted nitrogen-containing heteroaromatic ring having 1 to 25 carbon atoms, Ar represents an arylene group having 6 to 13 carbon atoms, n represents 0 or 1, and Cz represents a substituted or unsubstituted carbazole skeleton.

In each of the above structures, the first organic compound is preferably an organic compound represented by General Formula (G1) below.

[Chemical Formula 2]

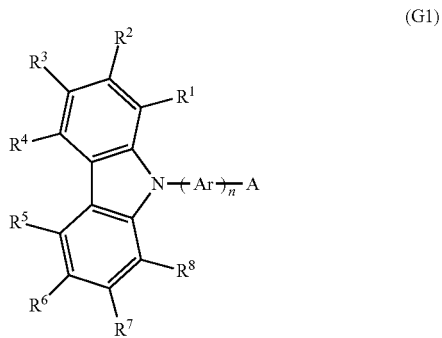
(G1)

Note that in General Formula (G1), A represents a substituted or unsubstituted nitrogen-containing heteroaromatic ring having 1 to 25 carbon atoms, Ar represents an arylene group having 6 to 13 carbon atoms, n represents 0 or 1, and each of $R^1$ to $R^8$ independently represents any one of hydrogen, a hydrocarbon group having 1 to 6 carbon atoms, a cyclic hydrocarbon group having 3 to 6 carbon atoms, and a substituted or unsubstituted aromatic hydrocarbon group having 6 to 25 carbon atoms.

In each of the above structures, the first organic compound is preferably an organic compound represented by General Formula (G2) below.

[Chemical Formula 3]

(G2)

Note that in General Formula (G2), A represents a substituted or unsubstituted nitrogen-containing heteroaromatic ring having 1 to 25 carbon atoms, Ar represents an arylene group having 6 to 13 carbon atoms, and n represents 0 or 1.

In each of the above structures, in the light-emitting layer, the weight ratio of the hydrocarbon group substitution product to the first organic compound is preferably greater than 0 and less than or equal to 0.05, further preferably greater than 0 and less than or equal to 0.025.

In each of the above structures, the guest material is preferably configured to convert triplet excitation energy into light emission. Furthermore, the guest material preferably includes iridium.

One embodiment of the present invention is a display device including the light-emitting element having any of the above structures, and at least one of a color filter and a transistor. Another embodiment of the present invention is an electronic device including the display device, and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. Accordingly, a light-emitting device in this specification refers to an image display device or a light source (including a lighting device). A display module in which a connector such as a flexible printed circuit (FPC) or a tape carrier package (TCP) is connected to a light-emitting element, a display module in which a printed wiring board is provided on the tip of a TCP, and a display module in which an integrated circuit (IC) is directly mounted on a light-emitting element by a chip on glass (COG) method are also embodiments of the present invention.

One embodiment of the present invention can provide a novel light-emitting element, in particular, a light-emitting element having high reliability. One embodiment of the present invention can provide a light-emitting element with high emission efficiency. One embodiment of the present invention can provide a light-emitting element with low power consumption. One embodiment of the present invention can provide a novel light-emitting element. One embodiment of the present invention can provide a novel light-emitting device. One embodiment of the present invention can provide a novel display device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 2 shows spin density distributions of materials of one embodiment of the present invention.

FIGS. 5A and 5B are conceptual diagrams of an active matrix light-emitting device of one embodiment of the present invention.

FIGS. 6A and 6B are conceptual diagrams each illustrating an active matrix light-emitting device of one embodiment of the present invention.

FIGS. 8A, 8B1, and 8B2 are schematic views illustrating a display device of one embodiment of the present invention.

BEST MODE FOR CARRYING OUT THE INVENTION

Figure 1A:
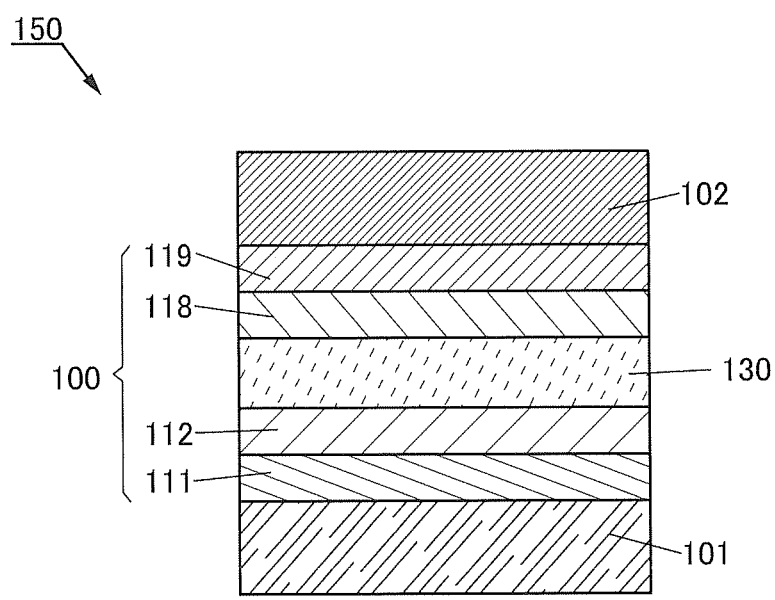
FIGS. 1A and 1B are schematic views illustrating a light-emitting element of one embodiment of the present invention.

Embodiments and examples of the present invention will be described below with reference to the drawings. However, the present invention is not limited to the following description, and the modes and details can be variously changed unless departing from the scope and spirit of the present invention. Accordingly, the present invention should not be interpreted as being limited to the content of the embodiments and examples below.

Note that the position, the size, the range, or the like of each structure illustrated in the drawings and the like are not accurately represented in some cases for easy understanding. Therefore, the disclosed invention is not necessarily limited to the position, the size, the range, or the like as disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are denoted by the same reference numeral in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet excitation energy level, that is, the excitation energy level of the lowest singlet excited state (S1 state). A triplet excited state (T*) refers to a triplet state having excitation energy. A T1 level means the lowest level of the triplet excitation energy level, that is, the excitation energy level of the lowest triplet excited state (T1 state). Note that in this specification and the like, simple expressions "singlet excited state" and "singlet excitation energy level" mean the S1 state and the S1 level, respectively, in some cases. In addition, expressions "triplet excited state" and "triplet excitation energy level" mean the T1 state and the T1 level, respectively, in some cases.

In this specification and the like, a fluorescent compound refers to a substance that emits light in the visible light region when the relaxation from the singlet excited state to the ground state occurs. A phosphorescent compound refers to a substance that emits light in the visible light region at room temperature when the relaxation from the triplet excited state to the ground state occurs. That is, a phosphorescent compound refers to a substance that can convert triplet excitation energy into visible light.

Note that in this specification and the like, room temperature refers to a temperature higher than or equal to 0° C. and lower than or equal to 40° C.

In this specification and the like, a wavelength range of blue refers to a wavelength range of greater than or equal to 400 nm and less than 500 nm, and blue light has at least one peak in that range in an emission spectrum. A wavelength range of green refers to a wavelength range of greater than or equal to 500 nm and less than 580 nm, and green light has at least one peak in that range in an emission spectrum. A wavelength range of red refers to a wavelength range of greater than or equal to 580 nm and less than or equal to 680 nm, and red light has at least one peak in that range in an emission spectrum.

Embodiment 1

In this embodiment, a light-emitting element of one embodiment of the present invention is described below with reference to FIGS. 1A and 1B, FIG. 2, and FIG. 3.

<Structure Example of Light-Emitting Element>

First, a structure of the light-emitting element of one embodiment of the present invention is described with reference to FIGS. 1A and 1B.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

Although description is given assuming that the electrode 101 and the electrode 102 of the pair of electrodes serve as an anode and a cathode, respectively in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Note that the structure of the EL layer 100 is not limited to the structure illustrated in FIG. 1A, and the EL layer 100 includes at least the light-emitting layer 130 and does not necessarily include the hole-injection layer 111, the hole-transport layer 112, the electron-transport layer 118, and the electron-injection layer 119. Alternatively, the EL layer 100 may include a functional layer which is capable of lowering a hole injection barrier or an electron injection barrier, improving a hole-transport property or an electron-transport property, inhibiting a hole-transport property or an electron-transport property, suppressing a quenching phenomenon by an electrode, or suppressing diffusion of excitons, for example. Note that the functional layers may each be a single layer or stacked layers.

Figure 1B:
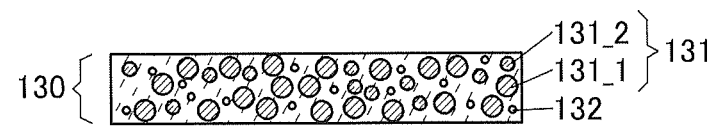

FIG. 1B is a schematic cross-sectional view illustrating an example of the light-emitting layer 130 in FIG. 1A. The light-emitting layer 130 in FIG. 1B includes a host material 131 and a guest material 132.

The host material 131 includes at least an organic compound 131_1. The organic compound 131_1 is preferably a compound having a function of transporting electrons (an electron-transport property), further preferably, a compound having a nitrogen-containing heteroaromatic skeleton, still further preferably, a compound having a nitrogen-containing six-membered heteroaromatic skeleton. A nitrogen-containing six-membered heteroaromatic skeleton is preferable because of its high electron-transport property and stability.

It is preferable that the host material 131 further include an organic compound 131_2. The organic compound 131_2 is preferably a compound having a function of transporting holes (a hole-transport property).

In the case where the combination of the organic compounds 131_1 and 131_2 is a combination of a compound having an electron-transport property and a compound having a hole-transport property, the carrier balance can be easily controlled depending on the mixture ratio. Specifically, the weight ratio of the compound having an electron-transport property to the compound having a hole-transport property is preferably within a range of 1:9 to 9:1. With the above structure, the carrier balance or a carrier recombination region (an exciton generation region) can be easily controlled.

The guest material 132 may be a light-emitting organic compound, and the light-emitting organic compound is preferably a substance capable of emitting fluorescence (hereinafter also referred to as a fluorescent compound) or a substance capable of emitting phosphorescence (hereinafter also referred to as a phosphorescent compound). A structure in which a fluorescent compound or a phosphorescent compound is used as the guest material 132 is described below.

A characteristic required for the light-emitting element 150 is high emission efficiency. In addition, little reduction in emission efficiency due to long-term preservation or driving, i.e., a long lifetime or high reliability, is required. To make the light-emitting element 150 have high emission efficiency and high reliability, the EL layer 100, specifically the light-emitting layer 130, preferably includes an organic compound with a low content of impurities. As the impurity, an impurity in which a hydrogen atom in an organic material is substituted by a hydrocarbon group or halogen can be given, for example. It is particularly preferable that the organic compound included in the EL layer 100 have a low halide content.

In order to fabricate a light-emitting element including a low impurity content, the purity of the organic compound used for the light-emitting element is preferably made high. Accordingly, the organic compound is preferably synthesized using a reagent including few impurities or a solvent having high purity. This is because an impurity included in the reagent used in synthesis may be included in a target organic compound. As purification of the organic compound, in general, purification by sublimation is performed. The purification by sublimation can remove a solvent remaining after synthesis or a small amount of impurities such as a halide.

However, it is difficult to remove, in a purification process of the organic compound, some impurities because of their molecular structures similar to the molecular structure of the organic compound included in the EL layer 100, for example. Accordingly, the organic compound sometimes contains such impurities whose content is unlikely to be reduced. In some cases, impurities enter the light-emitting element in the fabrication thereof, and the light-emitting element includes the impurities. For example, a substance that is generated by decomposition of an organic compound in vacuum evaporation enters the light-emitting element as an impurity in some cases. In addition, when a manufacturing method using a solvent such as a coating method, an ink-jet method, or a printing method is employed, for example, the solvent or an impurity in the solvent sometimes enters a light-emitting element. Furthermore, a substance that is generated by decomposition of an organic compound when a light-emitting element is driven enters the light-emitting element as an impurity in some cases. Therefore, it is difficult to remove all the impurities included in a light-emitting element.

It is difficult to form the EL layer 100 so that impurities are not included as described above, and the present inventors have found that an impurity whose concentration is at a certain level or lower does not affect the characteristics of the light-emitting element. Specifically, in the light-emitting element of one embodiment of the present invention, the light-emitting layer 130 includes a guest material and an organic compound having a carbazole skeleton as a host material. In the light-emitting element, the weight ratio of a hydrocarbon group substitution product which has a structure in which at least one of hydrogen atoms in the host material included in the light-emitting layer 130 is substituted by a hydrocarbon group having 1 to 6 carbon atoms and which serves as an impurity to the host material is greater than 0 and less than or equal to 0.1.

Note that when the hydrocarbon group substitution product is a methyl group-substituted product, the methyl group-substituted product has m/z represented by m/z of a host material+14n (n is a natural number).

The weight ratio of the hydrocarbon group substitution product to the host material is preferably greater than 0 and less than or equal to 0.05, further preferably greater than 0 and less than or equal to 0.025.

An organic compound having a carbazole skeleton is suitably used for a light-emitting element because of its high T1 level and its high carrier-transport property.

In some cases, a carbazole derivative serving as a source material of an organic compound having a carbazole skeleton, which is used for a light-emitting element, includes, as an impurity, a hydrocarbon group substitution product in which a hydrogen atom in a carbazole skeleton is substituted by a hydrocarbon group having 1 to 6 carbon atoms (an alkyl group having 1 to 4 carbon atoms in many cases, and a methyl group in particular). This is because the physical properties of the hydrocarbon group substitution product are similar to those of a target substance (an organic compound having a carbazole skeleton or a carbazole derivative serving as a source material for the organic compound), and thus it is difficult to perform purification and remove the hydrocarbon group substitution product.

As described above, an organic compound having a carbazole skeleton includes, as an impurity, a hydrocarbon group substitution product in some cases, which may adversely affect the characteristics of the light-emitting element.

<Analysis of influence of impurity using quantum chemistry calculation>

Here, analysis of the influence of a hydrocarbon group substitution product in an organic compound having a carbazole skeleton on the light-emitting element is described below using quantum chemistry calculation.

Organic compounds each having a carbazole skeleton, which were used for the analysis, and names thereof are shown below.

[Chemical Formula 4]

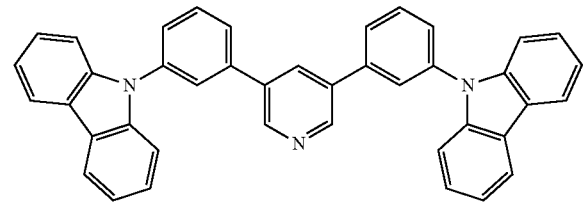

35DCzPPy

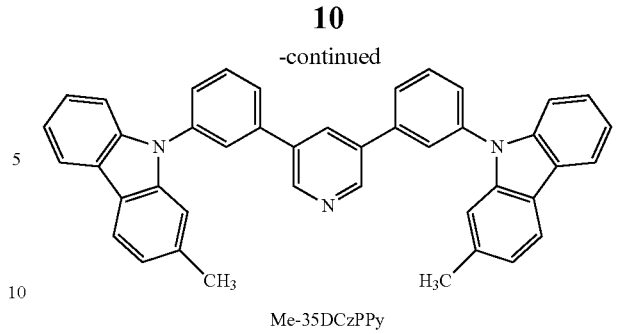

Me-35DCzPPy

In the light-emitting element, 35DCzPPy is used as a material for an electron-transport layer or a light-emitting layer. Me-35DCzPPy is a substance considered to be an impurity included in 35DCzPPy and can be referred to as a methyl group substitution product of 35DCzPPy.

As for the triplet excited state (T1) of each of 35DCzPPy and Me-35DCzPPy, vibration (spin density) analysis of each of the most stable structure in which the T1 level is the lowest and the metastable structure was performed. The calculation was performed using density functional theory (DFT). FIG. 2 shows the results. In the DFT, the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (a function of another function) of one electron potential represented in terms of electron density to enable high-speed calculations. Here, B3LYP which is a hybrid functional was used to specify the weight of each parameter related to exchange-correlation energy. As a basis function, 6-311G (d,p) was used. Gaussian 09 was used as a computational program.

In FIG. 2, shaded portions in the molecules show places where spins are present in a T1 excited state. There is no significant difference in the spin density distribution between the most stable structures in T1 of 35DCzPPy and Me-35DCzPPy, and thus it is found that spins are likely to extend over a pyridine ring and a phenylene group. In contrast, it is found that spins in the metastable structure in T1 of each of 35DCzPPy and Me-35DCzPPy mainly extend over a carbazole ring, and in Me-35DCzPPy, the spins extend over a methyl group. Note that the spin density of the methyl group is approximately 3% in the whole substance. Note that the proportion of the spin density was calculated from the sum of the absolute values of the spin densities of the atoms.

Note that the procedure of the calculation is as follows: with the most stable structure in a ground state (an S0 state) regarded as an initial structure, the metastable structure in T1 was obtained by recalculation of the most stable structure in T1. The most stable structure in T1 was obtained by setting an initial structure such that electrons of spins in a T1 excited state are likely to be present in a pyridine ring and a phenylene group. Excitation energies are each a difference in energy between the most stable structure in the S0 state and each of the most stable structure in T1 and the metastable structure in T1. Note that also in the case where recalculation of the most stable structure in the S0 state was performed with the most stable structure in T1 regarded as an initial structure, the structure and the energy value were similar to those of the most stable structure in the S0 state which were calculated above.

That is, it can be said that in consideration of a structural change of Me-35DCzPPy from the ground state (in the S0 state) to the T1 excited state due to excitation, a structural change between the ground state and the most stable structure in T1 is less likely to occur than a structural change between the ground state and the metastable structure in T1 because the twist of the molecule in the structural change between the ground state and the most stable structure in T1 is larger than that in the structural change between the ground state and the metastable structure in T1. Furthermore, it can be said that Me-35DCzPPy in the T1 excited state has the metastable structure in T1 more easily than 35DCzPPy in the T1 excited state because the difference in energy between the most stable structure in T1 and the metastable structure in T1 is as small as 0.09 eV. Since the spins in Me-35DCzPPy having the metastable structure in T1 extend over the methyl group as described above, a reaction occurs using the methyl group as a starting point in some cases.

Next, a hydrogen atom transfer reaction in which by interaction between a methyl group and a pyridine ring in two molecules of Me-35DCzPPy, a hydrogen atom of the methyl group moves to the pyridine ring to generate $CH_2$-35DCzPPy and Me-35DCzPPy-H was analyzed by quantum chemical calculation. A reaction formula used for the analysis and names of organic compounds used for the analysis are shown below.

[Chemical Formula 5]

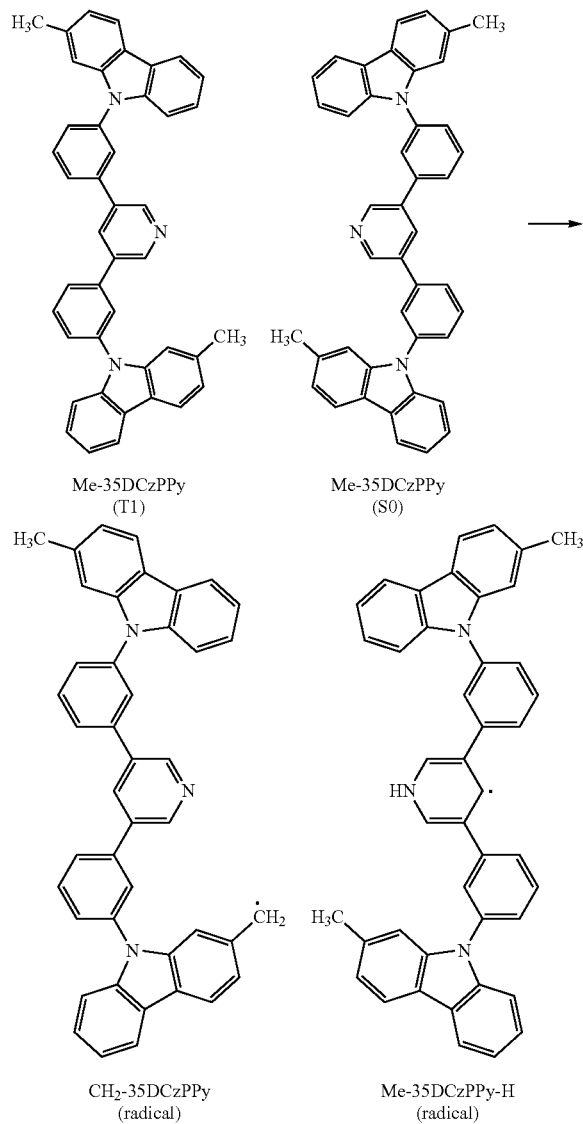

Me-35DCzPPy (T1)    Me-35DCzPPy (S0)

$CH_2$-35DCzPPy (radical)    Me-35DCzPPy-H (radical)

Figure 3:
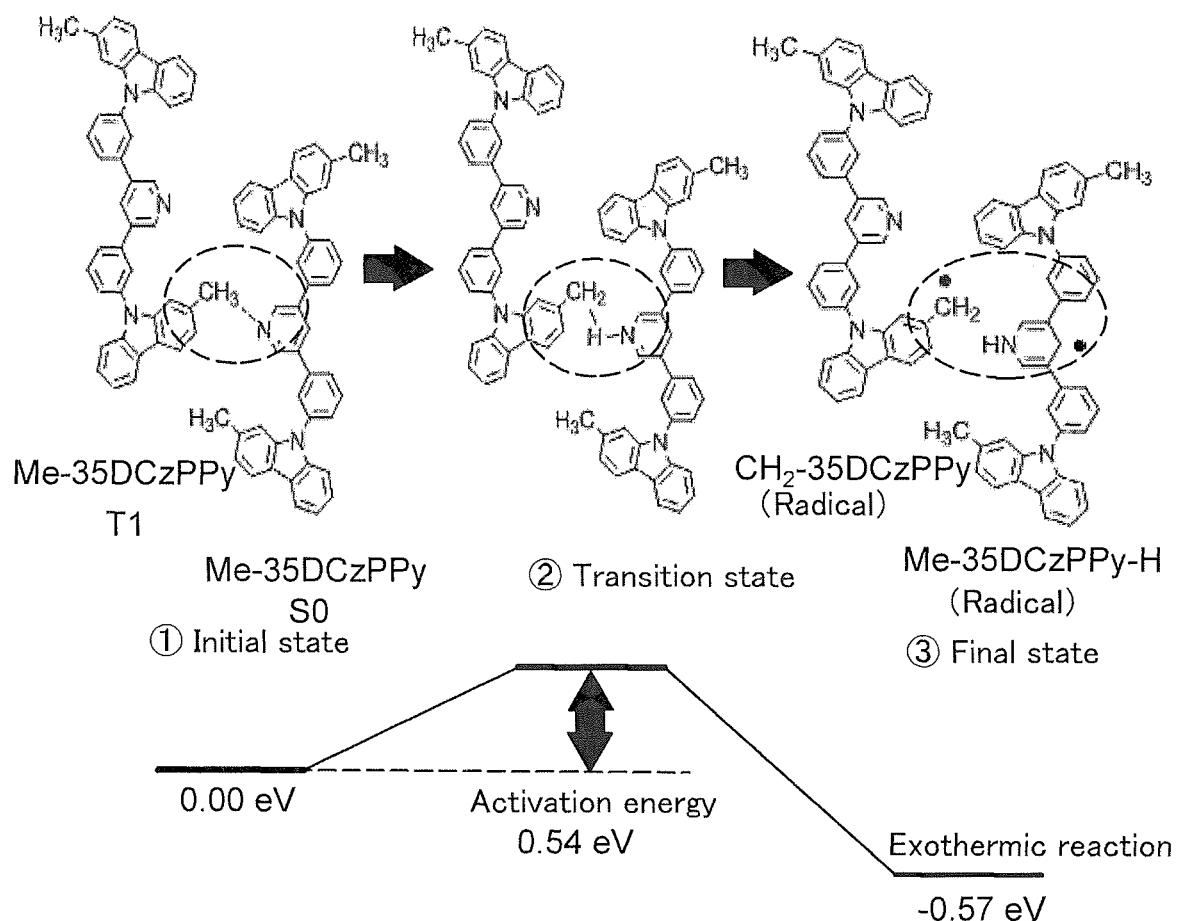
FIG. 3 illustrates reactions of one embodiment of the present invention.

FIG. 3 shows the reaction path and energy diagram that were revealed by the analysis of the hydrogen atom transfer reaction in the lowest triplet excited state.

In FIG. 3, energy in the state where Me-35DCzPPy in the T1 state and Me-35DCzPPy in the ground state (S0 state) are dissociated infinitely is used as the reference. The activation energy in the reaction in which a hydrogen atom of the methyl group moves to a pyridine ring is 0.54 eV, and the reaction can occur at room temperature. Moreover, in the final state after the hydrogen atom transfer, each of $CH_2$-35DCzPPy and Me-35DCzPPy-H is in a radical state, the energy in the final state is lower and more stable than the energy in the initial state, and this reaction is an exothermic reaction. This shows a possibility that the hydrogen atom transfer reaction occurs in the case of a molecular arrangement with which an interaction between a methyl group and a pyridine ring in two molecules of Me-35DCzPPy occurs in the light-emitting layer F in an excited state) in a state where the light-emitting element is driven.

$CH_2$-35DCzPPy in the radical state and Me-35DCzPPy-H in the radical state, which are generated, receive electrons or holes while the light-emitting element is being driven and are brought into a singlet ground state. Table 1 shows calculated values of the T1 level of $CH_2$-35DCzPPy brought into an anion state by reception of electrons and the T1 level of Me-35DCzPPy-H brought into a cation state by reception of holes. A measured value of the T1 level of Me-35DCzPPy is also shown.

Note that the calculation was performed in a manner similar to that of the calculation of the T1 level of Me-35DCzPPy.

TABLE 1

| Name of substance | T1 level (eV) |
| --- | --- |
| Me-35DCzPPy | 2.75 (measured value) |
| $CH_2$-35DCzPPy in anion state | 0.50 (calculated value) |
| Me-35DCzPPy-H in cation state | 1.41 (calculated value) |

As shown in Table 1, the T1 levels of $CH_2$-35DCzPPy in the anion state and Me-35DCzPPy-H in the cation state, which are generated by the hydrogen atom transfer reaction, are extremely low. Accordingly, this can cause deactivation in the light-emitting element. In other words, excitation energy transfer from a guest material in an excited state or a host material in an excited state to $CH_2$-35DCzPPy in the anion state and Me-35DCzPPy-H in the cation state occurs. Accordingly, light emission from the guest material cannot be obtained and thus, the emission efficiency of the light-emitting element decreases.

As described above, when the light-emitting element including a compound in which a hydrogen atom in a carbazole skeleton is substituted by a methyl group is driven, a substance which can cause deactivation in the light-emitting element is generated in some cases, and thus the reliability may be adversely affected. Accordingly, the content of the compound in which a hydrogen atom in a carbazole skeleton is substituted by a methyl group is preferably low. As described above, the spin density of a methyl group in Me-35DCzPPy in the T1 state is approximately 3% in the whole substance, and it is expected that when the content of a substance which can cause deactivation is approximately the same as that of the guest material, the light-emitting element is adversely affected by the substance. Accordingly, the weight ratio of the substance which can cause deactivation to the host material is preferably greater than 0 and less than or equal to 0.1, further preferably greater than 0 and less than or equal to 0.05, still further preferably greater than 0 and less than or equal to 0.025.

Note that although calculation in the case where the substituent in the carbazole skeleton is a methyl group is performed, the above reaction is not limited to a methyl group. In the case where the substituent is a hydrocarbon group, at least an aliphatic hydrocarbon group, a reaction similar to the above occurs.

Note that although calculation of a reaction with nitrogen of a pyridine skeleton is performed, the above reaction is not limited to a pyridine skeleton. It is expected that a reaction similar to the above occurs also in the case of a nitrogen-containing heteroaromatic ring compound. A reaction similar to the above occurs at least in the case of a compound including a nitrogen-containing six-membered heteroaromatic ring. That is, a reaction similar to the above occurs in the case of a compound including a pyridine ring, a pyridazine ring, a pyrimidine ring, a pyrazine ring, or a triazine ring. In other words, this is a phenomenon that occurs in the case of a heteroaromatic compound having an unshared electron pair.

The above reaction occurs when a hydrocarbon group substitution product has a structure in which at least a hydrogen atom in a host material in the light-emitting layer is substituted by a hydrocarbon group.

Accordingly, one embodiment of the present invention is a light-emitting element including a light-emitting layer which includes the first organic compound having a substituted or unsubstituted carbazole skeleton. The first organic compound is a compound having a nitrogen-containing six-membered heteroaromatic ring or a heteroaromatic compound having an unshared electron pair. Alternatively, the light-emitting element includes a light-emitting layer which includes not only the first organic compound but also a second organic compound. The second organic compound is a compound having a nitrogen-containing six-membered heteroaromatic ring or a heteroaromatic compound having an unshared electron pair.

Note that although analysis of the case where radial molecules generated in this calculation receive electrons or holes and are brought into a singlet ground state is performed, radicals generated in the light-emitting element react with other organic materials (e.g., a host material and a guest material) because radicals generally have high reactivity, and cause deterioration in some cases. A radical itself has low excitation energy and is probably likely to be a quenching factor.

Note that although quantum chemical calculation of the hydrogen atom transfer reaction between two molecules of Me-35DCzPPy is performed in the above calculation, in the case where quantum chemical calculation is performed on the assumption that a reaction similar to the above occurs between Me-35DCzPPy in an excited state, i.e., the T1 state or the S1 state, and 35DCzPPy in the ground state (the S0 state), a result similar to the above calculation result can be obtained. This is because the above is a reaction between a methyl group bonded to a carbazole skeleton and nitrogen of a pyridine skeleton.

The above hydrogen atom transfer reaction can also occur between two molecules of different substances. In the case where an organic compound in which at least one of hydrogen atoms in a carbazole skeleton is substituted by a hydrocarbon group having 1 to 6 carbon atoms and an organic compound having a nitrogen-containing heteroaromatic ring are present in the light-emitting layer at the same time, the hydrogen atom transfer reaction occurs in some cases.

Although quantum chemical calculation regarding the reaction of a methyl group bonded to a carbazole skeleton is performed as the above calculation, the above reaction is not limited to a substituent of a carbazole skeleton. In the case where a hydrocarbon group is included as a substituent of a skeleton over which spins extend, a reaction similar to the above is expected to occur.

Although quantum chemical calculation of the hydrogen atom transfer reaction is performed in the above, spins extend over the methyl group in Me-35DCzPPy in the T1 state as described above. Accordingly, a reaction other than the hydrogen atom transfer reaction using a methyl group as a starting point also occurs in some cases. In such cases, Me-35DCzPPy is converted into a radical molecule as in the hydrogen atom transfer reaction, and the radical molecule may be a quenching factor to cause deterioration of the light-emitting element. Accordingly, the content of a compound in which a hydrogen atom in a carbazole skeleton is substituted by a methyl group is preferably small, and the weight ratio of a compound in which a hydrogen atom in a carbazole skeleton is substituted by a methyl group to a host material is preferably greater than 0 and less than or equal to 0.1, further preferably greater than 0 and less than or equal to 0.05, still further preferably greater than 0 and less than or equal to 0.025.

<Material>

Next, components of a light-emitting element of one embodiment of the present invention are described in detail below.

<<Light-Emitting Layer>>

The light-emitting layer 130 includes at least the host material 131 and preferably further includes the guest material 132. The host material 131 may include the organic compounds 131_1 and 131_2. In the light-emitting layer 130, the host material 131 is present in the largest proportion by weight, and the guest material 132 is dispersed in the host material 131. When the guest material 132 is a fluorescent compound, the S1 level of the host material 131 (the organic compound 131_1 and the organic compound 131_2) in the light-emitting layer 130 is preferably higher than the S1 level of the guest material (the guest material 132) in the light-emitting layer 130. When the guest material 132 is a phosphorescent compound, the T1 level of the host material 131 (the organic compound 131_1 and the organic compound 131_2) in the light-emitting layer 130 is preferably higher than the T1 level of the guest material (the guest material 132) in the light-emitting layer 130.

The host material 131 is preferably a compound having a carbazole skeleton. Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); N,N-diphenyl-9-[4-(10-phenyl-9-anthryl)phenyl]-9H-carbazol-3-amine (abbreviated to CzA 1PA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9- diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}-9H-carbazol-3-amine (abbreviation: PCAPBA); N,9-diphenyl-N-(9,10-diphenyl-2-anthryl)-9H-carbazol-3-amine (abbreviation: 2PCAPA); 9-phenyl-3-[4-(10-phenyl-9-anthryl)phenyl]-9H-carbazole (abbreviation: PCzPA); and 3,6-diphenyl-9-[4-(10-phenyl-9-anthryl)phenyl]-9H-carbazole (abbreviation: DPCzPA).

In the case where the host material 131 includes the organic compounds 131_1 and 1312, the organic compound 131_1 has a carbazole skeleton and preferably further has a nitrogen-containing six-membered heteroaromatic skeleton. Specific examples of a nitrogen-containing six-membered heteroaromatic skeleton include compounds having any of a pyridine skeleton, a diazine skeleton (a pyrazine skeleton, a pyrimidine skeleton, and a pyridazine skeleton), and a triazine skeleton. As examples of these basic compounds having a nitrogen-containing heteroaromatic skeleton, compounds such as a pyridine derivative, a bipyridine derivative, a pyrimidine derivative, a triazine derivative, a quinoxaline derivative, a dibenzoquinoxaline derivative, a phenanthroline derivative, and a purine derivative can be given. As the organic compound 131_1, a material having a property of transporting more electrons than holes (an electron-transport material) can be used, and a material having an electron mobility of $1 \times 10^{-6}$ cm$^2$/Vs or higher is preferable. Note that these materials can be suitably used also in the case where the host material 131, that is, a host material in the light-emitting layer, includes one kind of material.

Specifically, for example, heterocyclic compounds having a diazine skeleton such as 2-[3-(3,9'-bi-9H-carbazol-9-yl) phenyl]dibenzo[f,h]quinoxaline (abbreviation: 2mCzCzPDBq) and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and heterocyclic compounds having a pyridine skeleton such as 3,5-bis[3-(9H-carbazol-9-yl)phenyl]pyridine (abbreviation: 35DCzPPy) can be used. Among the heterocyclic compounds, the heterocyclic compounds having a triazine skeleton, a diazine skeleton (pyrimidine, pyrazine, pyridazine), or a pyridine skeleton are highly reliable and stable and is thus preferably used. In addition, the heterocyclic compounds having the skeletons have a high electron-transport property to contribute to a reduction in drive voltage.

As the organic compound 131_1, the following heteroaromatic ring compounds can be also be used in addition to the above heteroaromatic ring compounds.

Heterocyclic compounds having a pyridine skeleton such as bathophenanthroline (abbreviation: BPhen), and bathocuproine (abbreviation: BCP); and heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[fh]quinoxaline (abbreviation: 7mDBTPDBq-II), 6-[3-(dibenzothiophen-4-yl)phenyl]dibenzo[fh]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), 1,3,5-tri[3-(3-pyridyl)phenyl]benzene (abbreviation: TmPyPB) can be given. In addition, high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can also be used. The substances listed here are mainly ones that have an electron mobility of $1 \times 10^{-6}$ cm$^2$/Vs or higher. However, any substance other than the above-described substances may be used as long as it is a substance whose electron-transport property is higher than the hole-transporting property.

The organic compound 131_2 can be a compound having a nitrogen-containing five-membered heterocyclic skeleton or a tertiary amine skeleton and preferably has a nitrogen-containing five-membered heterocyclic skeleton. Specifically, a pyrrole skeleton or an aromatic amine skeleton can be given. Specifically, an indole derivative, a carbazole derivative, a triarylamine derivative, and the like can be given. Examples of a nitrogen-containing five-membered heterocyclic skeleton include an imidazole skeleton, a triazole skeleton, and a tetrazole skeleton. As the organic compound 131_2, a material having a property of transporting more holes than electrons (a hole-transport material) can be used, and a material having a hole mobility of $1 \times 10^{-6}$ cm$^2$/Vs or higher is preferable. Furthermore, the hole-transport material may be a high molecular compound. Among the above compounds having a carbazole skeleton, a compound having a hole mobility of $1 \times 10^{-6}$ cm$^2$/Vs or higher can also be suitably used.

Specific examples of the aromatic amine compounds that can be used as the material having a high hole-transport property include N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Other examples are high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl) methacrylamide](abbreviation: PTPDMA), and poly[N,N'-bis(4-butylphenyl)-N,N-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or a-NPD), N,N-bis(3-methylphenyl)-N,N-diphenyl-[1,1'-biphenyl]-4,4'-diamine (abbreviation: TPD), 4,4',4"-tris(carbazol-9-yl)triphenylamine (abbreviation: TCTA), 4,4',4"-tris [N-(1-naphthyl)-N-phenylamino]triphenylamine (abbreviation: 1'-TNATA), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[NV-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino] spiro-9,9'-bifluorene (abbreviation: DPASF), 4-phenyl-4'-(9-phenyl-9H-carbazol-3-yl)triphenylamine (abbreviation:

PCBA1BP), 4,4'-diphenyl-4"-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N-diphenylbenzene-1,3-diamine (abbreviation: PCA2B), N,N,N'-triphenyl-N,N,N'-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT). Among the above compounds, compounds having a pyrrole skeleton or an aromatic amine skeleton are preferred because of their high stability and reliability. In addition, the compounds having such skeletons have a high hole-transport property to contribute to a reduction in driving voltage.

As the organic compound 131_2, a compound having a nitrogen-containing five-membered heterocyclic skeleton such as an imidazole skeleton, a triazole skeleton, or a tetrazole skeleton can be used. Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and the like can be used, for example.

Although there is no particular limitation on the guest material 132 in the light-emitting layer 130, as a fluorescent compound, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferably used, and for example, any of the following substances can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPm), N,N-bis(3-methylphenyl)-N,N-bis[13-(9-phenyl-9H-fluoren-9-yl)phenyl]pyrene-1,6-diamine (abbreviation: 1,6mMemFLPAPm), N,N-bis[4-(9-phenyl-9H-fluoren-9-yl)phenyl]-N,N-bis(4-tert-butylphenyl)pyrene-1,6-diamine (abbreviation: 1,6tBu-FLPAPrn), N,N-bis[4-(9-phenyl-9H-fluoren-9-yl)phenyl]N,N-diphenyl-3,8-dicyclohexylpyrene-1,6-diamine (abbreviation: ch-1,6FLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N",N",N"',N"',N-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N,N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i] quinolizin-9-yl)ethenyl]-4H-pyran-4-ylidene}propanedinitrile (abbreviation: DCM2), N,N,N,N-tetrakis(4-methylphenyl)tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H, 5H-benzo[i]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ ] quinolizin-9-yl) ethenyl]-4H-pyran-4-ylidene}propanedinitrile (abbreviation: BisDCJTM), and 5,10,15,20-tetraphenylbisbenzo[5,6] indeno[1,2,3-cd:1',2',3'-lm]perylene.

Note that as shown in Table 1, a hydrocarbon group substitution product included in the first organic compound causes a decrease in the T1 level. Accordingly, one embodiment of the present invention is more effective in the case where a guest material has a function of converting triplet excitation energy into light emission. As the material that has a function of converting triplet excitation energy into light emission, a phosphorescent material and a thermally activated delayed fluorescence (TADF) material can be given, and the description of the materials is made below. Note that one embodiment of the present invention is particularly effective in the case where these guest materials have a high T1 level, specifically, in the case where these guest materials show an emission peak at 450 nm or more and 530 nm or less.

As the guest material 132 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. As the metal complex, a platinum complex having a porphyrin ligand or the like can be given.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole] iridium(III) (abbreviation: Ir(iPrpmi)$_3$) and tris(3-(2,6-dimethylphenyl)-7-methylimidazo[1,2-]phenanthridinato)iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$] iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organic metal iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato] iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium (III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl] pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis [4,6-bis(3-methylphenyl)pyrimidinato] (dipivaloylmethanato)iridium(III) (abbreviation: Ir(5mdppm)$_2$(dpm)), and bis [4,6-di(naphthalen-1-yl)pyrimidinato] (dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato) iridium(III) (abbreviation: Ir(tppr)$_2$(dpm)), and (acetylacetonato)bis[2,3-bis(4-fluorophenyl)quinoxalinato] iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity As the light-emitting material included in the light-emitting layer 130, any material can be used as long as the material can convert the triplet excitation energy into light emission. As an example of the material that can convert the triplet excitation energy into light emission, a thermally activated delayed fluorescent (TADF) material can be given in addition to a phosphorescent material. Therefore, it is acceptable that the "phosphorescent material" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the singlet excitation energy level and the triplet excitation energy level becomes small.

The light-emitting layer 130 may include a material other than the host material 131 and the guest material 132.

Examples of the material that can be used for the light-emitting layer 130 are, but not limited to, condensed polycyclic aromatic compounds such as anthracene derivatives, phenanthrene derivatives, pyrene derivatives, chrysene derivatives, and dibenzo[g,p]chrysene derivatives. Specific example of the condensed polycyclic aromatic compounds include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a singlet excitation energy level or a triplet excitation energy level higher than the excitation energy level of the guest material 132 are selected from these substances and known substances.

For example, a compound having a heteroaromatic skeleton, such as an oxadiazole derivative, can be used for the light-emitting layer 130. As specific examples thereof, heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), and 4,4'-bis(5-methylbenzoxazol-2-yl)stilbene (abbreviation: BzOs) can be given.

In addition, a metal complex (e.g., a zinc- or aluminum-based metal complex) with a heterocycle, for example, can be used for the light-emitting layer 130. As examples, metal complexes having a quinoline ligand, a benzoquinoline ligand, an oxazole ligand, and a thiazole ligand can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

As other examples of the hole-transport material, aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene can be given. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 can have a function of transporting holes injected into the hole-injection layer 111 to the light-emitting layer 130, the highest occupied molecular orbital (HOMO) level of the hole-transport layer 112 is preferably equal or close to the HOMO level of the hole-injection layer 111.

As the hole-transport material, a substance having a hole mobility of $1\times10^{-6}$ cm$^2$/Vs or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a ic-electron deficient heteroaromatic compound such as a nitrogen-containing heteroaromatic compound, a metal complex, or the like can be used, for example. Specifically, the pyridine derivative, the bipyridine derivative, the pyrimidine derivative, the triazine derivative, the quinoxaline derivative, the dibenzoquinoxaline derivative, the phenanthroline derivative, the triazole derivative, the benzimidazole derivative, the oxadiazole derivative, and the like given as the electron-transport materials that can be used in the light-emitting layer 130 can be given. A substance having an electron mobility of $1\times10^{-6}$ cm$^2$/Vs or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

In addition, metal complexes with a heterocycle, such as metal complexes having a quinoline ligand, a benzoquinoline ligand, an oxazole ligand, and a thiazole ligand, can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

Between the electron-transport layer 118 and the light-emitting layer 130, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in suppressing a problem (e.g., a decrease in element lifetime) which occurs in the case where the electron-transport property of the electron-transport material is significantly higher than the hole-transport property of the hole-transport material.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

<<Quantum Dot>>

A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic material has high inherent stability, a light-emitting element which is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots have a function of emitting directional light; thus, quantum rods can be used as a light-emitting material to obtain a light-emitting element with higher external quantum efficiency.

In most organic EL elements, to improve emission efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (T1), neodymium (Nd), nickel (Ni), and lanthanum (La)), such as an alloy containing Al and T1 and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, T1, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^5$ Ω·cm, further preferably lower than or equal to $1\times10^4$ Ω·cm.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 or the electrode 102 functions as the cathode, the electrode preferably contains a material having a low work function (lower than or equal to 3.8 eV). For example, it is possible to use an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, or the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper which includes a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, that is formed over any of the above-described substrates. Accordingly, an active matrix display device in which the FET controls the driving of the light-emitting element 150 can be manufactured.

The structure described above in this embodiment can be combined with any of the structures described in the other embodiments as appropriate.

Embodiment 2

Figure 4A:
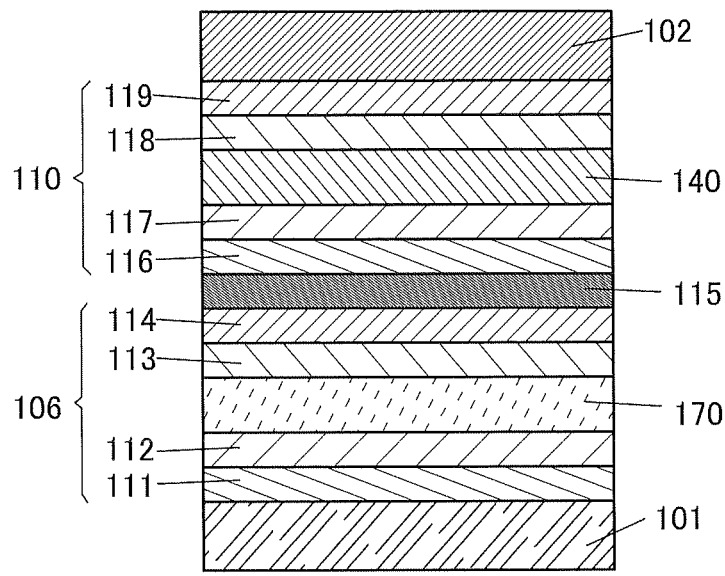
FIGS. 4A and 4B are schematic cross-sectional views illustrating a light-emitting element of one embodiment of the present invention and FIG. 4C is a diagram illustrating the correlation of energy levels in a light-emitting layer.
Figure 4B:
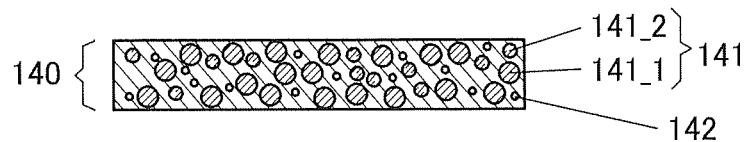
Figure 4C:
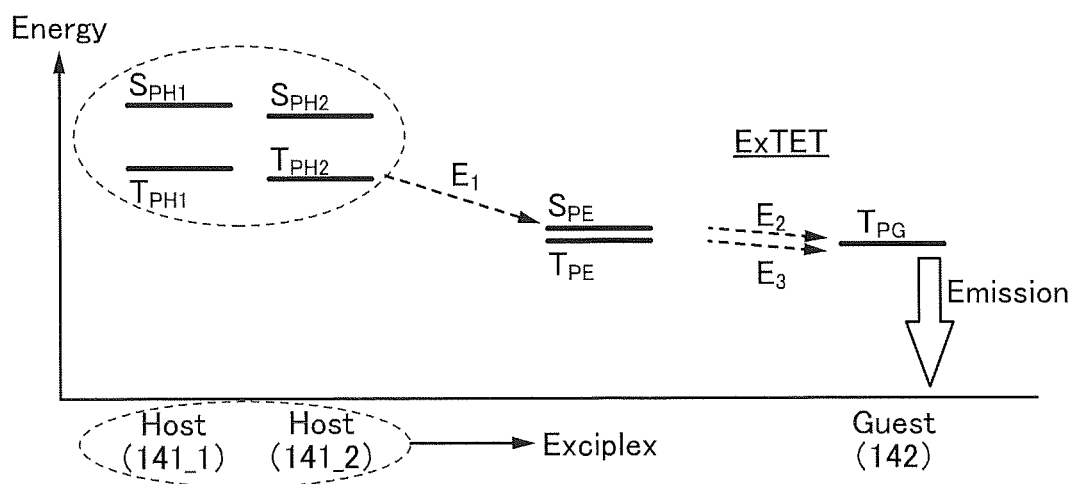

In this embodiment, a light-emitting element having a structure different from that described in Embodiment 1 and light emission mechanisms of the light-emitting element are described below with reference to FIGS. 4A to 4C. In FIGS. 4A to 4C, a portion having a function similar to that in FIG. 1A is represented by the same hatch pattern and not denoted by a reference numeral in some cases. In addition, common reference numerals are used for portions having similar functions, and a detailed description of the portions is omitted in some cases.

Structure Example 1 of Light-Emitting Element

FIG. 4A is a schematic cross-sectional view of a light-emitting element 252.

The light-emitting element 252 illustrated in FIG. 4A includes a plurality of light-emitting units (a light-emitting unit 106 and a light-emitting unit 110 in FIG. 4A) between a pair of electrodes (the electrode 101 and the electrode 102). At least one of the light-emitting units has a structure similar to that of the EL layer 100. Note that the light-emitting unit 106 and the light-emitting unit 110 may have the same structure or different structures.

In the light-emitting element 252 illustrated in FIG. 4A, the light-emitting unit 106 and the light-emitting unit 110 are stacked, and the charge-generation layer 115 is provided between the light-emitting unit 106 and the light-emitting unit 110. For example, it is preferable that a structure similar to that of the EL layer 100 be used in the light-emitting unit 106.

The light-emitting element 252 includes a light-emitting layer 140 and the light-emitting layer 170. The light-emitting unit 106 includes the hole-injection layer 111, the hole-transport layer 112, an electron-transport layer 113, and an electron-injection layer 114 in addition to the light-emitting layer 170. The light-emitting unit 110 includes a hole-injection layer 116, a hole-transport layer 117, the electron-transport layer 118, and the electron-injection layer 119 in addition to the light-emitting layer 140.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1 \times 10^{-6}$ cm$^2$/Vs or higher is preferably used. Note that any other substance may be used as long as the substance has a hole-transport property higher than an electron-transport property. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. Alternatively, when a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer containing a transparent conductive material.

The charge-generation layer 115 provided between the light-emitting unit 106 and the light-emitting unit 108 may have any structure as long as electrons can be injected into the light-emitting unit on one side and holes can be injected into the light-emitting unit on the other side when a voltage is applied between the electrode 101 and the electrode 102. For example, in FIG. 6A, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even if it has lower conductivity than the pair of electrodes (the electrodes 101 and 102).

Forming the charge-generation layer 115 by using any of the above materials can suppress an increase in drive voltage caused by the stack of the light-emitting layers.

The light-emitting element having two light-emitting units has been described with reference to FIG. 4A; however, a similar structure can be applied to a light-emitting element in which three or more light-emitting units are stacked. With a plurality of light-emitting units partitioned by the charge-generation layer between a pair of electrodes as in the light-emitting element 252, it is possible to provide a light-emitting element which can emit light with high luminance with the current density kept low and has a long lifetime. In addition, a light-emitting element with low power consumption can be realized.

When the structure described in Embodiment 1 is used for at least one of the plurality of units, a light-emitting element with a high emission efficiency and a light-emitting element with high reliability can be provided.

In addition, the light-emitting layer of the light-emitting unit 110 preferably contains a phosphorescent compound. In other words, it is preferable that the light-emitting layer 140 included in the light-emitting unit 110 include a phosphorescent compound, and the light-emitting layer 170 included in the light-emitting unit 106 have the structure of the light-emitting layer 130 described in Embodiment 1. A structure example of the light-emitting element 252 in this case is described below.

The light-emitting layer 140 included in the light-emitting unit 110 includes a host material 141 and a guest material 142 as illustrated in FIG. 4B. The host material 141 includes an organic compound 141_1 and an organic compound 141_2. In the following description, the guest material 142 included in the light-emitting layer 140 is a phosphorescent compound.

<<Light Emission Mechanism of Light-Emitting Layer 140>>

Next, the light emission mechanism of the light-emitting layer 140 is described below.

The organic compound 141_1 and the organic compound 141_2 which are included in the light-emitting layer 140 preferably form an exciplex.

Although it is acceptable as long as the combination of the organic compound 141_1 and the organic compound 141_2 can form an exciplex, it is preferable that one of them be a compound having a hole-transport property and the other be a compound having an electron-transport property.

FIG. 4C shows a correlation between the energy levels of the organic compound 141_1, the organic compound 141_2, and the guest material 142 in the light-emitting layer 140. The following explains what terms and signs in FIG. 4C represent:

Host (141_1): the organic compound 141_1 (host material);
Host (141_2): the organic compound 141_2 (host material);
Guest (142): the guest material 142 (the phosphorescent compound);
$S_{PH1}$: the S1 level of the organic compound 141_1 (host material);
$T_{PH1}$: the T1 level of the organic compound 141_1 (host material);
$S_{PH2}$: the S1 level of the organic compound 141_2 (host material);
$T_{PH2}$: the T1 level of the organic compound 141_2 (host material);
$T_{PG}$: the T1 level of the guest material 142 (the phosphorescent compound);
$S_{PE}$: the S1 level of the exciplex; and
$T_{PE}$: the T1 level of the exciplex.

One of the organic compound 141_1 and the organic compound 141_2 receives a hole and the other receives an electron to readily form an exciplex (see Route $E_1$ in FIG.

4C). Alternatively, one of the organic compounds brought into an excited state immediately interacts with the other organic compound to form an exciplex. Because the excitation energy levels ($S_{PE}$ and $T_{PE}$) of the exciplex are lower than the S1 levels ($S_{PH1}$ and $S_{PH2}$) of the host materials (the organic compounds 141_1 and 141_2) that form the exciplex, the excited state of the host material 141 can be formed with lower excitation energy. This can reduce the driving voltage of the light emitting element.

Both energies of $S_{PE}$ and $T_{PE}$ of the exciplex are then transferred to the T1 level of the guest material 142 (the phosphorescent compound); thus, light emission is obtained (see Routes $E_2$ and $E_3$ in FIG. 4C).

Note that the T1 level ($T_{PE}$) of the exciplex is preferably higher than the T1 level ($T_{PG}$) of the guest material 142 and lower than or equal to the T1 levels ($T_{PH1}$ and $T_{PH2}$) of the organic compounds (the organic compound 141_1 and the organic compound 141_2) which form the exciplex. In this way, the singlet excitation energy and the triplet excitation energy of the formed exciplex can be efficiently transferred from the S1 level ($S_{PE}$) and the T1 level ($Tp_E$) of the exciplex to the T1 level ($T_{PG}$) of the guest material 142.

In order that the organic compound 141_1 and the organic compound 141_2 efficiently form an exciplex, it is preferable to satisfy the following: the HOMO level of one of the organic compound 141_1 and the organic compound 141_2 is higher than that of the other and the LUMO level of the one of the organic compound 141_1 and the organic compound 141_2 is higher than that of the other.

In the case where the combination of the organic compounds 141_1 and 141_2 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

Note that the above-described processes through Routes $E_1$ to $E_3$ may be referred to as exciplex-triplet energy transfer (ExTET) in this specification and the like. In other words, in the light-emitting layer 140, excitation energy is given from the exciplex to the guest material 142. In this case, the efficiency of reverse intersystem crossing from $T_{PE}$ to $S_{PE}$ and the emission quantum yield from $S_{PE}$ are not necessarily high; thus, materials can be selected from a wide range of options.

When ExTET is utilized, a highly reliable light-emitting element having high emission efficiency can be obtained.

Note that the light-emitting layer 170 can have any of the structure of the light-emitting layer 130 described in Embodiment 1 and the structure of the light-emitting layer 140.

Note that in each of the above-described structures, the emission colors of the guest materials used in the light-emitting unit 106 and the light-emitting unit 110 may be the same or different. In the case where the same guest materials emitting light of the same color are used for the light-emitting unit 106 and the light-emitting unit 110, the light-emitting element 252 can exhibit high emission luminance at a small current value, which is preferable. In the case where guest materials emitting light of different colors are used for the light-emitting unit 106 and the light-emitting unit 110, the light-emitting element 252 can exhibit multi-color light emission, which is preferable. In that case, when a plurality of light-emitting materials with different emission wavelengths are used in one or both of the light-emitting layers 140 and 170, lights with different emission peaks synthesize light emission from the light-emitting element 252. That is, the emission spectrum of the light-emitting element 252 has at least two maximum values.

The above structure is also suitable for obtaining white light emission. When the light-emitting layer 140 and the light-emitting layer 170 emit light of complementary colors, white light emission can be obtained. It is particularly favorable to select the guest materials so that white light emission with high color rendering properties or light emission of at least red, green, and blue can be obtained.

At least one of the light-emitting layers 140 and 170 may be further divided into layers and the divided layers may contain different light-emitting materials. That is, at least one of the light-emitting layers 140 and 170 may consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In that case, a light-emitting material included in the first light-emitting layer may be the same as or different from a light-emitting material included in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

This embodiment can be combined with any of the other embodiments as appropriate.

Embodiment 3

In this embodiment, a light-emitting device including the light-emitting element described in Embodiment 1 and Embodiment 2 is described with reference to FIGS. 5A and 5B.

FIG. 5A is a top view of the light-emitting device and FIG. 5B is a cross-sectional view taken along the lines A-B and C-D in FIG. 5A. The light-emitting device includes a driver circuit portion (source side driver circuit) 601, a pixel portion 602, and a driver circuit portion (gate side driver circuit) 603, which control light emission of a light-emitting element and are illustrated with dotted lines. Moreover, a reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source side driver circuit 601 and the gate side driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure of the light-emitting device is described with reference to FIG. 5B. The driver circuit portion and the pixel portion are formed over an element substrate 610. Here, the source side driver circuit 601, which is the driver circuit portion, and one pixel of the pixel portion 602 are illustrated.

In the source side driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type in which the driver circuit is formed over the substrate is described in this embodiment, the driver circuit is not necessarily formed over the substrate, and may be formed outside the substrate.

The pixel portion 602 includes a plurality of pixels including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, in the case where photosensitive acrylic is used as a material of the insulator 614, only the upper end portion of the insulator 614 preferably has a curved surface. The radius of curvature of the curved surface is preferably greater than or equal to 0.2 m and less than or equal to 0.3 m. As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function as an anode.

The EL layer 616 is formed by any of a variety of methods such as an evaporation method using an evaporation mask, an inkjet method, and a spin coating method. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting element 618 is formed with the first electrode 613, the EL layer 616, and the second electrode 617. The light-emitting element 618 preferably has the structure described in Embodiment 1 and Embodiment 2. In the light-emitting device of this embodiment, the pixel portion, which includes a plurality of light-emitting elements, may include both the light-emitting element with the structure described in Embodiment 1 and Embodiment 2 and a light-emitting element with a different structure.

The sealing substrate 604 is attached to the element substrate 610 with the sealant 605, so that the light-emitting element 618 is provided in the space 607 surrounded by the element substrate 610, the sealing substrate 604, and the sealant 605. The space 607 is filled with a filler. The filler may be an inert gas (such as nitrogen or argon), or a resin and/or a desiccant.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), polyvinyl fluoride (PVF), polyester, acrylic, or the like can be used.

As described above, the light-emitting device including the light-emitting element described in Embodiment 1 and Embodiment 2 can be obtained.

Structure Example 2 of Light-Emitting Device

FIGS. 6A and 6B each illustrate an example of a display device including a light-emitting element exhibiting white light emission and a coloring layer (a color filter).

FIG. 6A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1026, an EL layer 1028, a second electrode 1029 of the light-emitting elements, a sealing substrate 1031, a sealant 1032, and the like.

In FIGS. 6A and 6B, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 5A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 6B illustrates an example in which the red coloring layer 1034R, the green coloring layer 1034G, and the blue coloring layer 1034B are formed between the gate insulating film 1003 and the first interlayer insulating film 1020. As illustrated in FIG. 6B, the coloring layers may be provided between the substrate 1001 and the sealing substrate 1031.

The above-described light-emitting device has a structure in which light is extracted from the substrate 1001 side where the TFTs are formed (a bottom emission structure), but may have a structure in which light is extracted from the sealing substrate 1031 side (a top emission structure).

Structure Example 3 of Light-Emitting Device

Figure 7:
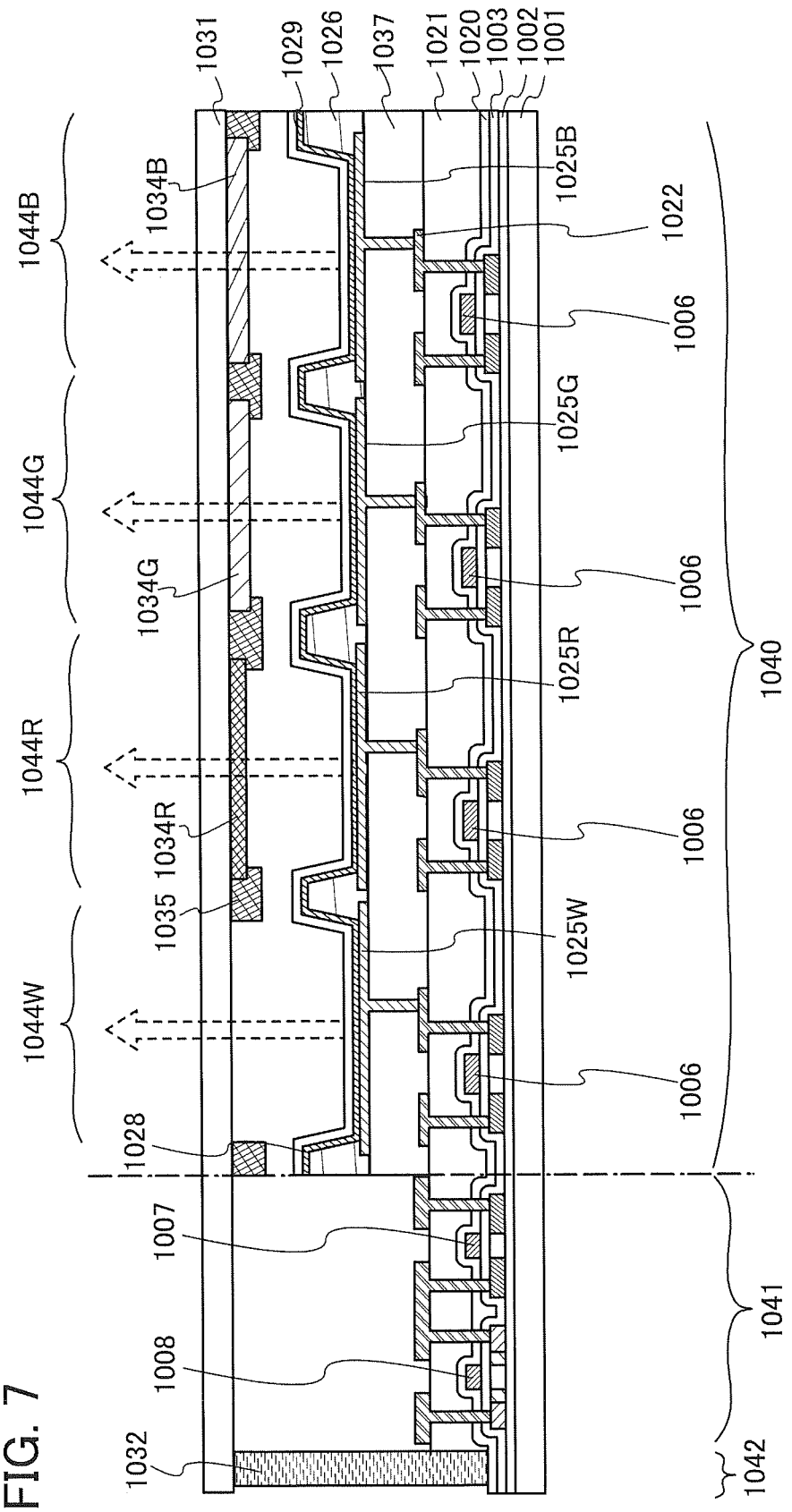
FIG. 7 is a conceptual diagram illustrating an active matrix light-emitting device of one embodiment of the present invention.

FIG. 7 is a cross-sectional view of a light-emitting device having a top emission structure. In this case, a substrate that does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using any other various materials.

Lower electrodes 1025W, 1025R, 1025G, and 1025B of the light-emitting elements each function as an anode here, but may function as a cathode. Furthermore, in the case of the light-emitting device having a top emission structure as illustrated in FIG. 7, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 is formed to have a structure similar to the structure described in Embodiment 2, with which white light emission can be obtained.

In FIGS. 6A and 6B and FIG. 7, the structure of the EL layer for providing white light emission can be achieved by, for example, using a plurality of light-emitting layers or using a plurality of light-emitting units. Note that the structure to provide white light emission is not limited to the above.

In the case of a top emission structure as illustrated in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with the overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue or four colors of red, green, blue, and yellow may be performed.

As described above, the light-emitting device including the light-emitting element described in Embodiment 3 and Embodiment 4 can be obtained.

This embodiment can be combined with any of the other embodiments as appropriate.

Embodiment 4

In this embodiment, a specific example of a display device including the light-emitting element described in Embodiment 1 and Embodiment 2 is described. A display device described below includes both a reflective liquid crystal element and a light-emitting element. The display device can perform display in a transmissive mode and in a reflective mode. The light-emitting element described in Embodiment 1 and Embodiment 2 is preferably used.

Structure Example 1 of Display Device

FIG. 8A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes a plurality of wirings S1 and a plurality of wirings S2 which are electrically connected to the circuit SD and the plurality of pixels 410 arranged in a direction C.

The pixel 410 includes a reflective liquid crystal element and a light-emitting element. In the pixel 410, the liquid crystal element and the light-emitting element partly overlap with each other.

FIG. 8B1 illustrates a structure example of an electrode 311b included in the pixel 410. The electrode 311b serves as a reflective electrode of the liquid crystal element in the pixel 410. The electrode 311b has an opening 451.

In FIG. 8B1, a light-emitting element 360 in a region overlapping with the electrode 311b is denoted by a dashed line. The light-emitting element 360 overlaps with the opening 451 included in the electrode 311b. Thus, light from the light-emitting element 360 is emitted to the display surface side through the opening 451.

In FIG. 8B1, the pixels 410 adjacent in the direction R correspond to different emission colors. As illustrated in FIG. 8B1, the openings 451 are preferably provided in different positions in the electrodes 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution display device is achieved even when EL layers of the light-emitting elements 360 are separately formed with a shadow mask or the like.

Alternatively, arrangement illustrated in FIG. 8B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel emitting light of the same color, in which case crosstalk can be suppressed.

Circuit Configuration Example

Figure 9:
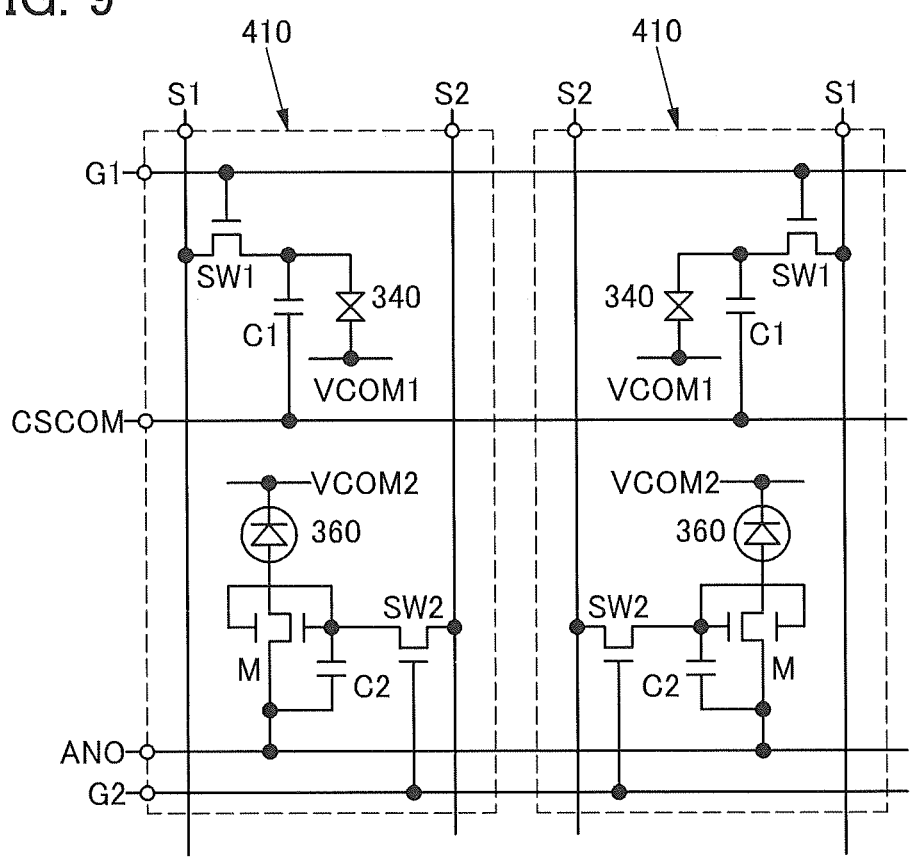
FIG. 9 is a circuit diagram illustrating a display device of one embodiment of the present invention.

FIG. 9 is a circuit diagram illustrating a configuration example of the pixel 410. FIG. 9 illustrates two adjacent pixels 410.

The pixel 410 includes a switch SW1, a capacitor C1, a liquid crystal element 340, a switch SW2, a transistor M, a capacitor C2, the light-emitting element 360, and the like.

Figure 12:
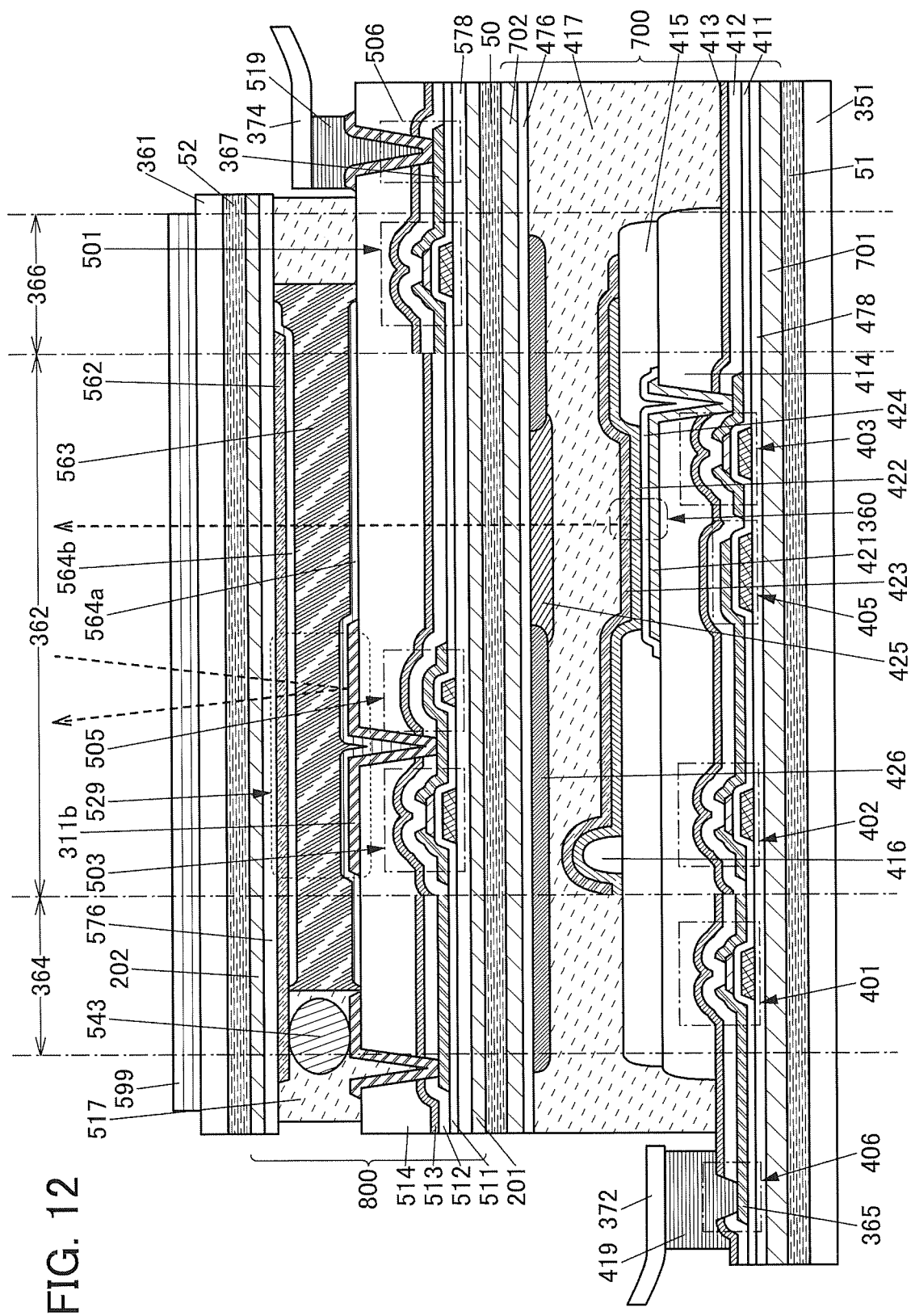
FIG. 12 is a schematic view illustrating a display device of one embodiment of the present invention.

The pixel 410 is electrically connected to the wiring G1, the wiring G2, the wiring ANO, the wiring CSCOM, the wiring S1, and the wiring S2. FIG. 12 also illustrates a wiring VCOM1 electrically connected to the liquid crystal element 340 and a wiring VCOM2 electrically connected to the light-emitting element 360.

FIG. 9 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

Figure 10A:
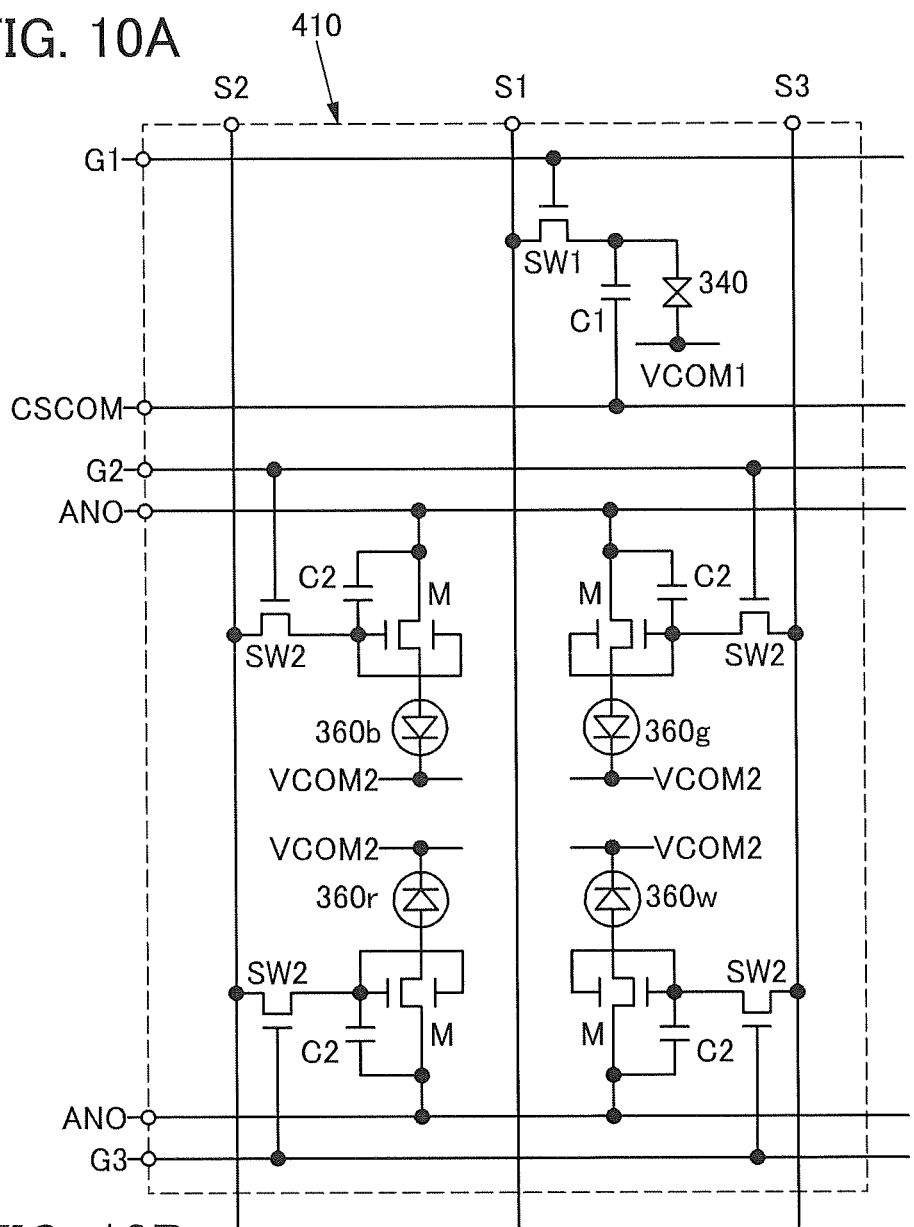
FIGS. 10A and 10B are circuit diagrams of a display device of one embodiment of the present invention.

FIG. 10A illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

Figure 10B:
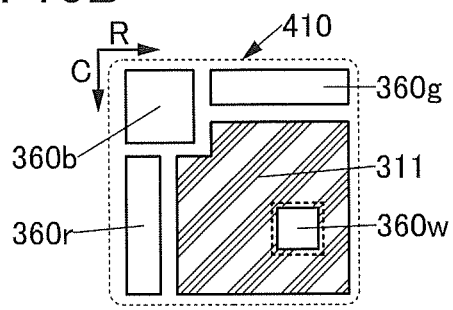

In the pixel 410 of FIGS. 10A and 10B, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Although FIG. 9 illustrates an example in which one liquid crystal element 340 and one light-emitting element 360 are provided in one pixel 410, one embodiment of the present invention is not limited to this example. FIG. 10A illustrates an example in which one liquid crystal element 340 and four light-emitting elements 360 (light-emitting elements 360r, 360g, 360b, and 360w) are provided in one pixel 410. The pixel 410 illustrated in FIG. 10A differs from that in FIG. 9 in being capable of performing full-color display by one pixel.

In addition to the example in FIG. 9, the pixel 410 in FIG. 10A is connected to a wiring G3 and a wiring S3.

In the example illustrated in FIG. 10A, for example, light-emitting elements which exhibit red (R), green (G), blue (B), and white (W) can be used as the four light-emitting elements 360. Furthermore, as the liquid crystal element 340, a reflective liquid crystal element emitting white light can be used. Thus, in the case of performing display in the reflective mode, white display with high reflectivity can be performed. In the case of performing display in the transmissive mode, an image can be displayed with a higher color rendering property at low power consumption.

FIG. 10B illustrates a configuration example of the pixel 410. The pixel 410 includes the light-emitting element 360w which overlaps with the opening in the electrode 311 and the light-emitting elements 360r, 360g, and 360b which are located near the electrode 311. It is preferable that the light-emitting elements 360r, 360g, and 360b have substantially the same light-emitting area.

Structure Example 4 of Display Device

Figure 11:
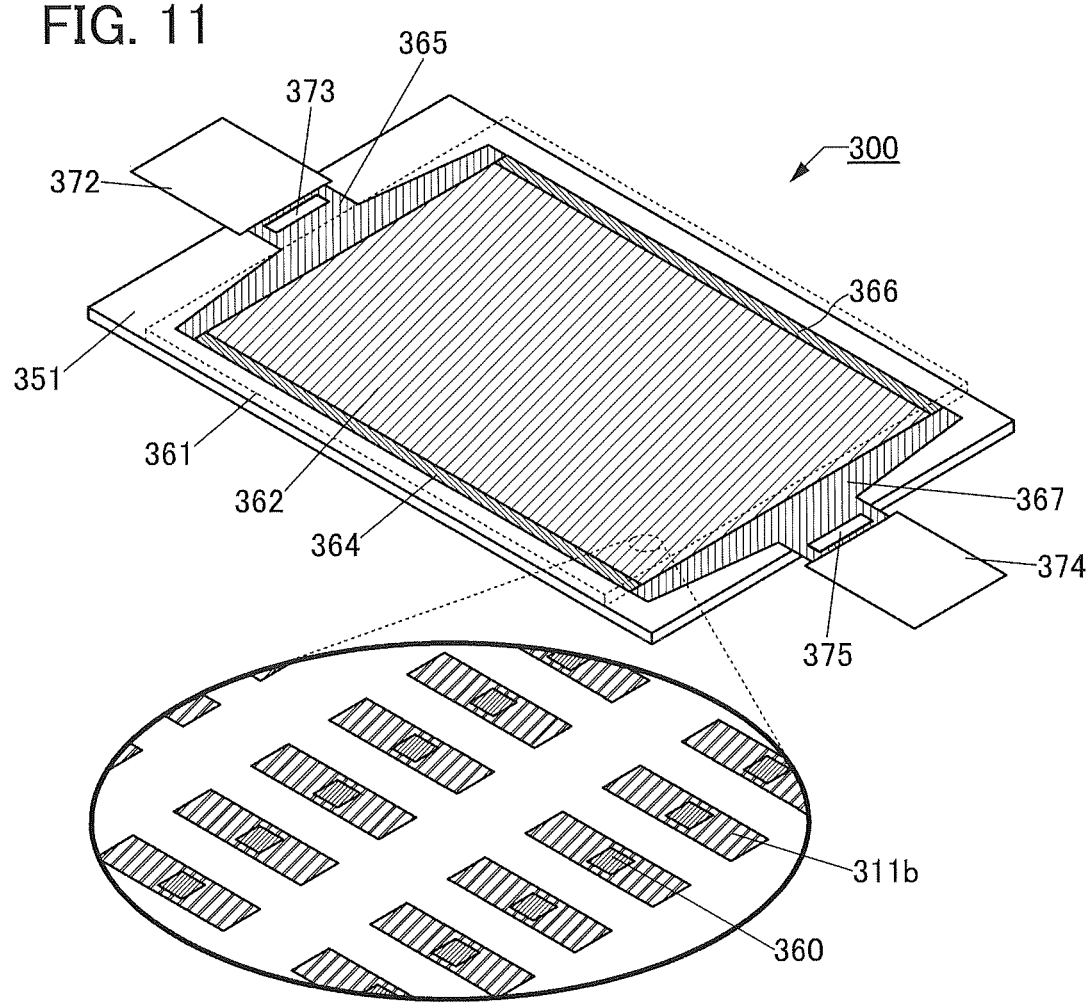
FIG. 11 is a schematic view illustrating a display device of one embodiment of the present invention.

FIG. 11 is a schematic perspective view of a display device 300 of one embodiment of the present invention. In the display device 300, a substrate 351 and a substrate 361 are bonded to each other. In FIG. 11, the substrate 361 is denoted by a dashed line.

The display device 300 includes the display portion 362, a circuit portion 364, a wiring 365, a circuit portion 366, a wiring 367, and the like. The substrate 351 is provided with the circuit portion 364, the wiring 365, the circuit portion 366, the wiring 367, the electrode 311b functioning as a pixel electrode, and the like. In FIG. 11, an IC 373, an FPC 372, an IC 375, and an FPC 374 are mounted on the substrate 351. Thus, the structure illustrated in FIG. 11 can be referred to as a display module including the display device 300, the IC 373, the FPC 372, the IC 375, and the FPC 374.

For the circuit portion 364, a circuit functioning as a scan line driver circuit can be used, for example.

The wiring 365 has a function of supplying a signal and electric power to the display portion and the circuit portion 364. The signal and electric power are input to the wiring 365 from the outside through the FPC 372 or from the IC 373.

FIG. 11 illustrates an example in which the IC 373 is provided on the substrate 351 by a chip on glass (COG) method or the like. As the IC 373, an IC functioning as a scan line driver circuit, a signal line driver circuit, or the like can be used. Note that it is possible that the IC 373 is not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPC 372. Alternatively, the IC 373 may be mounted on the FPC 372 by a chip on film (COF) method or the like.

FIG. 12 illustrates an enlarged view of a part of the display portion 362. Electrodes 311b included in a plurality of display elements are arranged in a matrix in the display portion 362. The electrode 311b has a function of reflecting visible light and serves as a reflective electrode of the liquid crystal element 340 described later.

As illustrated in FIG. 12, the electrode 311b has an opening. The light-emitting element 360 is positioned closer to the substrate 351 than the electrode 311b is. Light is emitted from the light-emitting element 360 to the substrate 361 side through the opening in the electrode 311b.

FIG. 12 illustrates an example of cross sections of part of a region including the FPC 372, part of a region including the circuit portion 364, part of a region including the display portion 362, part of a region including the circuit portion 366, and part of a region including the FPC 374 of the display device illustrated in FIG. 11.

The display device illustrated in FIG. 12 has a structure in which a display panel 700 and a display panel 800 are stacked. The display panel 700 includes a resin layer 701 and a resin layer 702. The display panel 800 includes a resin layer 201 and a resin layer 202. The resin layers 702 and 201 are bonded to each other with an adhesive layer 50. The resin layer 701 is bonded to the substrate 351 with an adhesive layer 51. The resin layer 202 is bonded to the substrate 361 with an adhesive layer 52.

[Display Panel 700]

The display panel 700 includes the resin layer 701, an insulating layer 478, a plurality of transistors, a capacitor 405, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 702.

The circuit portion 364 includes a transistor 401. The display portion 362 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 12 have bottom-gate structures. The transistor structures may be different between the circuit portion 364 and the display portion 362. The circuit portion 364 and the display portion 362 may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. The number of the insulating layers covering the transistors and the like is not particularly limited. The insulating layer 414 functions as a planarization layer. It is preferable that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 12. Since an insulating layer formed using an organic material is not positioned at the end portion of the display device in the structure of FIG. 12, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362 can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 12 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 12, the spacer 416 may be provided on the substrate 361 side (e.g., in a position closer to the substrate 361 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 701. The insulating layer 476 is formed on a surface of the resin layer 702. The insulating layer 476 and the insulating layer 478 are preferably highly resistant to moisture. The light-emitting element 360, the transistors, and the like are preferably provided between a pair of insulating layers with high resistance to moisture, in which case impurities such as water can be prevented from entering these elements, leading to an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmittance of the insulating film with high resistance to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside are transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the display panel 700.

[Display Panel 800]

The display panel 800 is a reflective liquid crystal display device employing a vertical electric field mode.

The display panel 800 includes the resin layer 201, an insulating layer 578, a plurality of transistors, a capacitor 505, the wiring 367, an insulating layer 511, an insulating layer 512, an insulating layer 513, an insulating layer 514, a liquid crystal element 529, an alignment film 564a, an alignment film 564b, an adhesive layer 517, an insulating layer 576, and the resin layer 202.

The resin layers 201 and 202 are bonded to each other with the adhesive layer 517. Liquid crystal 563 is sealed in a region surrounded by the resin layer 201, the resin layer 202, and the adhesive layer 517. A polarizing plate 599 is positioned on an outer surface of the substrate 361.

The liquid crystal element 529 includes the electrode 311b, an electrode 562, and the liquid crystal 563. The electrode 311b functions as a pixel electrode. The electrode 562 functions as a common electrode. Alignment of the liquid crystal 563 can be controlled with an electric field generated between the electrode 311b and the electrode 562. The alignment film 564a is provided between the liquid crystal 563 and the electrode 311b. The alignment film 564b is provided between the liquid crystal 563 and the electrode 562.

The resin layer 202 is provided with the insulating layer 576, the electrode 562, the alignment film 564b, and the like.

The resin layer 201 is provided with the electrode 311b, the alignment film 564a, a transistor 501, a transistor 503, the capacitor 505, a connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as the source or the drain of the transistor 503 which is not electrically connected to the electrode 311b may function as part of a signal line. The conductive layer functioning as a gate of the transistor 503 may function as part of a scan line.

FIG. 12 illustrates an example of the circuit portion 366 in which the transistor 501 is provided.

A material inhibiting diffusion of impurities such as water and hydrogen is preferably used for at least one of the insulating layers 512 and 513 which cover the transistors.

The electrode 311b is provided over the insulating layer 514. The electrode 311b is electrically connected to one of the source and the drain of the transistor 503 through an opening formed in the insulating layer 514, the insulating layer 513, the insulating layer 512, and the like. The electrode 311b is electrically connected to one electrode of the capacitor 505.

Since the display panel 800 is a reflective liquid crystal display device, a conductive material that reflects visible light is used for the electrode 311b and a conductive material that transmits visible light is used for the electrode 562.

For example, a material containing one of indium (In), zinc (Zn), and tin (Sn) is preferably used for the conductive material that transmits visible light. Specific examples include indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium. Note that a film containing graphene can be used as well. The film containing graphene can be formed, for example, by reducing a film containing graphene oxide.

Examples of the conductive material that reflects visible light include aluminum, silver, and an alloy containing any of these metal materials. A metal material such as gold, platinum, nickel, tungsten, chromium, molybdenum, iron, cobalt, copper, or palladium, or an alloy containing any of these metal materials can also be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the liquid crystal element 529 are controlled depending on the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the electrode 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 12, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through a connection layer 519.

The above is the description of the display panel 800.

[Display Element]

As a display element included in a first pixel located on the display surface side, an element which performs display by reflecting external light can be used. Such an element does not include a light source and thus power consumption in display can be significantly reduced. As the display element included in the first pixel, a reflective liquid crystal element can be typically used. Alternatively, as the display element included in the first pixel, an element using a microcapsule method, an electrophoretic method, an electrowetting method, an Electronic Liquid Powder (registered trademark) method, or the like can be used, other than a micro electro mechanical systems (MEMS) shutter element or an optical interference type MEMS element.

As a display element included in a second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), or a quantum-dot light-emitting diode (QLED) can be used. Alternatively, a combination of a backlight that is a light source and a transmissive liquid crystal element that controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, guest-host liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a reflective liquid crystal element is used, a polarizing plate is provided on the display surface side. In addition, a light diffusion plate is preferably provided on the display surface side to improve visibility.

[Light-Emitting Element]

As the light-emitting element, a self-luminous element can be used, and an element whose luminance is controlled by current or voltage is included in the category of the light-emitting element. For example, an LED, a QLED, an organic EL element, or an inorganic EL element can be used; however, any of the light-emitting elements described in Embodiment 1 and Embodiment 2 is preferably used.

In this embodiment, in particular, the light-emitting element preferably has a top emission structure. A conductive film that transmits visible light is used as the electrode through which light is extracted. A conductive film that reflects visible light is preferably used as the electrode through which light is not extracted. The light-emitting element may be a single element including one EL layer or a tandem element in which a plurality of EL layers are stacked with a charge-generation layer positioned therebetween.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, the low-molecular compound, the high-molecular compound, or the inorganic compound described in Embodiment 1 can be used. Each of the layers included in the EL layer can be formed by any of the following methods: an evaporation method (including a vacuum evaporation method), a transfer method, a printing method, an inkjet method, a coating method, and the like.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material for a coloring layer that transmits light of a certain color and a film containing a material for a coloring layer that transmits light of another color can be employed. It is preferable that the coloring layer and the light-blocking layer be formed using the same material because the same manufacturing apparatus can be used and the process can be simplified.

The structure described in this embodiment can be combined as appropriate with any of the structures described in the other embodiments.

Embodiment 5

In this embodiment, electronic devices each including the light-emitting element described in Embodiment 1 and Embodiment 2 are described. The light-emitting element described in Embodiment 1 and Embodiment 2 includes the light-emitting element of one embodiment of the present invention and thus has high emission efficiency and high reliability; as a result, the electronic devices described in this embodiment can each include a display portion having reduced power consumption and high reliability.

<Display Module>

Figure 13A:
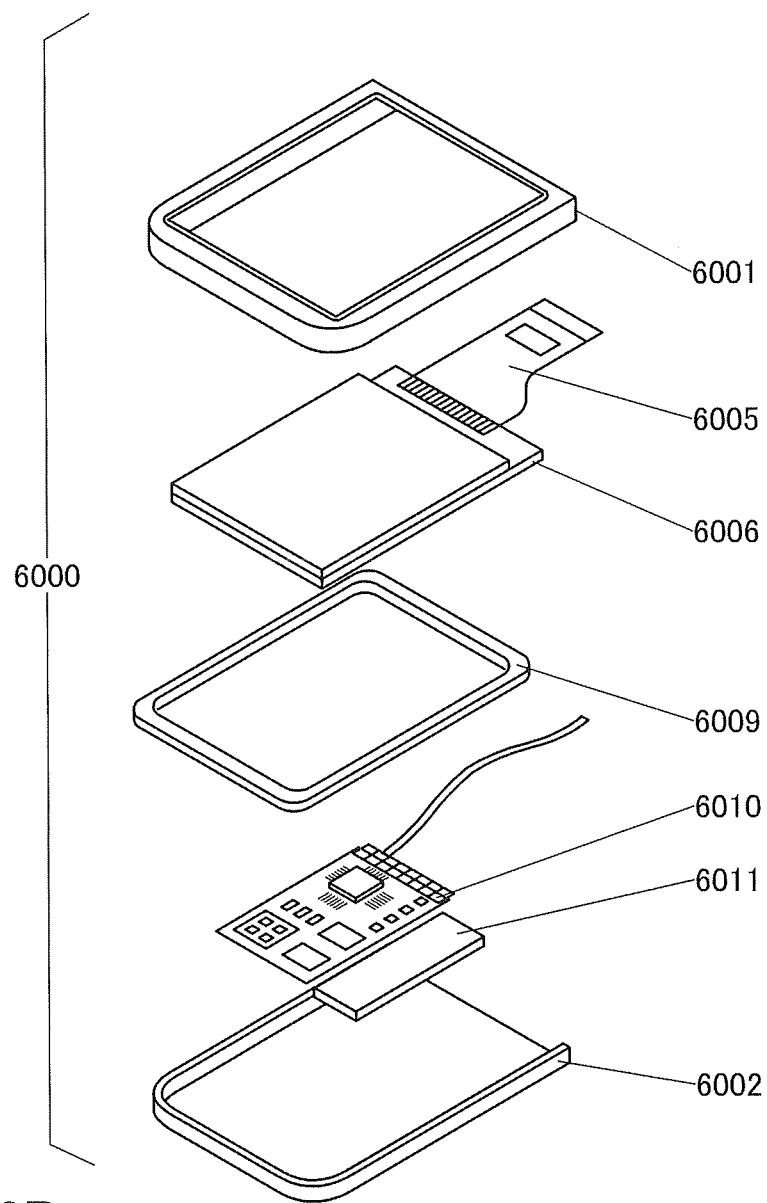
FIGS. 13A and 13B are schematic views illustrating an electronic device of one embodiment of the present invention.

In a display module 6000 illustrated in FIG. 13A, a display panel 6006 connected to an FPC 6005, a frame 6009, a printed circuit board 6010, and a battery 6011 are provided between an upper cover 6001 and a lower cover 6002.

For example, the above-described display device manufactured using one embodiment of the present invention can be used for the display panel 6006. Thus, the display module can be manufactured with high yield.

The shapes and sizes of the upper cover 6001 and the lower cover 6002 can be changed as appropriate in accordance with the sizes of the display panel 6006.

A touch panel may be provided so as to overlap with the display panel 6006. The touch panel can be a resistive touch panel or a capacitive touch panel and may be formed to overlap with the display panel 6006. Instead of providing the touch panel, the display panel 6006 can have a touch panel function.

The frame 6009 protects the display panel 6006 and also serves as an electromagnetic shield for blocking electromagnetic waves generated by the operation of the printed circuit board 6010. The frame 6009 may serve as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. The battery 6011 can be omitted in the case of using a commercial power source.

The display module 6000 can be additionally provided with a member such as a polarizing plate, a retardation plate, or a prism sheet.

Figure 13B:
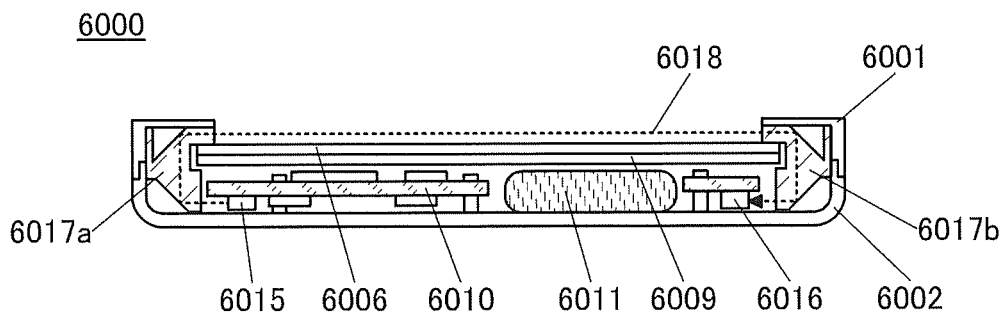

FIG. 13B is a cross-sectional schematic view of the display module 6000 including an optical touch sensor.

The display module 6000 includes a light-emitting portion 6015 and a light-receiving portion 6016 provided on the printed circuit board 6010. A pair of light guide portions (a light guide portion 6017a and a light guide portion 6017b) is provided in a region surrounded by the upper cover 6001 and the lower cover 6002.

A plastic can be used for the upper cover 6001 and the lower cover 6002, for example. The upper cover 6001 and the lower cover 6002 can each be thin (e.g., more than or equal to 0.5 mm and less than or equal to 5 mm). In that case, the display module 6000 can be significantly lightweight. In addition, the upper cover 6001 and the lower cover 6002 can be manufactured with a small amount of material, and therefore, manufacturing cost can be reduced.

The display panel 6006 overlaps with the printed circuit board 6010 and the battery 6011 with the frame 6009 located therebetween. The display panel 6006 and the frame 6009 are fixed to the light guide portion 6017a and the light guide portion 6017b.

Light 6018 emitted from the light-emitting portion 6015 travels over the display panel 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display panel 6006, for example. A plurality of light-receiving portions 6016 are provided to face the light-emitting portions 6015 with the display panel 6006 therebetween. Accordingly, information about the position of touch operation can be obtained.

As the light-emitting portion 6015, a light source such as an LED element can be used. It is particularly preferable to use a light source that emits infrared light, which is not visually recognized by users and is harmless to users, as the light-emitting portion 6015.

As the light-receiving portion 6016, a photoelectric element that receives light emitted by the light-emitting portion 6015 and converts it into an electrical signal can be used. A photodiode that can receive infrared light can be suitably used.

For the light guide portions 6017a and 6017b, members that transmit at least the light 6018 can be used. With the use of the light guide portions 6017a and 6017b, the light-emitting portion 6015 and the light-receiving portion 6016 can be placed under the display panel 6006, and a malfunction of the touch sensor due to external light reaching the light-receiving portion 6016 can be suppressed. It is particularly preferable to use a resin that absorbs visible light and transmits infrared light. This is more effective in suppressing the malfunction of the touch sensor.

One embodiment of the present invention can be used at least for the display panel 6006.

<Electronic Device>

FIGS. 14A to 14G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 14A to 14G can have a variety of functions. The electronic devices illustrated in FIGS. 14A to 14G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 14A to 14G are not limited to those described above, and the electronic devices can have a variety of functions. Although not illustrated in FIGS. 14A to 14G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 14A to 14G are described in detail below.

Figure 14A:
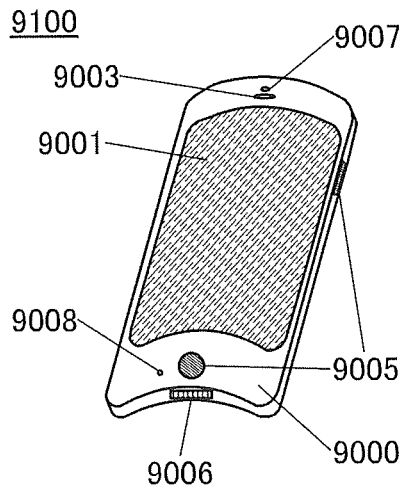
FIGS. 14A to 14G are diagrams illustrating electronic devices of one embodiment of the present invention.

FIG. 14A is a perspective view of a portable information terminal 9100. The display portion 9001 of the portable information terminal 9100 is flexible. Therefore, the display portion 9001 can be incorporated along a curved surface of a curved housing 9000. In addition, the display portion 9001 includes a touch sensor, and operation can be performed by touching the screen with a finger, a stylus, or the like. For example, when an icon displayed on the display portion 9001 is touched, an application can be started.

Figure 14D:
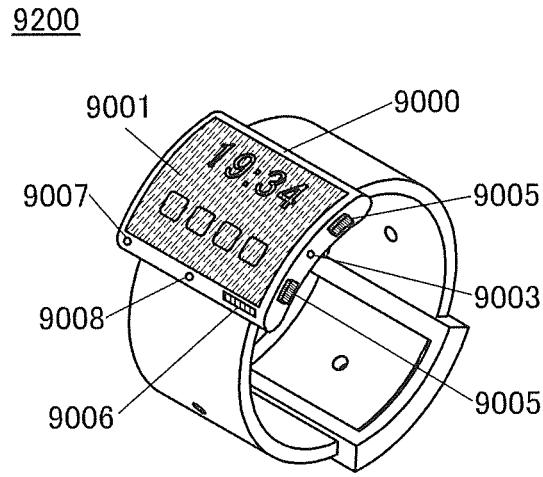
Figure 14B:
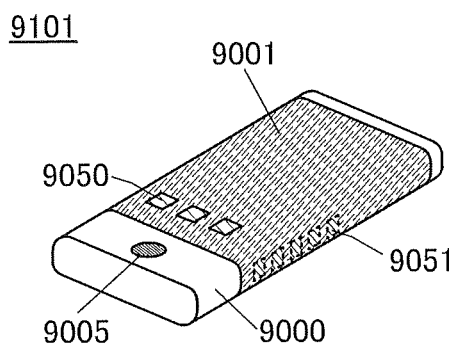

FIG. 14B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 14B, can be positioned in the portable information terminal 9101 as in the portable information terminal 9100 shown in FIG. 14A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, a plastic, or a ceramic can be used. As a plastic, a reinforced plastic can also be used. A carbon fiber reinforced plastic (CFRP), which is a kind of reinforced plastic, has advantages of lightweight and corrosion-free. Other examples of reinforced plastics include one including glass fiber and one including aramid fiber. Alloy is preferable because fiber has higher possibility of separation from resin by high impact than alloy. The alloy includes aluminum alloy and magnesium alloy. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is molded in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 14E:
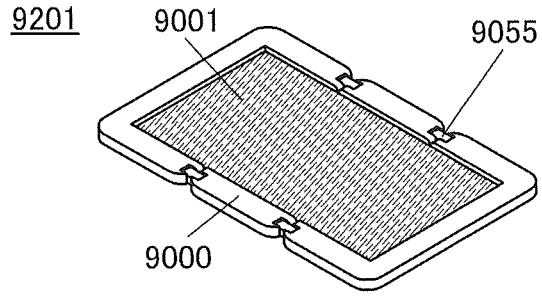
Figure 14C:
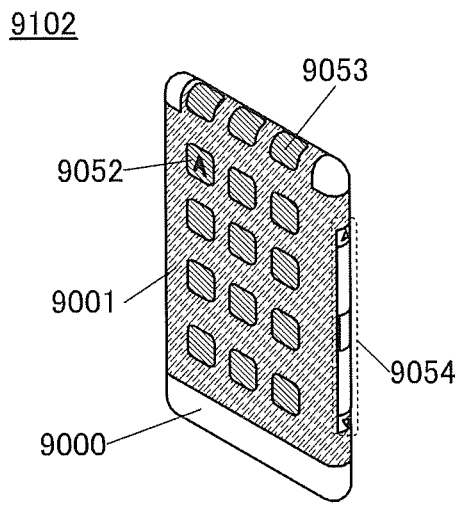

FIG. 14C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 14D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication that is a communication method based on an existing communication standard. In that case, for example, mutual communication between the portable information terminal and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 14F:
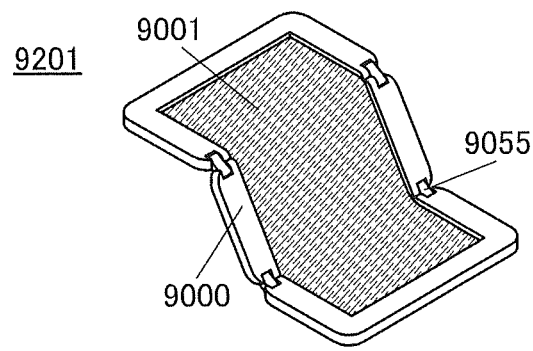
Figure 14G:
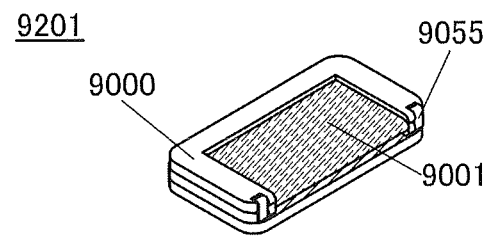

FIGS. 14E, 14F, and 14G are perspective views of a foldable portable information terminal 9201. FIG. 14E is a perspective view illustrating the portable information terminal 9201 that is opened. FIG. 14F is a perspective view illustrating the portable information terminal 9201 that is being opened or being folded. FIG. 14G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 15A:
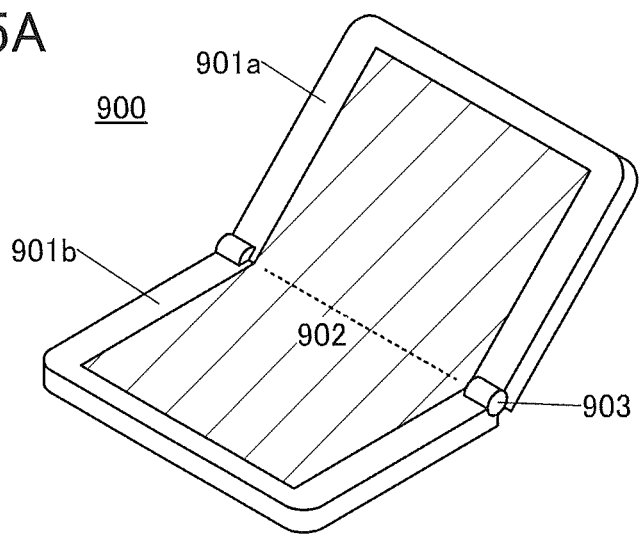
FIGS. 15A to 15C are diagrams each illustrating an electronic device of one embodiment of the present invention.
Figure 15B:
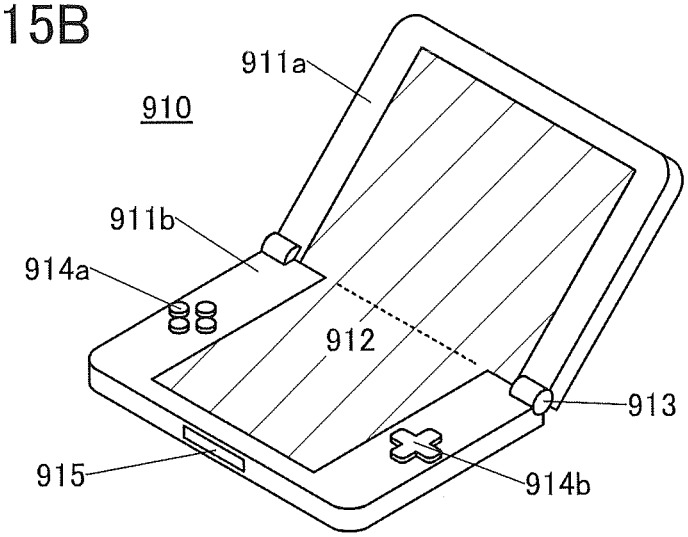
Figure 15C:
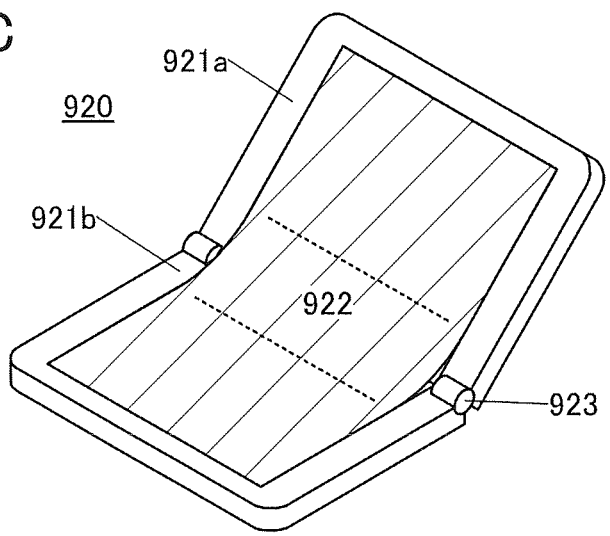

FIGS. 15A to 15C illustrate foldable electronic devices.

An electronic device 900 illustrated in FIG. 15A includes a housing 901a, a housing 901b, a hinge 903, a display portion 902, and the like. The display portion 902 is incorporated into the housing 901a and the housing 901b.

The housing 901a and the housing 901b are rotatably joined to each other by the hinge 903. The electronic device 900 can be changed in shape between a state where the housing 901a and the housing 901b are closed and a state where they are opened as shown in FIG. 15A. Thus, the electronic device has high portability when carried and excels in visibility when used because of its large display region.

The hinge 903 preferably includes a locking mechanism so that an angle between the housing 901a and the housing 901b does not become larger than a predetermined angle when the housing 901a and the housing 901b are opened. For example, an angle at which they become locked (they are not opened any further) is preferably greater than or equal to 90° and less than 180° and can be typically 90°, 120°, 135°, 150°, 175°, or the like. In that case, the convenience, safety, and reliability can be improved.

The display portion 902 functions as a touch panel and can be controlled with a finger, a stylus, or the like.

One of the housing 901a and the housing 901b is provided with a wireless communication module, and data can be transmitted and received through a computer network such as the Internet, a local area network (LAN), or Wi-Fi (registered trademark).

The display portion 902 is preferably formed using one flexible display, in which case an image can be displayed continuously between the housing 901a and the housing 901b. Note that each of the housings 901a and 901b may be provided with a display.

FIG. 15B illustrates an electronic device 910 that functions as a portable game console. The electronic device 910 includes a housing 911a, a housing 911b, a display portion 912, a hinge 913, an operation button 914a, an operation button 914b, and the like.

A cartridge 915 can be inserted into the housing 911b. The cartridge 915 stores application software such as a game, for example, and a variety of applications can be executed on the electronic device 910 by replacing the cartridge 915.

FIG. 15B shows an example in which the size of a portion of the display portion 912 overlapping with the housing 911a is different from the size of a portion of the display portion 912 overlapping with the housing 911b. Specifically, part of the display portion 912 of the housing 911a is larger than part of the display portion 912 overlapping with the housing 911b where the operation buttons 914a and 914b are provided. For example, the display portions can be used for different purposes by performing display using the display portion 912 on the housing 911a side as a main screen and on the housing 911b side as an operation screen.

In an electronic device 920 illustrated in FIG. 15C, a flexible display portion 922 is provided across a housing 921a and a housing 921b which are joined to each other by a hinge 923.

FIG. 15C shows an embodiment in which the display portion 922 is opened with a large curvature with the housing 921a and the housing 921b exposed. For example, the display portion 922 is held with a curvature radius of 1 mm or greater and 50 mm or less, preferably 5 mm or greater and 30 mm or less. Part of the display portion 922 can display an image while being bent display since pixels are continuously arranged from the housing 921a to the housing 921b.

Since the hinge 923 includes the above-described locking mechanism, excessive force is not applied to the display portion 922; thus, breakage of the display portion 922 can be prevented. Consequently, a highly reliable electronic device can be obtained.

Figure 16A:
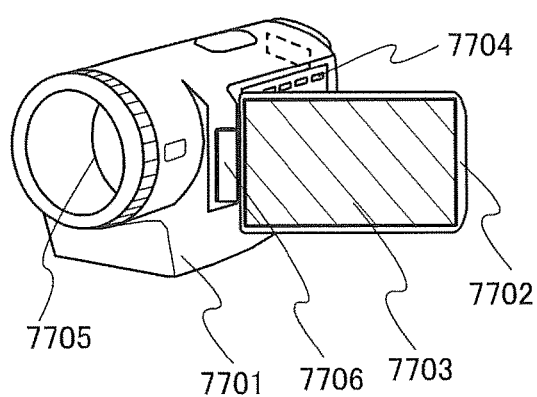
FIGS. 16A to 16E are diagrams each illustrating an electronic device of one embodiment of the present invention.

FIG. 16A illustrates a video camera including a housing 7701, a housing 7702, a display portion 7703, operation keys 7704, a lens 7705, a joint 7706, and the like. The operation keys 7704 and the lens 7705 are provided for the housing 7701, and the display portion 7703 is provided for the housing 7702. The housing 7701 and the housing 7702 are connected to each other with the joint 7706, and the angle between the housing 7701 and the housing 7702 can be changed with the joint 7706. Images displayed on the display portion 7703 may be switched in accordance with the angle at the joint 7706 between the housing 7701 and the housing 7702.

Figure 16B:
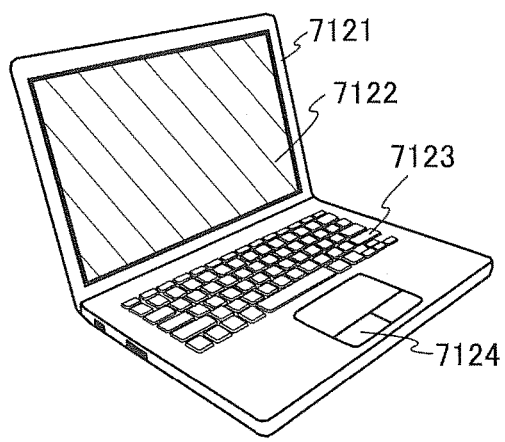

FIG. 16B illustrates a notebook personal computer including a housing 7121, a display portion 7122, a keyboard 7123, a pointing device 7124, and the like. Note that the display portion 7122 is small- or medium-sized but can perform 8k display because it has greatly high pixel density and high resolution; therefore, a significantly clear image can be obtained.

Figure 16C:
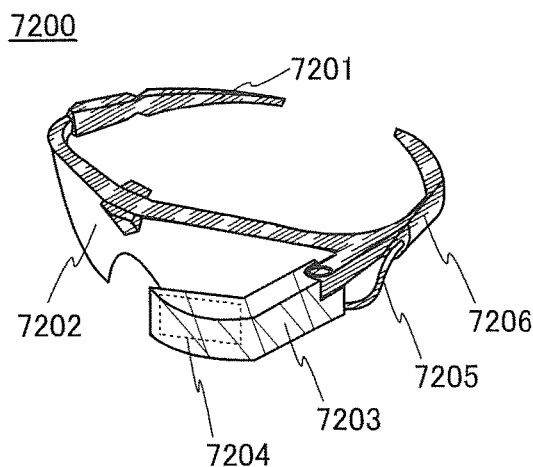

FIG. 16C is an external view of a head-mounted display 7200.

The head-mounted display 7200 includes a mounting portion 7201, a lens 7202, a main body 7203, a display portion 7204, a cable 7205, and the like. The mounting portion 7201 includes a battery 7206.

Power is supplied from the battery 7206 to the main body 7203 through the cable 7205. The main body 7203 includes a wireless receiver or the like to receive video data, such as image data, and display it on the display portion 7204. The movement of the eyeball and the eyelid of a user is captured by a camera in the main body 7203 and then coordinates of the points the user looks at are calculated using the captured data to utilize the eye point of the user as an input means.

The mounting portion 7201 may include a plurality of electrodes so as to be in contact with the user. The main body 7203 may have a function of sensing current flowing through the electrodes with the movement of the user's eyeball to recognize the direction of his or her eyes. The main body 7203 may have a function of sensing current flowing through the electrodes to monitor the user's pulse. The mounting portion 7201 may include sensors, such as a temperature sensor, a pressure sensor, or an acceleration sensor, so that the user's biological information can be displayed on the display portion 7204. The main body 7203 may sense the movement of the user's head or the like to move an image displayed on the display portion 7204 in synchronization with the movement of the user's head or the like.

Figure 16D:
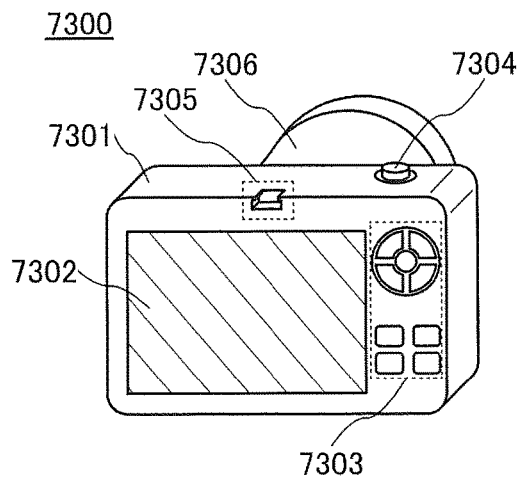

FIG. 16D is an external view of a camera 7300. The camera 7300 includes a housing 7301, a display portion 7302, an operation button 7303, a shutter button 7304, a connection portion 7305, and the like. A lens 7306 can be put on the camera 7300.

The connection portion 7305 includes an electrode to connect with a finder 7400, which is described below, a stroboscope, or the like.

Although the lens 7306 of the camera 7300 here is detachable from the housing 7301 for replacement, the lens 7306 may be included in the housing 7301.

Images can be taken at the touch of the shutter button 7304. In addition, images can be taken by operation of the display portion 7302 including a touch sensor.

In the display portion 7302, the display device of one embodiment of the present invention or a touch sensor can be used.

Figure 16E:
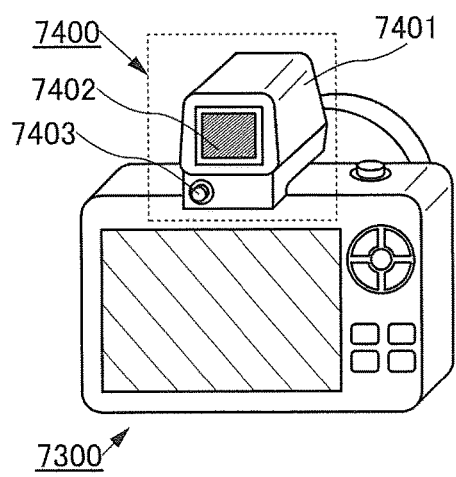

FIG. 16E illustrates the camera 7300 with the finder 7400 connected.

The finder 7400 includes a housing 7401, a display portion 7402, a button 7403, and the like.

The housing 7401 includes a connection portion for engagement with the connection portion 7305 of the camera 7300 so that the finder 7400 can be connected to the camera 7300. The connection portion includes an electrode, and an image or the like received from the camera 7300 through the electrode can be displayed on the display portion 7402.

The button 7403 functions as a power supply button. With the button 7403, on/off of display on the display portion 7402 can be switched.

Although the camera 7300 and the finder 7400 are separate and detachable electronic devices in FIGS. 16D and 16E, the housing 7301 of the camera 7300 may include a finder having a display device of one embodiment of the present invention or a touch sensor.

FIGS. 17A to 17E are external views of a head-mounted display 7500 and a head-mounted display 7510.

The head-mounted display 7500 includes a housing 7501, two display portions 7502, an operation button 7503, and a fixing band 7504.

The head-mounted display 7500 has the functions of the above-described head-mounted display 7200 and further includes two display portions.

With the two display portions 7502, the user can see one display portion with one eye and the other display portion with the other eye. Thus, a high-resolution image can be displayed even when three-dimensional display using parallax or the like is performed. The display portion 7502 is curved around an arc with the user's eye as an approximate center. Thus, distances between the user's eye and the display surface of the display portion are uniform; thus, the user can see a more natural image. Even when the luminance or chromaticity of light from the display portion is changed depending on the angle at which the user see it, since the user's eye is positioned in the normal direction of the display surface of the display portion, the influence of the change can be substantially ignorable and thus a more realistic image can be displayed.

The operation button 7503 serves as a power button or the like. A button other than the operation button 7503 may be included.

The head-mounted display 7510 includes the housing 7501, the display portion 7502, the fixing bands 7504, and the pair of lenses 7505.

The user can view display on the display portion 7502 through the lenses 7505. It is favorable that the display portion 7502 be curved. The curved display portion 7502 gives the user a high realistic sensation.

Figure 17A:
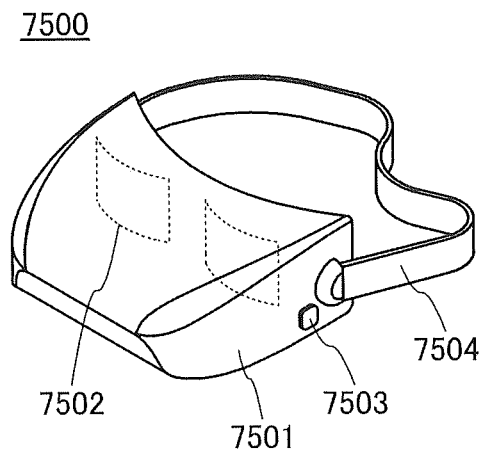
FIGS. 17A to 17E are diagrams illustrating an electronic device of one embodiment of the present invention.
Figure 17B:
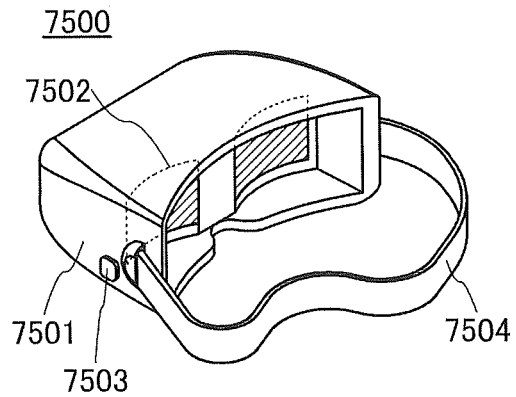
Figure 17C:
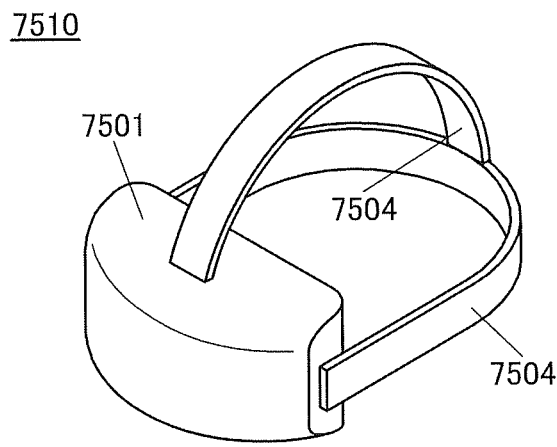
Figure 17D:
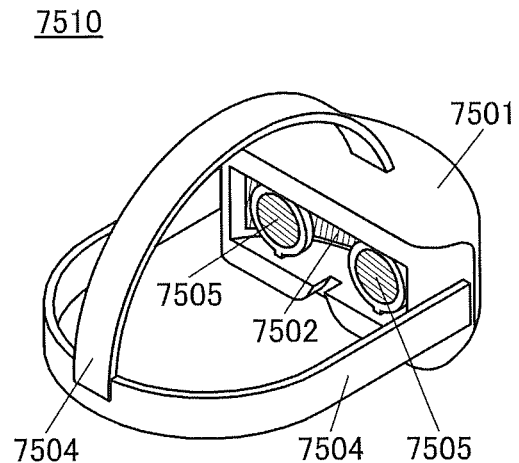
Figure 17E:
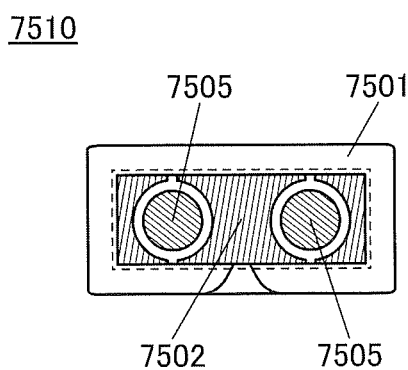

The display device of one embodiment of the present invention can be used in the display portion 7502. The display device of one embodiment of the present invention can have a high resolution; thus, even when an image is magnified using the lenses 7505 as illustrated in FIG. 17E, the user does not perceive pixels, and thus a more realistic image can be displayed.

Figure 18A:
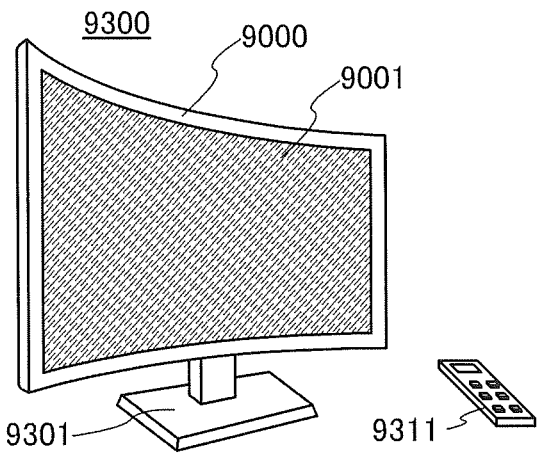
FIGS. 18A to 18D are diagrams illustrating electronic devices of one embodiment of the present invention.

FIG. 18A illustrates an example of a television set. In a television set 9300, the display portion 9001 is incorporated into the housing 9000. Here, the housing 9000 is supported by a stand 9301.

The television set 9300 illustrated in FIG. 18A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

The electronic device or the lighting device of one embodiment of the present invention has flexibility and therefore can be incorporated along a curved inside/outside wall surface of a house or a building or a curved interior/exterior surface of a car.

Figure 18B:
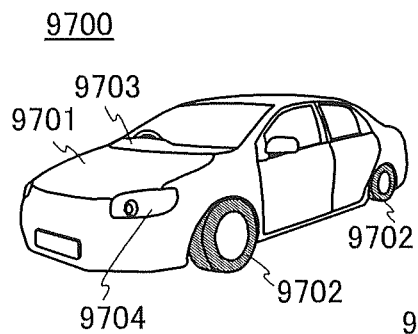
Figure 18C:
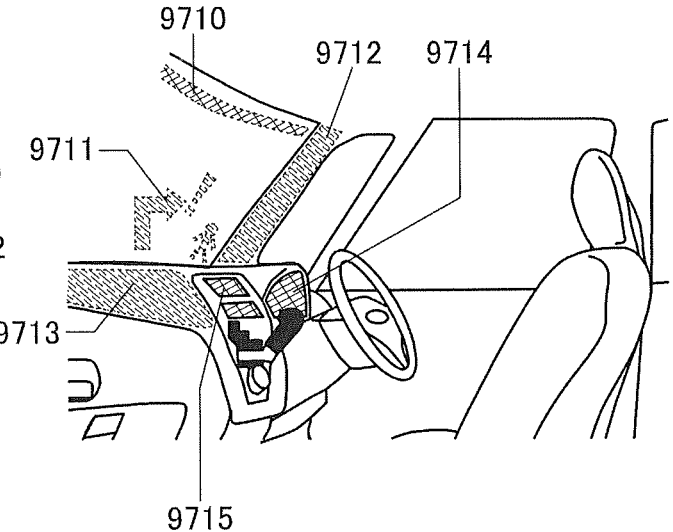

FIG. 18B is an external view of an automobile 9700. FIG. 18C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 18C.

The display portion 9710 and the display portion 9711 are display devices provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 18D:
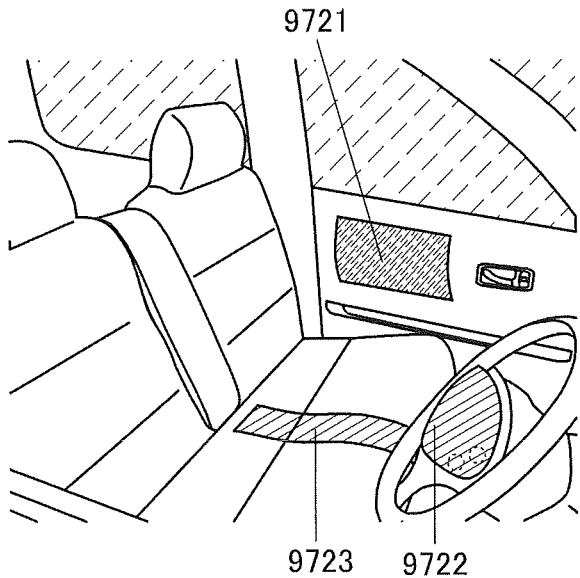

FIG. 18D illustrates the inside of a car in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 19A:
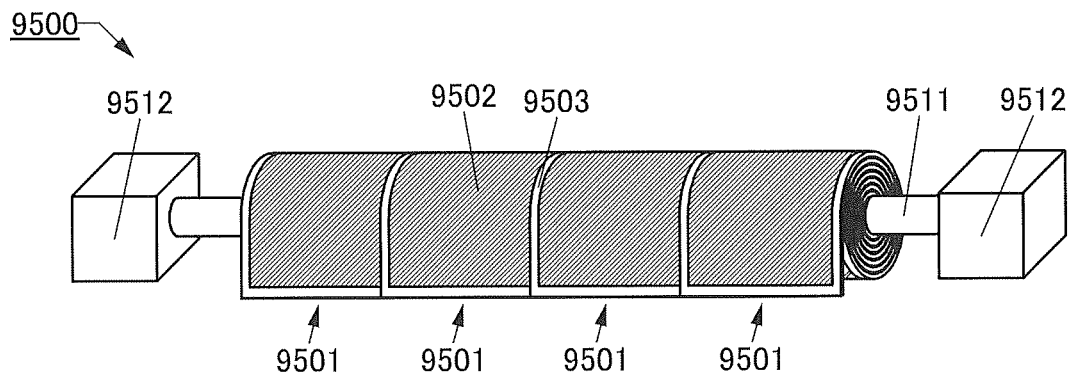
FIGS. 19A and 19B are diagrams illustrating an electronic device of one embodiment of the present invention.
Figure 19B:
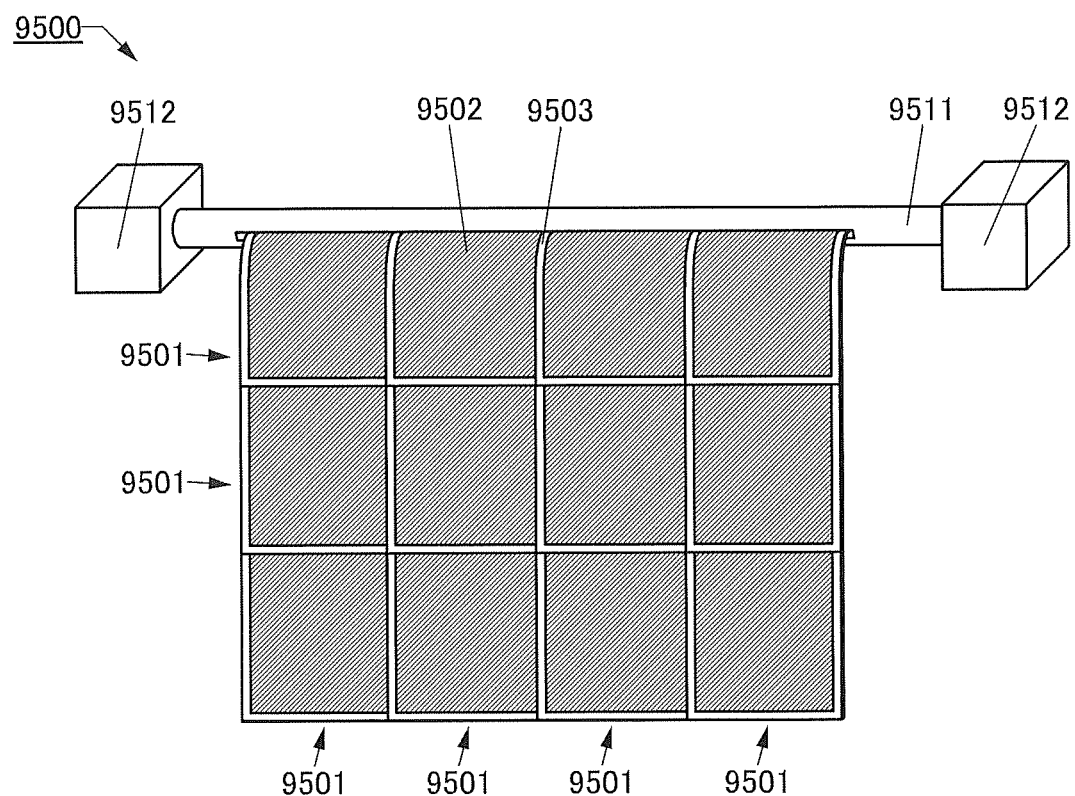

The display device 9500 illustrated in FIGS. 19A and 19B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 19A and 19B, without limitation to this structure, the display regions 9502 of the adjacent display panels 9501 may overlap with each other without any space so that a continuous display region 9502 is obtained, for example.

Electronic devices described in this embodiment has a display portion for displaying some sort of information. Note that the light-emitting element of one embodiment of the present invention can also be used for an electronic device that does not have a display portion. The structure in which the display portion of the electronic device described in this embodiment is flexible and display can be performed on the curved display surface or the structure in which the display portion of the electronic device is foldable is described as an example; however, the structure is not limited thereto and a structure in which the display portion of the electronic device is not flexible and display is performed on a flat portion may be employed.

The structure described in this embodiment can be used in appropriate combination with any of the structures described in the other embodiments.

Embodiment 6

In this embodiment, light-emitting devices each including a light-emitting element of one embodiment of the present invention are described with reference to FIGS. 20A to 20C and FIGS. 21A to 21D.

<Light-Emitting Device>

Figure 20A:
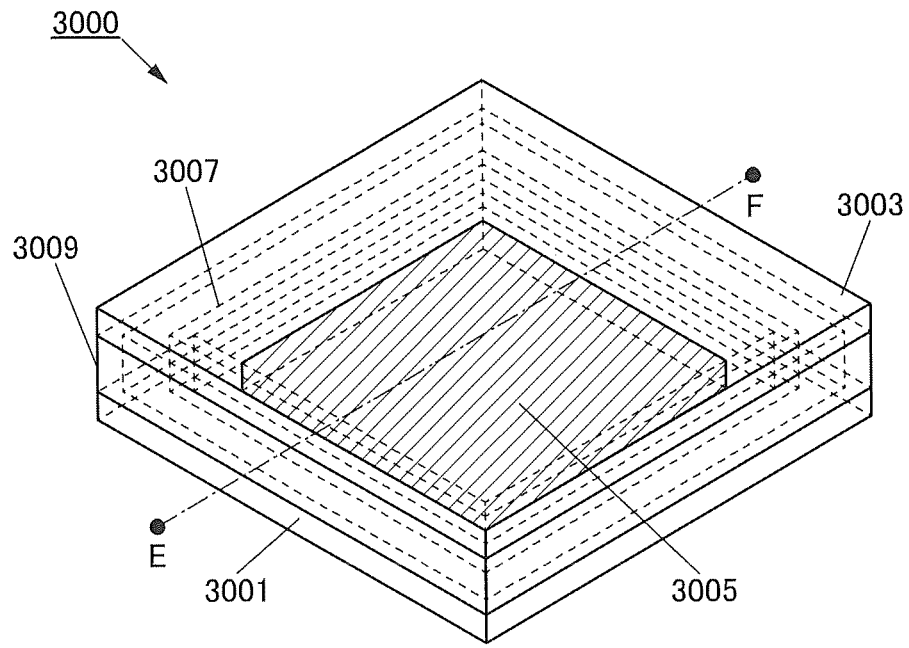
FIGS. 20A to 20C are diagrams illustrating a lighting device of one embodiment of the present invention.
Figure 20B:
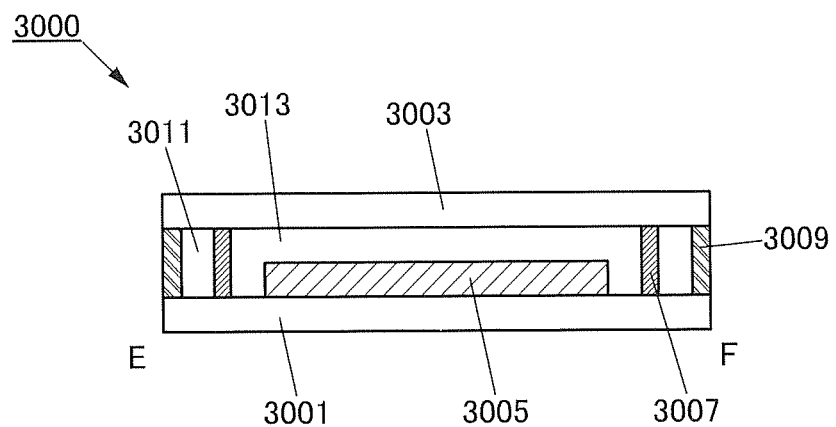

FIG. 20A is a perspective view of a light-emitting device 3000 shown in this embodiment, and FIG. 20B is a cross-sectional view along dashed-dotted line E-F in FIG. 20A. Note that in FIG. 20A, some components are illustrated by broken lines in order to avoid complexity of the drawing.

The light-emitting device 3000 illustrated in FIGS. 20A and 20B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 20A and 20B, a structure in which light is emitted from the light-emitting element 3005 to the lower side (the substrate 3001 side) is illustrated.

As illustrated in FIGS. 20A and 20B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 20B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited thereto, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon or aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 20B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 20C:
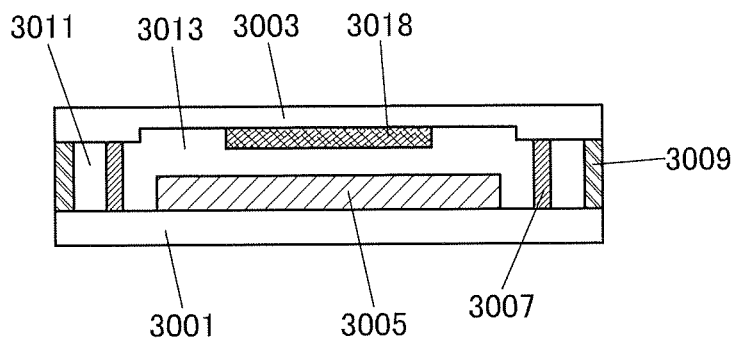

FIG. 20C illustrates a modification example of the structure in FIG. 20B. FIG. 20C is a cross-sectional view illustrating the modification example of the light-emitting device 3000.

FIG. 20C illustrates a structure in which a desiccant 3018 is provided in a recessed portion provided in part of the substrate 3003. The other components are the same as those of the structure illustrated in FIG. 20B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxides (e.g., calcium oxide, barium oxide, and the like), sulfate, metal halides, perchlorate, zeolite, silica gel, and the like.

Next, modification examples of the light-emitting device 3000 which is illustrated in FIG. 20B are described with reference to FIGS. 21A to 21D. Note that FIGS. 21A to 21D are cross-sectional views illustrating the modification examples of the light-emitting device 3000 illustrated in FIG. 20B.

In each of the light-emitting devices illustrated in FIGS. 21A to 21D, the second sealing region 3009 is not provided but only the first sealing region 3007 is provided. Moreover, in each of the light-emitting devices illustrated in FIGS. 21A to 21D, a region 3014 is provided instead of the second region 3013 illustrated in FIG. 20B.

For the region 3014, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

When the above-described material is used for the region 3014, what is called a solid-sealing light-emitting device can be obtained.

Figure 21A:
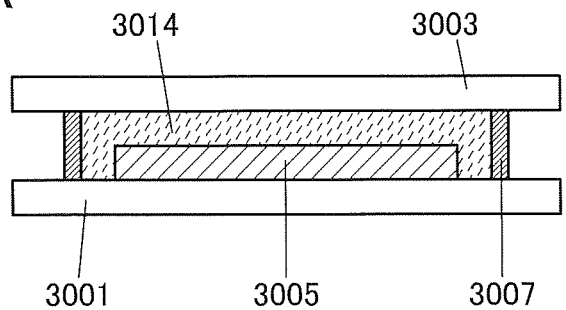
FIGS. 21A to 21D are diagrams each illustrating a lighting device of one embodiment of the present invention.
Figure 21B:
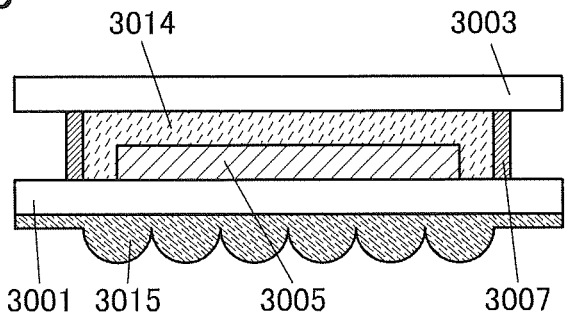

In the light-emitting device illustrated in FIG. 21B, a substrate 3015 is provided on the substrate 3001 side of the light-emitting device illustrated in FIG. 21A.

The substrate 3015 has unevenness as illustrated in FIG. 21B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 21B, a substrate having a function as a diffusion plate may be provided.

Figure 21C:
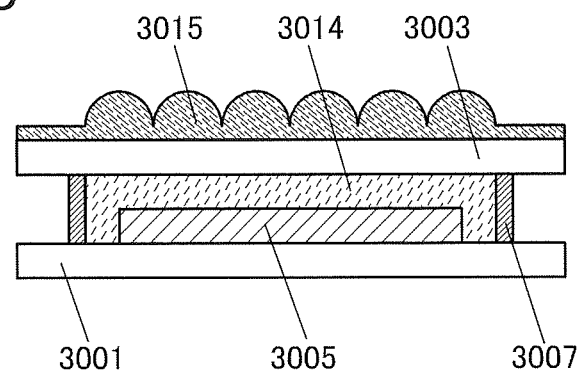

In the light-emitting device illustrated in FIG. 21C, light is extracted through the substrate 3003 side, unlike in the light-emitting device illustrated in FIG. 21A, in which light is extracted through the substrate 3001 side.

The light-emitting device illustrated in FIG. 21C includes the substrate 3015 on the substrate 3003 side. The other components are the same as those of the light-emitting device illustrated in FIG. 21B.

Figure 21D:
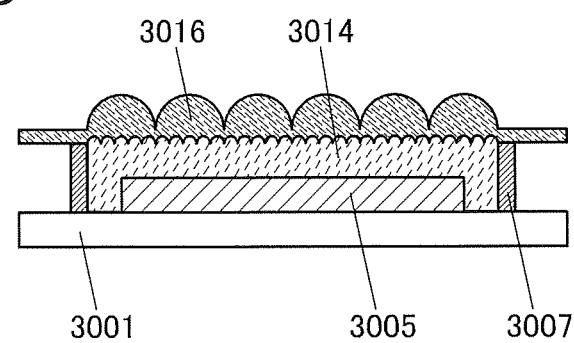

In the light-emitting device illustrated in FIG. 21D, the substrate 3003 and the substrate 3015 included in the light-emitting device illustrated in FIG. 21C are not provided but a substrate 3016 is provided.

The substrate 3016 includes first unevenness positioned closer to the light-emitting element 3005 and second unevenness positioned farther from the light-emitting element 3005. With the structure illustrated in FIG. 21D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 7

In this embodiment, examples in which the light-emitting element of one embodiment of the present invention is used for various lighting devices and electronic devices are described with reference to FIGS. 22A to 22C and FIG. 23.

An electronic device or a lighting device that has a light-emitting region with a curved surface can be obtained with use of the light-emitting element of one embodiment of the present invention which is manufactured over a substrate having flexibility.

Furthermore, a light-emitting device to which the light-emitting element of one embodiment of the present invention is applied can also be used for lighting for motor vehicles, examples of which are lighting for a dashboard, a windshield, a ceiling, and the like.

Figure 22A:
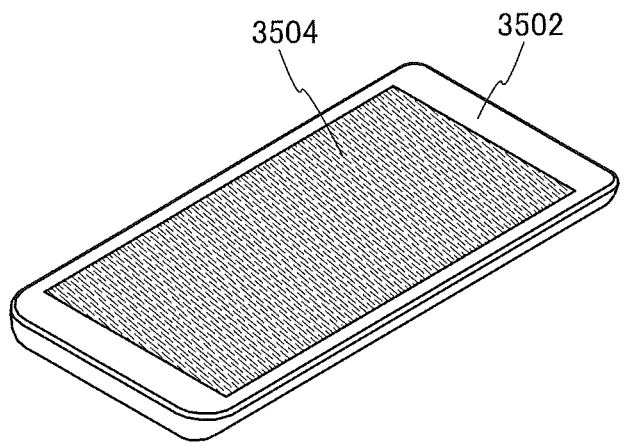
FIGS. 22A to 22C are diagrams illustrating lighting devices of one embodiment of the present invention.
Figure 22B:
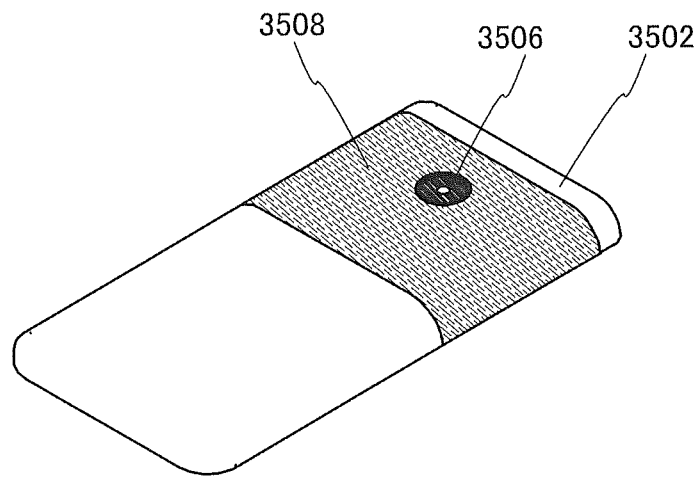

FIG. 22A is a perspective view illustrating one surface of a multifunction terminal 3500, and FIG. 22B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 22A and 22B can have a variety of functions as in the electronic devices illustrated in FIGS. 14A to 14G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 22C:
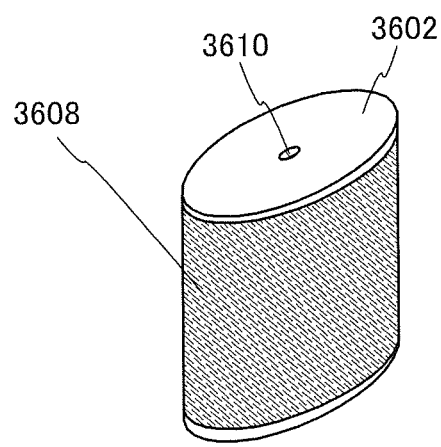

FIG. 22C is a perspective view of a security light 3600. The security light 3600 includes lighting 3608 on the outside of the housing 3602, and a speaker 3610 and the like are incorporated in the housing 3602. The light-emitting element of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 23:
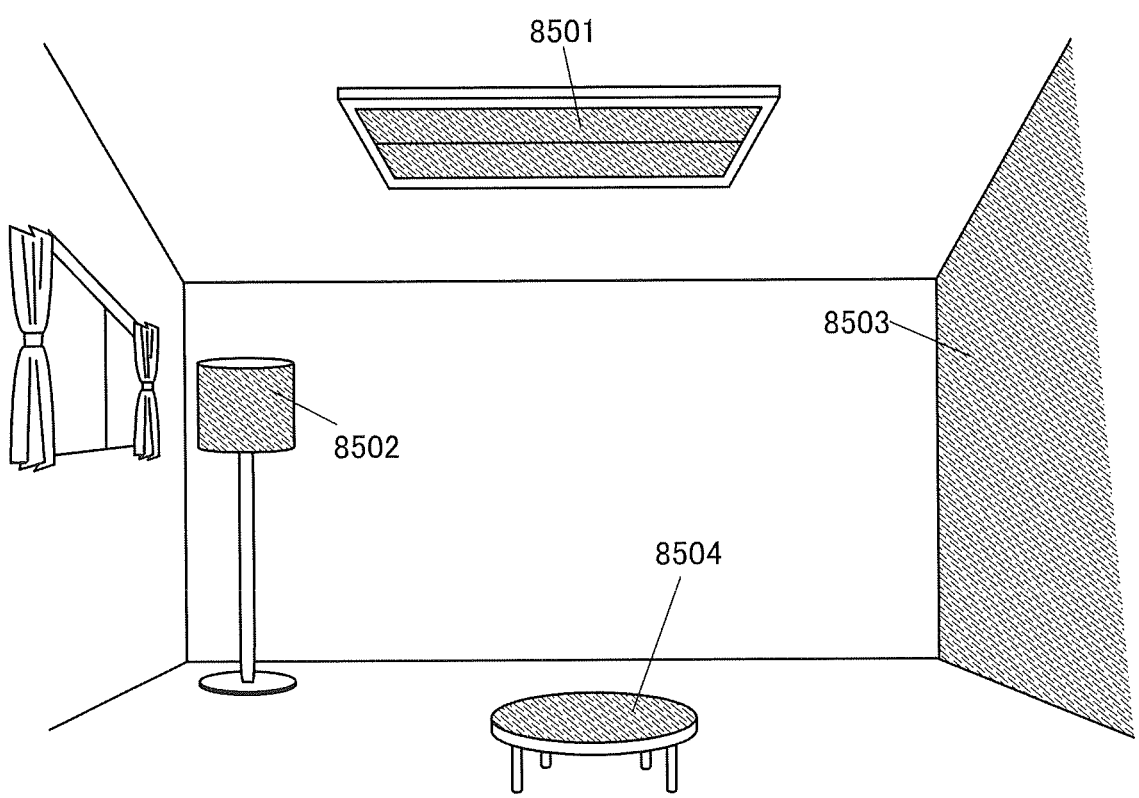
FIG. 23 is a diagram illustrating lighting devices of one embodiment of the present invention.

FIG. 23 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

The structure described in this embodiment can be combined with any of the structures described in the other embodiments as appropriate.

Example 1

In this example, a method for synthesizing 3,5-bis[3-(9H-2-methylcarbazol-9-yl)phenyl]pyridine (abbreviation: Me-35DCzPPy) (Structural Formula (100)), which is one of organic compounds of one embodiment of the present invention, and the physical properties of the compound are described.

Synthesis Example 1

To a 200 mL three-neck flask were added 1.5 g (6.4 mmol) of 3,5-dibromopyridine, 4.3 g (14 mmol) of 3-(2-methyl-9H-carbazol-9-yl)phenylboronic acid, 0.39 g (1.3 mmol) of tri(o-tolyl)phosphine, 3.5 g (26 mmol) of potassium carbonate, 60 mL of toluene, 12 mL of ethanol, and 6.0 mL of water. The mixture was degassed by being stirred under reduced pressure, and the air in the flask was replaced with nitrogen. To this mixture was added 58 mg (0.26 mmol) of palladium(II) acetate, and the resulting mixture was stirred at 80° C. for 44 hours under a nitrogen stream. After a certain period of time, extraction was performed with toluene, and purification was performed by silica gel column chromatography (developing solvent: toluene) to give a yellow powder. This yellow powder was recrystallized with ethyl acetate to give 2.0 g of an objective white powder in a yield of 54%. The synthesis scheme is shown in (A-1) below.

[Chemical Formula 6]

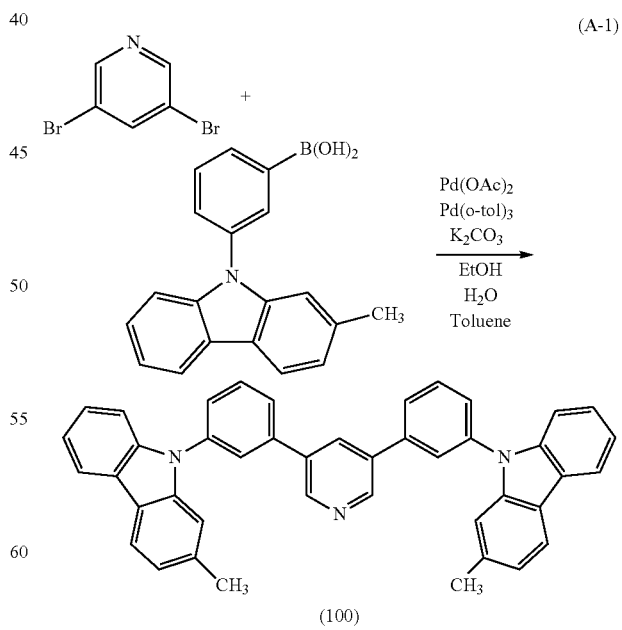

By a train sublimation method, 2.0 g of the obtained white powder was purified by sublimation. In the purification by sublimation, heating was performed at 310° C. under the conditions where the pressure was 2.2 Pa and the argon flow rate was 10 mL/min. After the purification by sublimation, 1.2 g of an objective white solid was obtained at a collection rate of 60%.

The obtained solid was subjected to nuclear magnetic resonance spectrometry ($^1$H NMR), and the results are shown below.

$^1$H NMR (chloroform-d, 300 MHz): δ=8.94 (d, J=2.0 Hz, 2H), 8.14 (t, J=1.9 Hz, 1H), 8.08-8.12 (m, 2H), 8.02 (d, J=7.8 Hz, 2H), 7.83-7.86 (m, 2H), 7.72-7.77 (m, 4H), 7.60-7.67 (m, 2H), 7.33-7.44 (m, 4H), 7.27-7.31 (m, 2H), 7.20-7.24 (m, 2H), 7.10-7.14 (m, 2H).

Figure 24A:
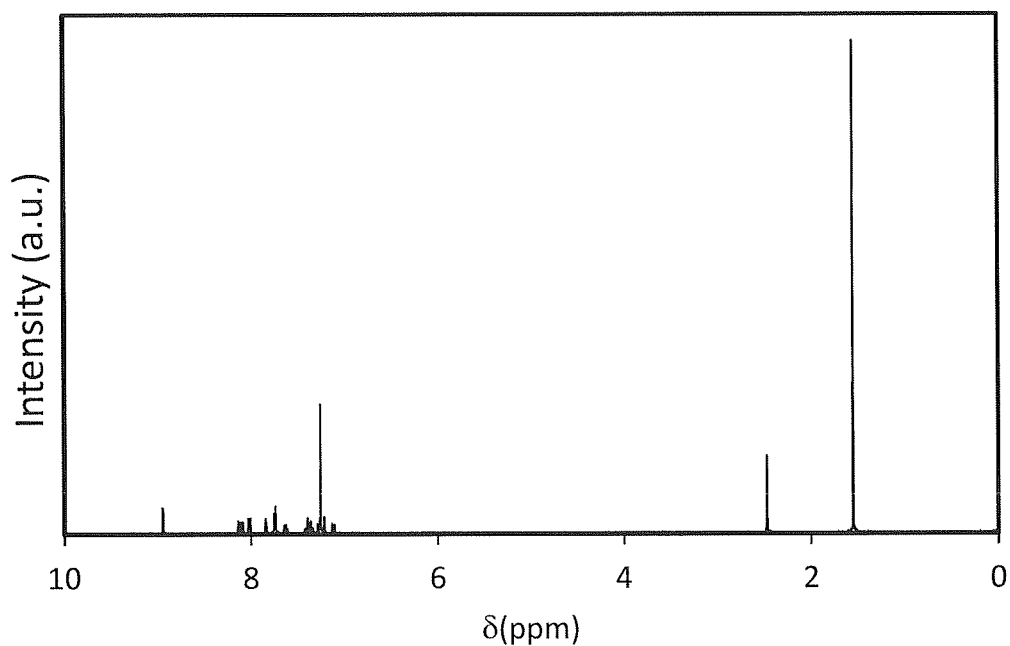
FIGS. 24A and 24B show NMR charts of a compound in Example.
Figure 24B:
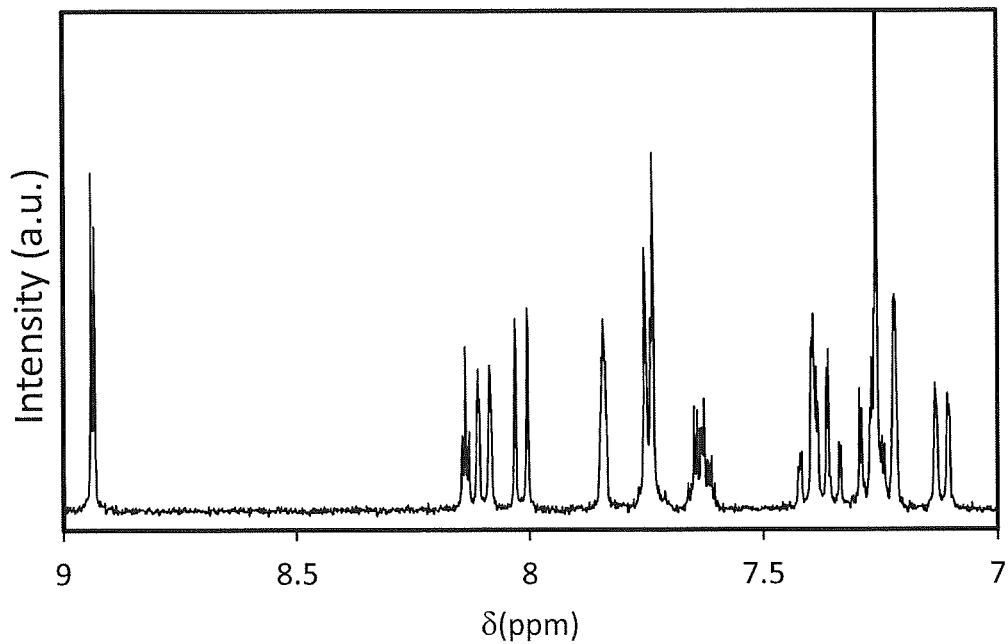

FIGS. 24A and 24B are $^1$H NMR charts of the obtained solid. Note that FIG. 24B is a chart showing an enlarged part in the range of 7.0 ppm to 9.0 ppm of FIG. 24A. The measurement results indicate that the objective substance, Me-35DCzPPy was obtained.

<Characteristics of Me-35DCzPPy>

Next, Me-35DCzPPy obtained in this example was analyzed by liquid chromatography mass spectrometry (LC/MS).

In the analysis by LC-MS, liquid chromatography (LC) separation was carried out with ACQUITY UPLC (manufactured by Waters Corporation) and mass spectrometry (MS) analysis was carried out with Xevo G2 Tof MS (manufactured by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Me-35DCzPPy was dissolved in toluene at a given concentration and the mixture was diluted with acetonitrile. The injection amount was 5.0 L.

In the LC separation, a gradient method in which the composition of mobile phases is changed was employed. The ratio of Mobile Phase A to Mobile Phase B was 65:35 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (abbreviation: ESI) method. At this time, the capillary voltage and the sample cone voltage were set to 3.0 kV and 30 V, respectively, and detection was performed in a positive mode. A component that underwent the ionization under the above-described conditions was collided with an argon gas in a collision cell to dissociate into product ions. Energy (collision energy) for the collision with argon was 70 eV. The mass range for the measurement was m/z=100 to 1200. The detection result of the dissociated product ions by time-of-flight (TOF) MS are shown in FIG. 25.

Figure 25:
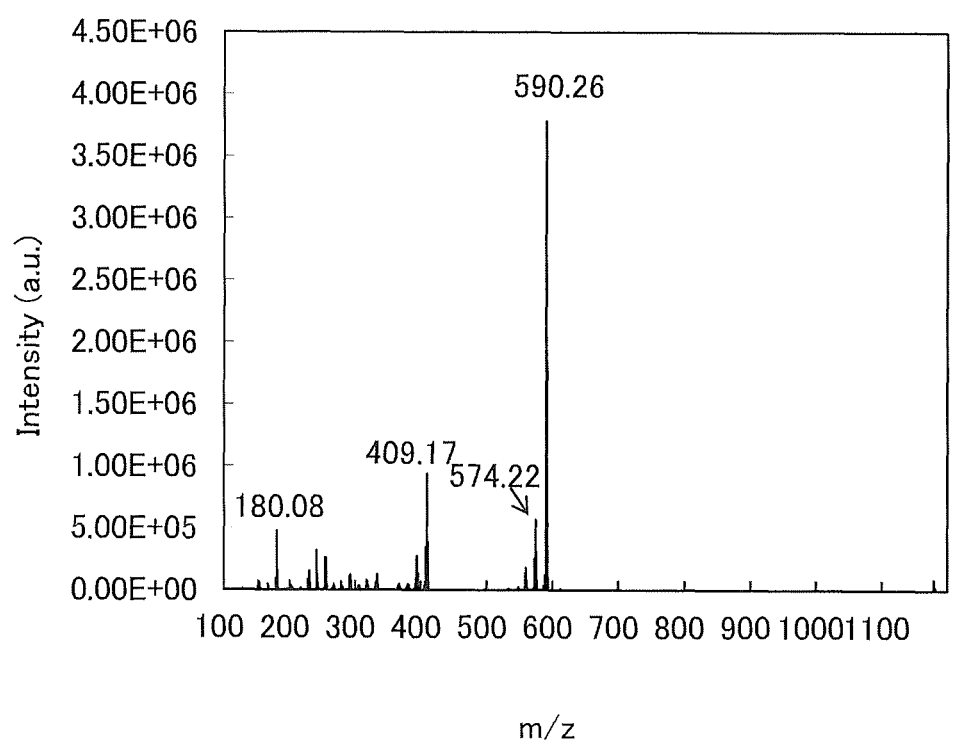
FIG. 25 shows an MS spectrum in Example.

Results in FIG. 25 shows that product ions of Me-35DCzPPy are mainly detected around m/z=574, m/z=409, and m/z=180. The results in FIG. 25 show characteristics derived from Me-35DCzPPy and therefore can be regarded as important data for identifying Me-35DCzPPy contained in a mixture.

Note that it can be presumed that the product ion around m/z=574 is a radical cation in a state where a methyl group is eliminated from Me-35DCzPPy and which is represented by C42H28N3$^+$ ($^+$ represents a radical cation). It can be presumed that the product ion around m/z=409 is a radical cation in a state where 2-methylcarbazole is eliminated from Me-35DCzPPy and which is represented by C30H21N2$^+$. It can be presumed that the product ion around m/z=180 is a radical cation derived from 2-methylcarbazole in Me-35DCzPPy and which is represented by C13H10N$^+$. This indicates that Me-35DCzPPy includes a 2-methylcarbazole skeleton. Note that there is a possibility that the above m/z values ±1 are detected as protonation or deprotonation products of the product ions.

Figure 26:
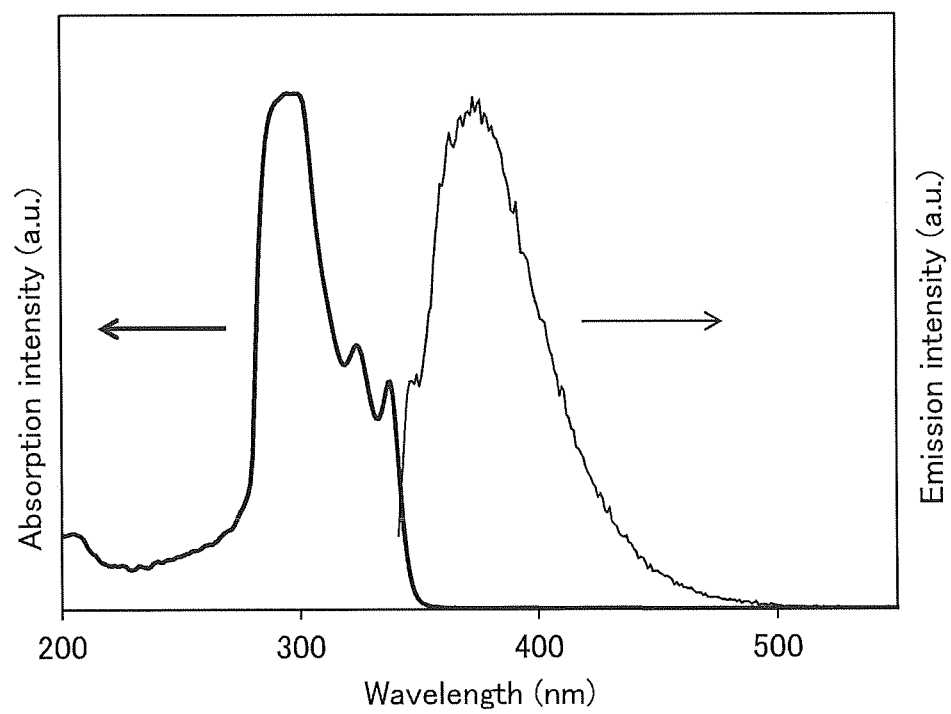
FIG. 26 shows absorption and emission spectra of a compound in Example.
Figure 27:
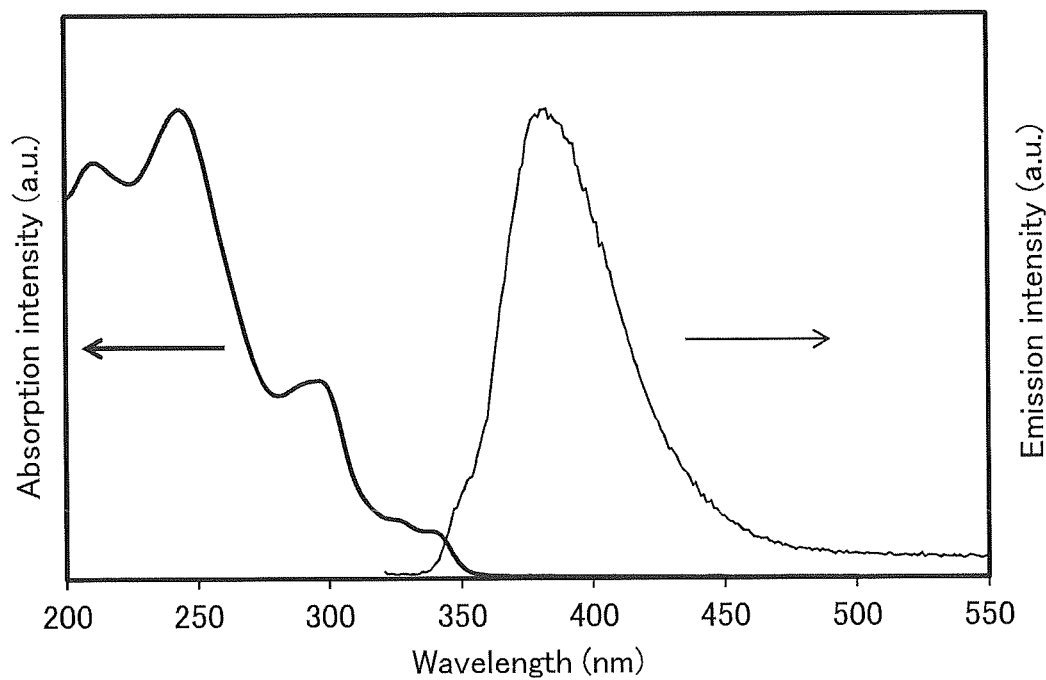
FIG. 27 shows absorption and emission spectra of a compound in Example.

Next, FIG. 26 shows an absorption spectrum and an emission spectrum of Me-35DCzPPy in a toluene solution. FIG. 27 shows an absorption spectrum and an emission spectrum of a thin film of Me-35DCzPPy. The solid thin film was formed over a quartz substrate by a vacuum evaporation method. The absorption spectrum of the toluene solution was measured using an ultraviolet-visible light spectrophotometer (V550 type manufactured by JASCO Corporation). The absorption spectrum of Me-35DCzPPy in the toluene solution shown in FIG. 26 was obtained by subtracting an absorption spectrum of only toluene put in a quartz cell from the absorption spectrum of Me-35DCzPPy in the toluene solution in a quartz cell. The absorption spectrum of the thin film was measured with a spectrophotometer (U-4100 Spectrophotometer, manufactured by Hitachi High-Technologies Corporation). The emission spectra were measured using a fluorescence spectrophotometer (FS920 manufactured by Hamamatsu Photonics K.K.).

As shown in FIG. 26, Me-35DCzPPy in the toluene solution has absorption peaks at around 323 nm and 338 nm, and an emission wavelength peak at 373 nm (excitation wavelength: 333 nm). As shown in FIG. 27, the thin film of Me-35DCzPPy has absorption peaks at around 210 nm, 243 nm, 295 nm, 326 nm, and 338 nm, and emission wavelength peaks at around 350 nm and 382 nm (excitation wavelength: 300 nm). Thus, Me-35DCzPPy which is one embodiment of the present invention emits light and thus can also be used as a light-emitting material.

The phosphorescence spectrum of the thin film of Me-35DCzPPy was measured and the T1 level thereof was calculated. The measurement was performed by using a PL microscope, LabRAM HR-PL, produced by HORIBA, Ltd., a He—Cd laser (325 nm) as excitation light, and a CCD detector at a measurement temperature of 10 K. The first peak of this phosphorescence on the short wavelength side was 451 nm (2.75 eV). This indicates that Me-35DCzPPy has a high T1 level and is suitable as a host for an emission center substance emitting blue phosphorescence.

Example 2

Figure 28:
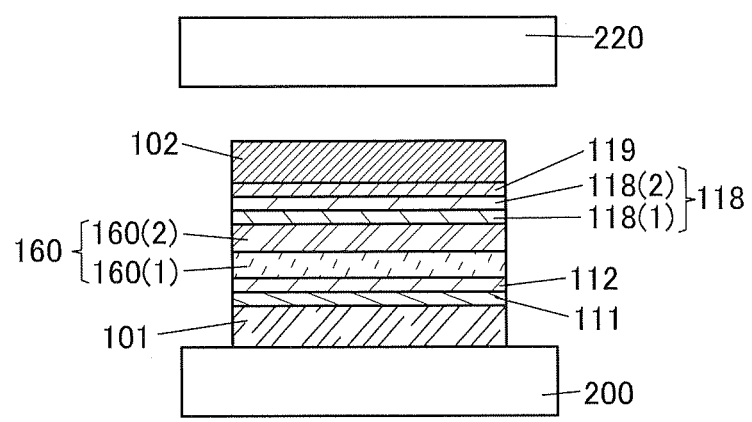
FIG. 28 is a schematic view illustrating a light-emitting element in Example.

In this example, fabrication examples of light-emitting elements each including the organic compound of one embodiment of the present invention and characteristics of the light-emitting elements are described. FIG. 28 is a cross-sectional view illustrating a structure of each element fabricated in this example. Table 2 and Table 3 show the detailed structures of the elements. In addition, structures and abbreviations of compounds used here are given below. Note that Example 1 and Embodiment 1 can be referred to for other organic compounds.

In this example, Light-emitting elements 1 to 6 were fabricated. In Light-emitting element 1, only 35DCzPPy was used as a host material in a light-emitting layer and as an electron-transport layer. In each of Light-emitting elements 2 to 6, both 35DCzPPy and Me-35DCzPPy were used as evaporation sources of a host material in a light-emitting layer and a material for an electron-transport layer. Table 2 and Table 3 show the mixture ratio of 35DCzPPy and Me-35DCzPPy in each element.

Table 4 shows physical property values of 35DCzPPy and Me-35DCzPPy which were used as a host material and a material for the electron-transport layer. The only difference in the physical property value between 35DCzPPy and Me-35DCzPPy is a small difference in the HOMO level.

[Chemical Formula 7]

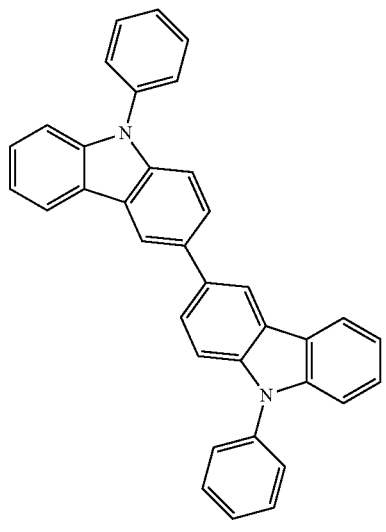

(PCCP)

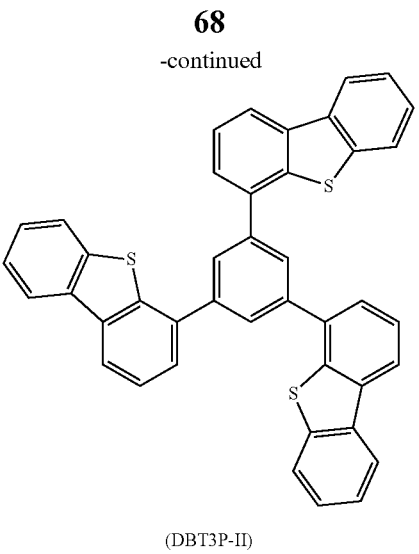

(DBT3P-II)

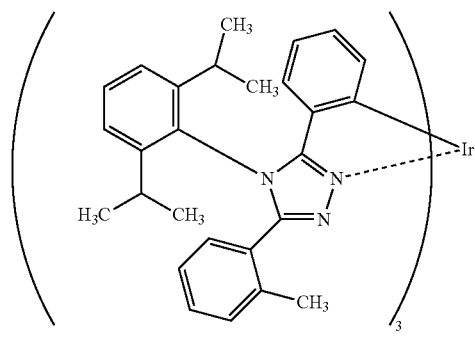

(Ir(mpptz-diPrp)$_3$)

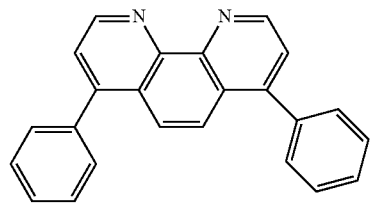

(BPhen)

TABLE 2

| | Layer | Reference | Thickness (nm) | Material | Weight ratio |
|---|---|---|---|---|---|
| Light-emitting elements 1-6 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy:Me-35DCzPPy | (1 − x):x |
| | Light-emitting layer | 160(2) | 10 | 35DCzPPy:Me-35DCzPPy:Ir(mpptz-diPrp)$_3$ | (1 − x):x:0.06 |
| | | 160(1) | 30 | PCCP:35DCzPPy:Me-35DCzPPy:Ir(mpptz-diPrp)$_3$ | 1:0.3 × (1 − x):0.3x:0.06 |
| | Hole-transport layer | 112 | 20 | PCCP | — |
| | Hole-injection layer | 111 | 20 | DBT3P-II:MoO$_3$ | 1:0.5 |
| | Electrode | 101 | 70 | ITSO | — |

TABLE 3

| | x |
|---|---|
| Light-emitting element 1 | 0 |
| Light-emitting element 2 | 0.025 |
| Light-emitting element 3 | 0.05 |
| Light-emitting element 4 | 0.1 |
| Light-emitting element 5 | 0.25 |
| Light-emitting element 6 | 1 |

TABLE 4

| Name of material | HOMO level (eV) | LUMO level (eV) | T1 level (eV) |
|---|---|---|---|
| 35DCzPPy | −5.90 | −2.39 | 2.75 |
| Me-35DCzPPy | −5.84 | −2.39 | 2.75 |

<Fabrication of Light-Emitting Elements>
<<Fabrication of Light-Emitting Elements 1 to 6>>

As the electrode 101, an ITSO film was formed to a thickness of 70 nm over a glass substrate. The electrode area of the electrode 101 was set to 4 mm² (2 mm×2 mm).

Next, as the hole-injection layer 111, 1,3,5-tri(dibenzothiophen-4-yl)benzene (abbreviation: DBT3P-II) and MoO$_3$ were deposited over the electrode 101 by co-evaporation in a weight ratio of DBT3P-II: MoO$_3$=1:0.5 to a thickness of 20 nm.

Next, as the hole-transport layer 112, 9-phenyl-9H-3-(9-phenyl-9H-carbazol-3-yl)carbazole (abbreviation: PCCP) was deposited over the hole-injection layer 111 by evaporation to a thickness of 20 nm.

Next, as a light-emitting layer 160(1), PCCP, 35DCzPPy, Me-35DCzPPy, and tris {2-[5-(2-methylphenyl)-4-(2,6-diisopropylphenyl)-4H-1,2,4-triazol-3-yl-κN²]phenyl-κC}iridium(III) (abbreviation: Ir(mpptz-diPrp)$_3$) were deposited over the hole-transport layer 112 by co-evaporation in a weight ratio of PCCP:35DCzPPy:Me-35DCzPPy:Ir(mpptz-diPrp)$_3$=1:0.3×(1−x):0.3x:0.06 to a thickness of 30 nm, and successively, as a light-emitting layer 160(2), 35DCzPPy, Me-35DCzPPy, and Ir(mpptz-diPrp)$_3$ were deposited by co-evaporation in a weight ratio of 35DCzPPy: Me-35DCzPPy: Ir(mpptz-diPrp)$_3$=1−x: x: 0.06 to a thickness of 10 nm. Note that in each of the light-emitting layers 160(1) and 160(2), Ir(mpptz-diPrp)$_3$ is a guest material that emits phosphorescence. Note that the value x depends on the light-emitting element, and Table 3 shows the value x in each light-emitting element.

Next, as a first electron-transport layer 118(1), 35DCzPPy and Me-35DCzPPy were deposited over the light-emitting layer 160(2) by co-evaporation in a weight ratio of 35DCzPPy: Me-35DCzPPy=1−x: x to a thickness of 10 nm. Then, as a second electron-transport layer 118(2), bathophenanthroline (abbreviation: BPhen) was deposited over the first electron-transport layer 118(1) by evaporation to a thickness of 15 nm. Note that the value x depends on each light-emitting element, and Table 3 shows the value x in each light-emitting element.

Then, as the electron-injection layer 119, lithium fluoride (LiF) was deposited over the second electron-transport layer 118(2) by evaporation to a thickness of 1 nm.

Next, as the electrode 102, aluminum (Al) was deposited over the electron-injection layer 119 to a thickness of 200 nm.

Next, in a glove box containing a nitrogen atmosphere, Light-emitting elements 1 to 6 were sealed by fixing a glass substrate for sealing to a glass substrate on which the organic material was deposited with a sealant for an organic EL device. Specifically, after the sealant was applied to surround the organic materials deposited on the glass substrate on which the organic materials were deposited and this substrate and a glass substrate for sealing were bonded to each other, irradiation with ultraviolet light having a wavelength of 365 nm at 6 J/cm² and heat treatment were performed at 80° C. for one hour. Through the above steps, Light-emitting elements 1 to 6 were obtained.

<Characteristics of Light-Emitting Elements>

Next, the characteristics of the fabricated Light-emitting elements 1 to 6 were measured. For measuring the luminance and the CIE chromaticity, a luminance colorimeter (BM-5A manufactured by TOPCON TECHNOHOUSE CORPORATION) was used. For measuring the electroluminescence spectrum, a multi-channel spectrometer (PMA-11 manufactured by Hamamatsu Photonics K.K.) was used.

Figure 29:
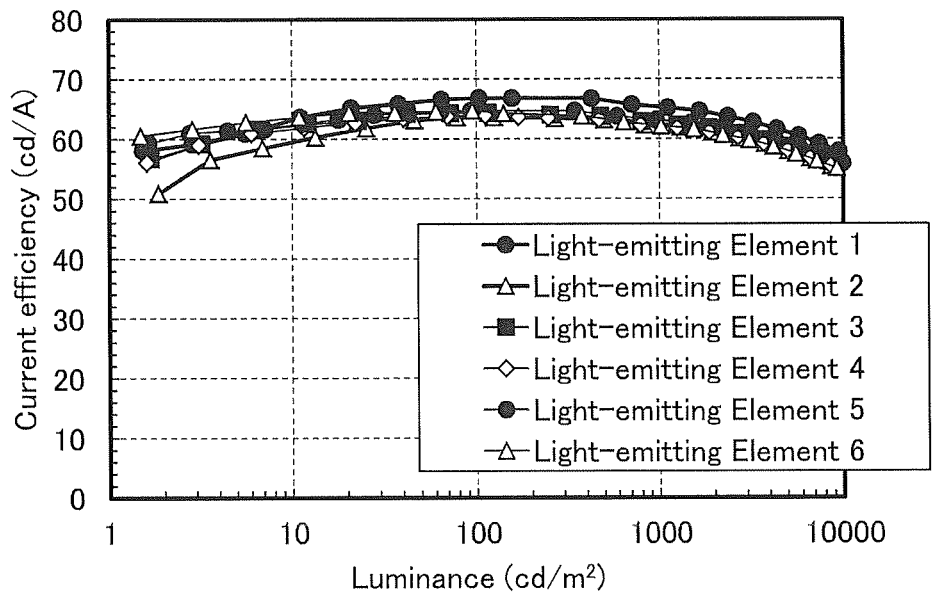
FIG. 29 shows current efficiency-luminance characteristics of light-emitting elements in Example.
Figure 30:
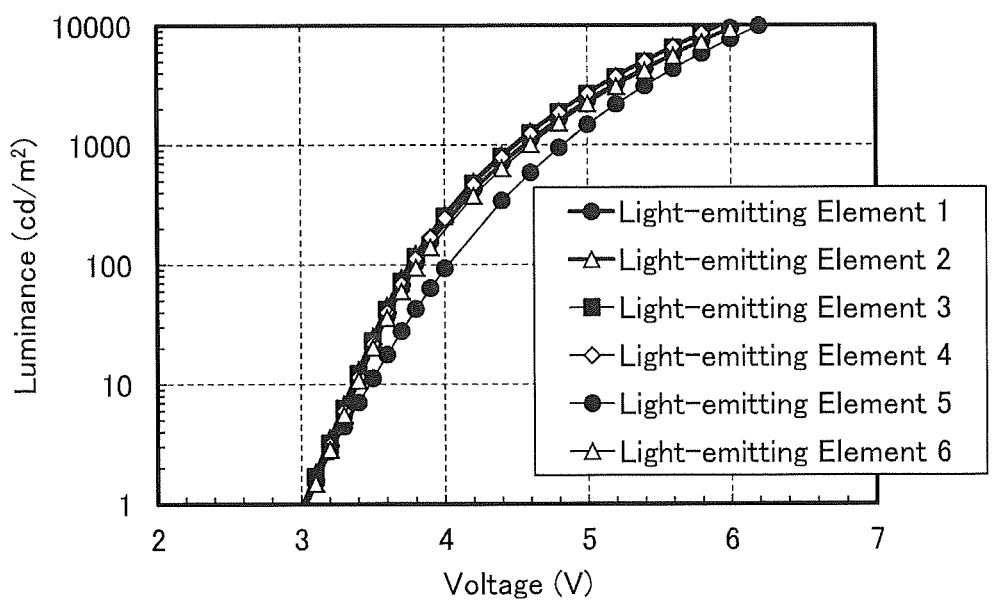
FIG. 30 shows luminance-voltage characteristics of light-emitting elements in Example.
Figure 31:
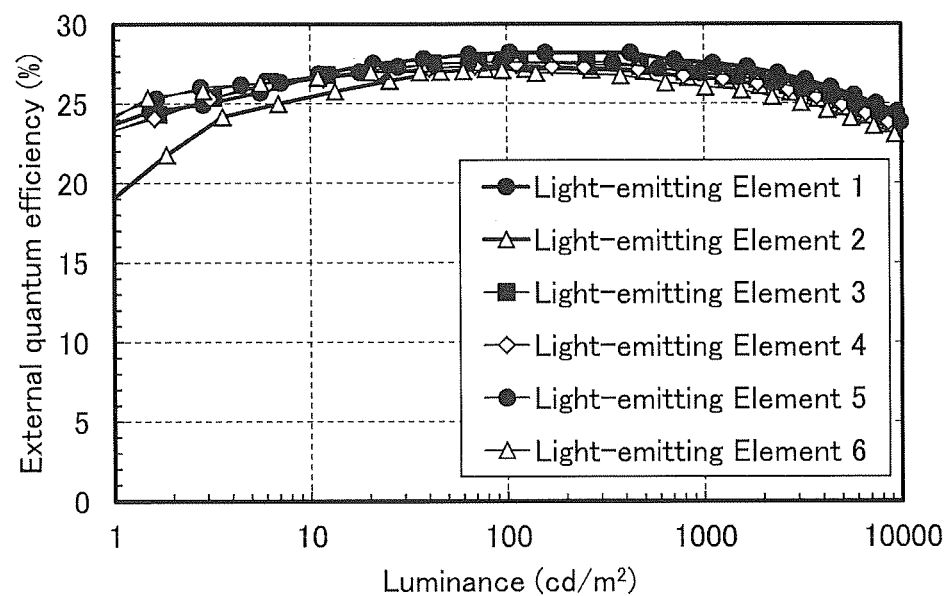
FIG. 31 shows external quantum efficiency-luminance characteristics of light-emitting elements in Example.

FIG. 29 shows current efficiency-luminance characteristics of Light-emitting elements 1 to 6. The luminance-voltage characteristics are shown in FIG. 30. The external quantum efficiency-luminance characteristics are shown in FIG. 31. The measurements of the light-emitting elements were performed at room temperature (in an atmosphere kept at 23° C.).

Table 5 shows element characteristics of Light-emitting Elements 1 to 6 at around 1000 cd/m².

TABLE 5

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Light-emitting element 1 | 4.60 | 1.71 | (0.184, 0.423) | 1120 | 65.2 | 44.6 | 27.5 |
| Light-emitting element 2 | 4.40 | 1.33 | (0.182, 0.415) | 830 | 62.3 | 44.5 | 26.7 |
| Light-emitting element 3 | 4.40 | 1.33 | (0.182, 0.415) | 830 | 62.3 | 44.5 | 26.7 |
| Light-emitting element 4 | 4.40 | 1.27 | (0.182, 0.413) | 790 | 62.4 | 44.5 | 26.8 |
| Light-emitting element 5 | 4.60 | 1.79 | (0.181, 0.414) | 1120 | 62.2 | 42.5 | 26.7 |
| Light-emitting element 6 | 4.60 | 1.79 | (0.181, 0.414) | 1120 | 62.2 | 42.5 | 26.7 |

Figure 32:
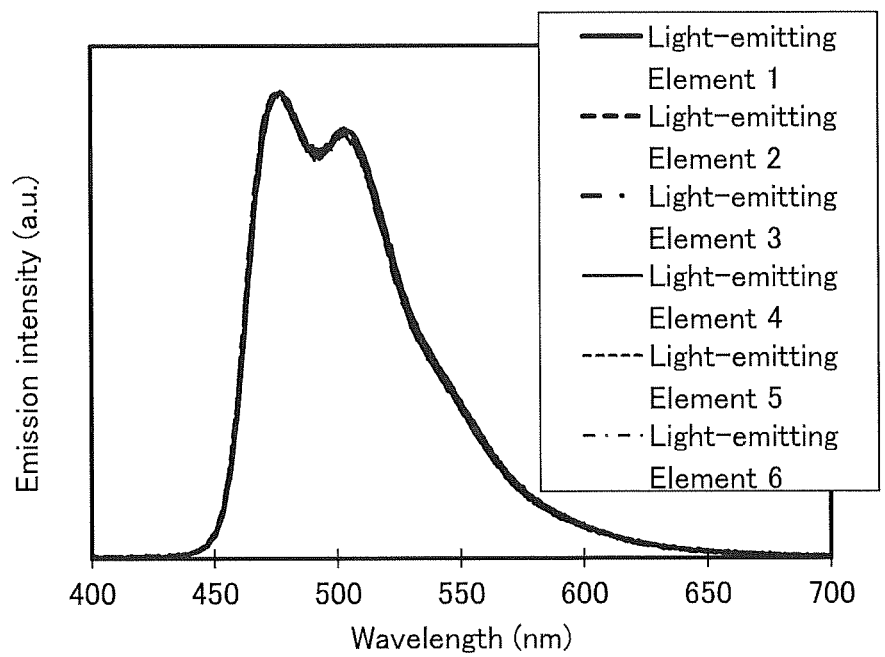
FIG. 32 shows electroluminescence spectra of light-emitting elements in Example.

FIG. 32 shows electroluminescence spectra when a current at a current density of 2.5 mA/cm$^2$ was supplied to Light-emitting elements 1 to 6.

As shown in FIG. 29, FIG. 30, FIG. 31, FIG. 32, and Table 3, the maximum external quantum efficiency of each of Light-emitting elements 1 to 6 is higher than or equal to 26%. Thus, Light-emitting elements 1 to 6 each have an extremely high external quantum efficiency. Among them, the external quantum efficiency of Light-emitting element 1 in which the content of Me-35DCzPPy is 0 is particularly high.

Table 5 shows that the drive voltage of each of Light-emitting elements 1 to 6 at around 1000 cd/m$^2$ is 4.6 V or lower, which is low for light-emitting elements that emit blue phosphorescence, and Light-emitting elements 1 to 6 each have favorable power efficiency. A big difference in the drive voltage was not generated by a difference in the mixture ratio of 35DCzPPy to Me-35DCzPPy.

As shown in FIG. 32, the electroluminescence spectrum of each of Light-emitting elements 1 to 6 has a peak at around 474 nm and 501 nm and a full width at half maximum of approximately 68 nm; thus, Light-emitting elements 1 to 6 emit pale blue light. A big difference in the electroluminescence spectrum was not generated by the difference in the mixture ratio of 35DCzPPy to Me-35DCzPPy.

<Reliability of Light-Emitting Elements>

Figure 33:
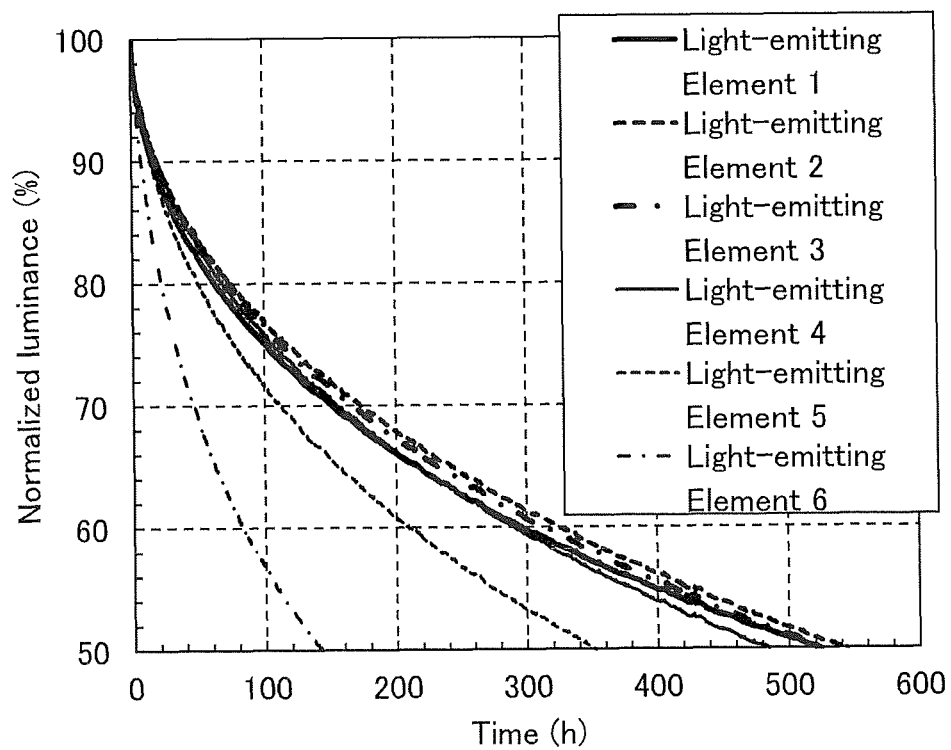
FIG. 33 shows reliability test results of light-emitting elements in Example.

Next, driving tests at a constant current of 2.5 mA/cm$^2$ were performed on Light-emitting elements 1 to 6. FIG. 33 shows the results. As shown in FIG. 33, degradation curves of Light-emitting element 1 to 4 are similar to each other, and the luminance half life of each of Light-emitting element 1 to 4 is approximately 500 hours, which means high reliability. In contrast, Light-emitting element 6 in which the ratio of Me-35DCzPPy to 35DCzPPy is higher than that in Light-emitting element 5 has a shorter luminance half life than Light-emitting element 5. Light-emitting elements 5 and 6 each have a shorter luminance half life than Light-emitting elements 1 to 4. That is, when the percentage of the content of Me-35DCzPPy to that of 35DCzPPy in a light-emitting element is less than or equal to 10%, there is no big difference in reliability; however, when the percentage of the content of Me-35DCzPPy to that of 35DCzPPy is greater than 10%, the reliability of the light-emitting element is adversely affected. This is probably because the influence of the above hydrogen atom transfer reaction is exerted at a concentration in which the percentage of the content of Me-35DCzPPy to that of 35DCzPPy is greater than 10%.

This indicates that it is preferable that the content of an organic compound in which a hydrogen atom in a carbazole skeleton is substituted by an alkyl group be less than 10% of a host material in order to obtain a light-emitting element having high reliability.

REFERENCE NUMERALS

50: adhesive layer, 51: adhesive layer, 52: adhesive layer, 100: EL layer, 101: electrode, 102: electrode, 106: light-emitting unit, 108: light-emitting unit, 110: light-emitting unit, 111: hole-injection layer, 112: hole-transport layer, 113: electron-transport layer, 114: electron-injection layer, 114-a: electron-injection layer, 114-b: electron-injection layer, 115: charge-generation layer, 116: hole-injection layer, 117: hole-transport layer, 118: electron-transport layer, 119: electron-injection layer, 130: light-emitting layer, 131: host material, 131_1: organic compound, 131_2: organic compound, 132: guest material, 140: light-emitting layer, 141: host material, 141_1: organic compound, 141_2: organic compound, 142: guest material, 150: light-emitting element, 160: light-emitting layer, 170: light-emitting layer, 200: substrate, 201: resin layer, 202: resin layer, 220: substrate, 252: light-emitting element, 300: display device, 311: electrode, 311b: electrode, 340: liquid crystal element, 351: substrate, 360: light-emitting element, 360b: light-emitting element, 360g: light-emitting element, 360r: light-emitting element, 360w: light-emitting element, 361: substrate, 362: display portion, 364: circuit portion, 365: wiring, 366: circuit portion, 367: wiring, 372: FPC, 373: IC, 374: FPC, 375: IC, 400: display device, 401: transistor, 402: transistor, 403: transistor, 404: light-emitting element, 405: capacitor, 406: connection portion, 410: pixel, 411: insulating layer, 412: insulating layer, 413: insulating layer, 414: insulating layer, 415: insulating layer, 416: spacer, 417: adhesive layer, 419: adhesive layer, 421: electrode, 422: EL layer, 423: electrode, 424: optical adjustment layer, 425: coloring layer, 426: light-blocking layer, 451: opening, 471: substrate, 472: substrate, 476: insulating layer, 478: insulating layer, 501: transistor, 503: transistor, 505: capacitor, 506: connection portion, 511: insulating layer, 512: insulating layer, 513: insulating layer, 514: insulating layer, 517: adhesive layer, 519: connection layer, 529: liquid crystal element, 543: connector, 545T: coumarin, 562: electrode, 563: liquid crystal, 564a: alignment film, 564b: alignment film, 572: substrate, 576: insulating layer, 578: insulating layer, 599: polarizing plate, 600A: ALS model, 601: source side driver circuit, 602: pixel portion, 603: gate side driver circuit, 604: sealing substrate, 605: sealant, 607: space, 608: wiring, 610: element substrate, 611: switching TFT, 613: electrode, 614: insulator, 616: EL layer, 617: electrode, 618: light-emitting element, 623: n-channel TFT, 624: p-channel TFT, 700: display panel, 701: resin layer, 702: resin layer, 800: display panel, 900: electronic device, 901: housing, 901a: housing, 901b: housing, 902: display portion, 903: hinge, 910: electronic device, 911a: housing, 911b: housing, 912: display portion, 913: hinge, 914a: operation button, 914b: operation button, 915: cartridge, 920: electronic device, 921a: housing, 921b: housing, 922: display portion, 923: hinge, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1025B: lower electrode, 1025G: lower electrode, 1025R: lower electrode, 1026: partition, 1028: EL layer, 1029: electrode, 1031: sealing substrate, 1032: sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 3000: light-emitting device, 3001: substrate, 3003: substrate, 3005: light-emitting element, 3007: sealing region, 3009: sealing region, 3011: region, 3013: region, 3014: region, 3015: substrate, 3016: substrate, 3018: desiccant, 3054: display portion, 3500: multifunction terminal, 3502: housing, 3504: display portion, 3506: camera, 3508: lighting, 3600: light, 3602: housing, 3608: lighting, 3610: speaker, 6000: display module, 6001: upper cover, 6002: lower cover, 6005: FPC, 6006: display panel, 6009: frame, 6010: printed circuit board, 6011: battery, 6015: light-emitting portion, 6016: light-emitting portion, 6017a: light guide portion, 6017b: light guide portion, 6018: light, 7121: housing, 7122: display portion, 7123: keyboard, 7124: pointing device, 7200: head-mounted display, 7201: mounting portion, 7202: lens, 7203: main body, 7204: display portion, 7205: cable, 7206: battery, 7300: camera, 7301: housing, 7302: display portion, 7303: operation button, 7304: shutter button, 7305: connection portion, 7306: lens, 7400: finder, 7401: housing, 7402: display portion, 7403: button, 7500: head-mounted display, 7502: display portion, 7503: operation button, 7504: fixing band, 7050: lens, 7510: head-mounted display, 7701: housing, 7702: housing, 7703: display portion, 7704: operation key, 7705: lens, 7706: joint, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9300: television set, 9301: stand, 9311: remote controller, 9500: display device, 9501: display panel, 9502: display region, 9503: region, 9511: hinge, 9512: bearing, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, and 9723: display portion.

This application is based on Japanese Patent Application Serial No. 2016-253548 filed with Japan Patent Office on Dec. 27, 2016, the entire contents of which are hereby incorporated by reference.

The invention claimed is:

1. A light-emitting element comprising:
an electroluminescence layer between a pair of electrodes,
wherein the electroluminescence layer comprises a light-emitting layer,
wherein the light-emitting layer comprises a first organic compound and a hydrocarbon group substitution product,
wherein the first organic compound has a substituted or unsubstituted carbazole skeleton,
wherein the hydrocarbon group substitution product is a compound in which one of hydrogen atoms in the carbazole skeleton in the first organic compound is substituted by a hydrocarbon group having 1 to 6 carbon atoms,
wherein a weight ratio of the hydrocarbon group substitution product to the first organic compound is greater than 0 and less than or equal to 0.1, and
wherein the first organic compound comprises a nitrogen-containing six-membered heteroaromatic skeleton.

2. The light-emitting element according to claim 1,
wherein the hydrocarbon group substitution product includes the hydrocarbon group having 1 to 6 carbon atoms at a 2-position of the carbazole skeleton.

3. The light-emitting element according to claim 1,
wherein the hydrocarbon group having 1 to 6 carbon atoms is a methyl group.

4. The light-emitting element according to claim 1,
wherein the weight ratio of the hydrocarbon group substitution product to the first organic compound is greater than 0 and less than or equal to 0.05.

5. The light-emitting element according to claim 1,
wherein the light-emitting layer further comprises a guest material, and
wherein the guest material converts triplet excitation energy into light emission.

6. The light-emitting element according to claim 5,
wherein the guest material shows an emission peak at 450 nm or more and 530 nm or less.

7. A light-emitting element comprising:
an electroluminescence layer between a pair of electrodes,
wherein:
the electroluminescence layer comprises a light-emitting layer,
the light-emitting layer comprises a first organic compound and a hydrocarbon group substitution product,
the first organic compound is represented by General Formula (G1) below,

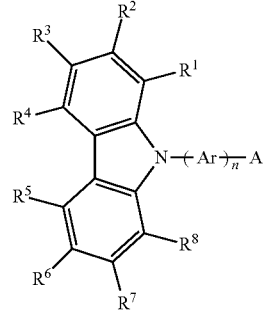

(G1)

A represents a substituted or unsubstituted nitrogen-containing heteroaromatic ring having 1 to 25 carbon atoms,
Ar represents an arylene group having 6 to 13 carbon atoms,
n represents 0 or 1,
$R^1$ to $R^8$ independently represents any one of hydrogen, a hydrocarbon group having 1 to 6 carbon atoms, a cyclic hydrocarbon group having 3 to 6 carbon atoms, and a substituted or unsubstituted aromatic hydrocarbon group having 6 to 25 carbon atoms,
the hydrocarbon group substitution product has a structure in which at least one of hydrogen atoms in the first organic compound is substituted by a hydrocarbon group having 1 to 6 carbon atoms,
a weight ratio of the hydrocarbon group substitution product to the first organic compound is greater than 0 and less than or equal to 0.1, and
the nitrogen-containing heteroaromatic ring is a nitrogen-containing six-membered heteroaromatic ring.

8. The light-emitting element according to claim 7,
wherein the weight ratio of the hydrocarbon group substitution product to the first organic compound is greater than 0 and less than or equal to 0.05.

9. The light-emitting element according to claim 7,
wherein the light-emitting layer further comprises a guest material, and
wherein the guest material converts triplet excitation energy into light emission.

10. The light-emitting element according to claim 9,
wherein the guest material shows an emission peak at 450 nm or more and 530 nm or less.

11. The light-emitting element according to claim 7,
wherein the nitrogen-containing heteroaromatic ring is a pyridine ring, a pyridazine ring, a pyrimidine ring, a pyrazine ring, or a triazine ring.

12. A light-emitting element comprising:
an electroluminescence layer between a pair of electrodes,
wherein:
the electroluminescence layer comprises a light-emitting layer, the light-emitting layer comprises a first organic compound and a hydrocarbon group substitution product, the first organic compound is represented by General Formula (G2) below,

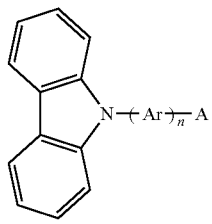

(G2)

A represents a substituted or unsubstituted nitrogen-containing heteroaromatic ring having 1 to 25 carbon atoms, Ar represents an arylene group having 6 to 13 carbon atoms, n represents 0 or 1, the hydrocarbon group substitution product has a structure in which at least one of hydrogen atoms in the first organic compound is substituted by a hydrocarbon group having 1 to 6 carbon atoms, a weight ratio of the hydrocarbon group substitution product to the first organic compound is greater than 0 and less than or equal to 0.1, and wherein the nitrogen-containing heteroaromatic ring is a nitrogen-containing six-membered heteroaromatic ring.

13. The light-emitting element according to claim 12, wherein the weight ratio of the hydrocarbon group substitution product to the first organic compound is greater than 0 and less than or equal to 0.05.

14. The light-emitting element according to claim 12, wherein the light-emitting layer further comprises a guest material, and wherein the guest material converts triplet excitation energy into light emission.

15. The light-emitting element according to claim 14, wherein the guest material shows an emission peak at 450 nm or more and 530 nm or less.

16. The light-emitting element according to claim 12, wherein the nitrogen-containing heteroaromatic ring is a pyridine ring, a pyridazine ring, a pyrimidine ring, a pyrazine ring, or a triazine ring.

* * * * *